United States Patent
Lehn et al.

(10) Patent No.: US 11,230,764 B2
(45) Date of Patent: Jan. 25, 2022

(54) METHODS OF ATOMIC LAYER DEPOSITION FOR SELECTIVE FILM GROWTH

(71) Applicant: MERCK PATENT GMBH, Darmstadt (DE)

(72) Inventors: Jean-Sébastien Lehn, Branchburg, NJ (US); Charles Dezelah, Branchburg, NJ (US); Jacob Woodruff, Branchburg, NJ (US)

(73) Assignee: MERCK PATENT GMBH, Darmstadt (DE)

( * ) Notice: Subject to any disclaimer, the term of this patent is extended or adjusted under 35 U.S.C. 154(b) by 194 days.

(21) Appl. No.: 16/625,488

(22) PCT Filed: Jun. 22, 2018

(86) PCT No.: PCT/EP2018/066820
§ 371 (c)(1),
(2) Date: Dec. 20, 2019

(87) PCT Pub. No.: WO2018/234567
PCT Pub. Date: Dec. 27, 2018

(65) Prior Publication Data
US 2020/0283894 A1 Sep. 10, 2020

Related U.S. Application Data

(60) Provisional application No. 62/523,920, filed on Jun. 23, 2017.

(51) Int. Cl.
*C23C 16/455* (2006.01)
*C23C 16/04* (2006.01)
*C23C 16/08* (2006.01)

(52) U.S. Cl.
CPC ...... *C23C 16/45534* (2013.01); *C23C 16/042* (2013.01); *C23C 16/045* (2013.01); *C23C 16/08* (2013.01); *C23C 16/45553* (2013.01)

(58) Field of Classification Search
CPC . C23C 16/45534; C23C 16/08; C23C 16/042; C23C 16/045; C23C 16/45553
See application file for complete search history.

(56) References Cited

U.S. PATENT DOCUMENTS

| 9,157,149 B2 | 10/2015 | Winter et al. |
| 9,466,494 B2 | 10/2016 | Wu et al. |

(Continued)

FOREIGN PATENT DOCUMENTS

| TW | 201610201 A | 3/2016 |
| TW | I550719 B | 9/2016 |
| WO | 2016153987 A1 | 9/2016 |

OTHER PUBLICATIONS

Kanarik, Keren J., el al., "Overview of atomic layer etching in the semiconductor industry". J. Vac. Sci. Technol. A 33(2), Mar./Apr. 2015, 020802, pp. 1-14.*

Kim, Kwanpyo, et al., "Selective metal deposition at graphene line defects by atomic layer deposition". Nature Communications, 5, 4781, 2014, pp. 1-9.*

(Continued)

*Primary Examiner* — Bret P Chen
(74) *Attorney, Agent, or Firm* — Harness Dickey & Pierce P.L.C.

(57) ABSTRACT

Methods of forming metal-containing films by atomic layer deposition are provided. The methods include delivering a metal-containing complex, a purge gas, and a co-reactant to a first substrate under sufficient conditions such that the metal-containing film selectively grows on at least a portion of the first substrate.

20 Claims, 75 Drawing Sheets

(56) References Cited

U.S. PATENT DOCUMENTS

| | | | |
|---|---|---|---|
| 9,587,312 B2* | 3/2017 | Silva | C23C 16/45572 |
| 9,595,466 B2 | 3/2017 | Fu et al. | |
| 2006/0093848 A1* | 5/2006 | Senkevich | B82Y 30/00 |
| | | | 428/585 |
| 2010/0123202 A1* | 5/2010 | Hofmann | H01L 27/11 |
| | | | 257/401 |
| 2011/0042752 A1* | 2/2011 | Mayuzumi | H01L 21/28518 |
| | | | 257/369 |
| 2013/0084700 A1* | 4/2013 | Swerts | C23C 16/18 |
| | | | 438/680 |
| 2013/0157453 A1* | 6/2013 | Ahn | H01L 29/792 |
| | | | 438/591 |
| 2013/0249002 A1* | 9/2013 | Cheng | H01L 29/0653 |
| | | | 257/347 |
| 2015/0004314 A1 | 1/2015 | Winter et al. | |
| 2015/0004315 A1 | 1/2015 | Winter et al. | |
| 2015/0050807 A1* | 2/2015 | Wu | C23C 16/045 |
| | | | 438/669 |
| 2015/0108577 A1* | 4/2015 | Cai | H01L 21/31144 |
| | | | 257/369 |
| 2015/0348840 A1* | 12/2015 | Bamnolker | C23C 16/14 |
| | | | 438/669 |
| 2016/0056074 A1 | 2/2016 | Na et al. | |
| 2016/0056077 A1 | 2/2016 | Lai et al. | |
| 2016/0141179 A1* | 5/2016 | Wu | H01L 21/76843 |
| | | | 257/288 |
| 2016/0148839 A1 | 5/2016 | Abelson et al. | |
| 2016/0276214 A1 | 9/2016 | Fu et al. | |
| 2019/0316258 A1* | 10/2019 | Mitrovic | C23C 16/45572 |

OTHER PUBLICATIONS

Mackus, A.J.M., et al., "The use of atomic layer deposition in advanced nanopatterning". Nanoscale, 2014, 6, 10941-10960.*

Chalker, P.R., et al., "Photochemical atomic layer deposition and etching". Surface and Coatings Technology 291 (2016) 258-263.*

Mackus, Adriaan J., et al., "From the Bottom-Up: Toward Area-Selective Atomic Layer Deposition with High Selectivity". Chemistry of Materials 2019, 31, 2-12.*

International Written Opinion for PCT Application No. PCT/EP2018/066820 dated Sep. 21, 2018.

International Search Report for PCT Application No. PCT/EP2018/066820 dated Sep. 21, 2018.

Klesko, J. P. et al., "Thermal Atomic Layer Deposition of Titanium Films Using Titanium Tetrachloride and 2-Methyl-1,4-bis(trimethylsilyl)-2,5-cyclohexadiene or 1,4-Bis(trimethylsilyl)-1,4-dihydropyrazine," Chem. Mater, 27: 4918-4921 (2015).

Wang, W. B. and Abelson, J. R., "Filling high aspect ratio trenches by superconformal chemical vapor deposition: Predictive modeling and experiment," J. Appl. Phys., 116(194508): 1-8 (2014).

Wang, W. B. et al., "Superconformal chemical vapor deposition of thin films in deep features," J. Vac. Sci. Technol. A, 32(5): 0515121.1-0515121.10 (2014).

Au, Y. et al., "Filling Narrow Trenches by Iodine-Catalyzed CVD of Copper and Manganese on Manganese Nitride Barrier/Adhesion Layers," Journal of The Electrochemical Society, 158(5): D248-D253 (2011).

Office Action from corresponding Korean Application No. 10-2020-7002338 dated Nov. 3, 2021.

* cited by examiner a.

b.

METHODS OF ATOMIC LAYER DEPOSITION FOR SELECTIVE FILM GROWTH

CROSS-REFERENCE TO RELATED APPLICATIONS

This patent application is a U.S. national stage application under 35 U.S.C. § 371 of International Patent Application No. PCT/EP2018/066820 filed on 22 Jun. 2018, which claims the benefit of U.S. Provisional Patent Application No. 62/523,920 filed on 23 Jun. 2017. The entire disclosures of each of the above recited applications are incorporated herein by reference.

FIELD OF THE INVENTION

The present technology relates generally to deposition methods, particularly atomic layer deposition (ALD), for selective metal-containing film growth on at least one substrate.

BACKGROUND

Thin films, and in particular thin metal-containing films, have a variety of important applications, such as in nanotechnology and the fabrication of semiconductor devices. Examples of such applications include high-refractive index optical coatings, corrosion-protection coatings, photocatalytic self-cleaning glass coatings, biocompatible coatings, dielectric capacitor layers and gate dielectric insulating films in field-effect transistors (FETs), capacitor electrodes, gate electrodes, adhesive diffusion barriers, and integrated circuits. Metallic thin films and dielectric thin films are also used in microelectronics applications, such as the high-κdielectric oxide for dynamic random access memory (DRAM) applications and the ferroelectric perovskites used in infrared detectors and non-volatile ferroelectric random access memories (NV-FeRAMs).

Various precursors may be used to form metal-containing thin films and a variety of deposition techniques can be employed. Such techniques include reactive sputtering, ion-assisted deposition, sol-gel deposition, chemical vapor deposition (CVD) (also known as metalorganic CVD or MOCVD), and atomic layer deposition (ALD) (also known as atomic layer epitaxy). CVD and ALD processes are increasingly used as they have the advantages of enhanced compositional control, high film uniformity, and effective control of doping.

CVD is a chemical process whereby precursors are used to form a thin film on a substrate surface. In a typical CVD process, the precursors are passed over the surface of a substrate (e.g., a wafer) in a low pressure or ambient pressure reaction chamber. The precursors react and/or decompose on the substrate surface creating a thin film of deposited material. Volatile by-products are removed by gas flow through the reaction chamber. The deposited film thickness can be difficult to control because it depends on coordination of many parameters such as temperature, pressure, gas flow volumes and uniformity, chemical depletion effects, and time.

ALD is also a method for the deposition of thin films. It is a self-limiting, sequential, unique film growth technique based on surface reactions that can provide precise thickness control and deposit conformal thin films of materials provided by precursors onto surfaces substrates of varying compositions. In ALD, the precursors are separated during the reaction. The first precursor is passed over the substrate surface producing a monolayer on the substrate surface. Any excess unreacted precursor is pumped out of the reaction chamber. A second precursor is then passed over the substrate surface and reacts with the first precursor, forming a second monolayer of film over the first-formed monolayer of film on the substrate surface. This cycle is repeated to create a film of desired thickness.

However, the continual decrease in the size of microelectronic components, such as semi-conductor devices, presents several technical challenges and has increased the need for improved thin film technologies. In particular, microelectronic components may include features on or in a substrate, which require filling, e.g., to form a conductive pathway or to form interconnections. Filling such features, especially in smaller and smaller microelectronic components, can be challenging because the features can be become increasingly thin or narrow. Consequently, a complete filling of the feature, e.g., via ALD, would require infinitely-long cycle times as the thickness of the feature approaches zero. Moreover, once the thickness of the feature becomes narrower than the size of a molecule of a precursor, the feature cannot be completely filled. As a result, a hollow seam can remain in a middle portion of the feature when ALD is performed. The presence of such hollow seams within a feature is undesirable because they can lead to failure of the device. Accordingly, there exists significant interest in the development of thin film deposition methods, particularly ALD methods that can selectively grow a film on one or more substrates and achieve improved filling of a feature on or in a substrate, including depositing a metal-containing film in a manner which substantially fills a feature without any voids.

SUMMARY

According to one aspect, a method of forming a metal-containing film by atomic layer deposition is provided. The method comprises delivering a metal-containing complex, a purge gas, and a co-reactant to a first substrate under conditions sufficient for the metal-containing complex to: (i) deposit metal and etch the metal-containing film; (ii) deposit metal, etch the metal-containing film and allow for desorption from the metal-containing film; or (iii) deposit metal and allow for desorption from the metal-containing film; such that the metal-containing film selectively grows on at least a portion of the first substrate.

Other embodiments, including particular aspects of the embodiments summarized above, will be evident from the detailed description that follows.

BRIEF DESCRIPTION OF THE DRAWINGS

FIG. 9a (left side) shows the palette of colors used to illustrate the height of each pixel of the AFM map.

In FIG. 33b, the right side of the EDS intensity count corresponds to the feature bottom and the left side of the EDS intensity count corresponds to the feature top. In FIG. 33c, the right side of the EDS intensity count corresponds to the feature bottom and the left side of the EDS intensity count corresponds to the feature top. In FIG. 33d, the right side of the EDS intensity count corresponds to the feature top and the left side of the EDS intensity count corresponds to the feature bottom.

FIG. 34 illustrates the quantification of molybdenum (measured by EDS, data collected at 15 keV) as a function of the position over a map covering the same ten features as shown in FIG. 33a.

FIG. 42a (left side) shows the palette of colors used to illustrate the height of each pixel of the AFM map.

FIG. 50a (left side) shows the palette of colors used to illustrate the height of each pixel of the AFM map.

FIG. 58a (left side) shows the palette of colors used to illustrate the height of each pixel of the AFM map.

FIG. 66a (left side) shows the palette of colors used to illustrate the height of each pixel of the AFM map.

DETAILED DESCRIPTION

Figure 1A:
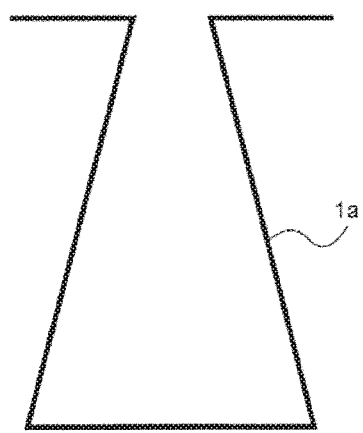
FIG. 1a illustrates a feature having a non-uniform width (also known as a "re-entrant feature").

Before describing several exemplary embodiments of the present technology, it is to be understood that the technology is not limited to the details of construction or process steps set forth in the following description. The present technology is capable of other embodiments and of being practiced or being carried out in various ways. It is also to be understood that the metal complexes and other chemical compounds may be illustrated herein using structural formulas which have a particular stereochemistry. These illustrations are intended as examples only and are not to be construed as limiting the disclosed structure to any particular stereochemistry. Rather, the illustrated structures are intended to encompass all such metal complexes and chemical compounds having the indicated chemical formula.

Applicants have discovered methods of performing deposition, particularly performing ALD, which can selectively grow a metal-containing film on one or more substrates. In particular, it was discovered that during a deposition method for growing a metal-containing film on a substrate, a metal-containing complex may deposit a species (e.g., metal) on a substrate to form a film, and the metal-containing complex may also etch away the film already formed on the substrate, i.e., remove portions of previously deposited film. Additionally, a species deposited may also desorb from the film during the process. Thus, it was unexpectedly found that by controlling or adjusting one or more of the following: the rate at which the metal-containing complex deposits a species (e.g., metal), rate at which the metal-containing complex etches the film, and the rate at which a species desorbs from the film, for example, by adjusting the conditions of the process and/or the metal-containing complex used, selective film growth may be achieved on one or more substrates. For example, the methods described herein can result in selective film growth on at least a portion of one substrate and/or in selective film growth on a first substrate compared to a second substrate. Furthermore, the methods described herein can achieve improved filling of a feature on or in a substrate including depositing a metal-containing film in a manner which substantially fills a feature without any voids or hollow seams.

I. Definitions

For purposes of this invention and the claims hereto, the numbering scheme for the Periodic Table Groups is according to the IUPAC Periodic Table of Elements.

The term "and/or" as used in a phrase such as "A and/or B" herein is intended to include "A and B", "A or B", "A", and "B".

The terms "substituent", "radical", "group", and "moiety" may be used interchangeably.

As used herein, the terms "metal-containing complex" (or more simply, "complex") and "precursor" are used interchangeably and refer to metal-containing molecule or compound which can be used to prepare a metal-containing film by a vapor deposition process such as, for example, ALD or CVD. The metal-containing complex may be deposited on, adsorbed to, decomposed on, delivered to, and/or passed over a substrate or surface thereof, as to form a metal-containing film. In one or more embodiments, the metal-containing complexes disclosed herein are metal halide complexes, particularly molybdenum chloride complexes.

As used herein, the term "metal-containing film" includes not only an elemental metal film as more fully defined below, but also a film which includes a metal along with one or more elements, for example a metal oxide film, metal nitride film, metal silicide film, a metal carbide film and the like. As used herein, the terms "elemental metal film" and "pure metal film" are used interchangeably and refer to a film which consists of, or consists essentially of, pure metal. For example, the elemental metal film may include 100% pure metal or the elemental metal film may include at least about 70%, at least about 80%, at least about 90%, at least about 95%, at least about 96%, at least about 97%, at least about 98%, at least about 99%, at least about 99.9%, or at least about 99.99% pure metal along with one or more impurities. Unless context dictates otherwise, the term "metal film" shall be interpreted to mean an elemental metal film.

As used herein, the term "vapor deposition process" is used to refer to any type of vapor deposition technique, including but not limited to, CVD and ALD. In various embodiments, CVD may take the form of conventional (i.e., continuous flow) CVD, liquid injection CVD, or photo-assisted CVD. CVD may also take the form of a pulsed technique, i.e., pulsed CVD. ALD is used to form a metal-containing film by vaporizing and/or passing at least one metal complex disclosed herein over a substrate surface. For conventional ALD processes see, for example, George S. M., et al. *J. Phys. Chem.*, 1996, 100, 13121-13131. In other embodiments, ALD may take the form of conventional (i.e., pulsed injection) ALD, liquid injection ALD, photo-assisted ALD, plasma-assisted ALD, or plasma-enhanced ALD. The term "vapor deposition process" further includes various vapor deposition techniques described in *Chemical Vapour Deposition: Precursors, Processes, and Applications*; Jones, A. C.; Hitchman, M. L., Eds. The Royal Society of Chemistry: Cambridge, 2009; Chapter 1, pp 1-36.

Figure 1B:
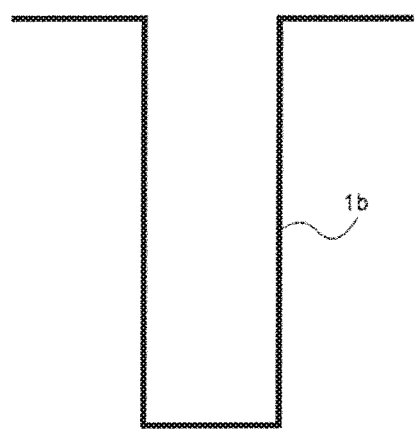
FIG. 1b illustrates a feature having substantially uniform width.

As used herein, the term "feature" refers to an opening in a substrate which may be defined by one or more sidewalls, a bottom surface, and upper corners. In various aspects, the feature may be a via, a trench, contact, dual damascene, etc. A feature 1a may have a non-uniform width as illustrated in FIG. 1a, also known as a "re-entrant feature," or a feature 1b may have substantially uniform width as illustrated in FIG. 1b.

As used herein, the terms "selective growth," "selectively grown" and "selectively grows" may be used synonymously and refer to film growth on at least a portion of a first substrate and substantially no film growth on a remaining portion of the first substrate as well as more film growth on at least a portion of the first substrate compared to film growth on a remaining portion of the first substrate. For example, selective growth may include growth of a film on a lower portion of a feature while less film growth or no film growth may occur in an upper portion of that feature or outside that feature. With respect to more than one substrate, the terms "selective growth" "selectively grown" and "selectively grows" also encompass film growth on a first substrate and substantially no film growth on a second substrate (or a third substrate, or fourth substrate or a fifth substrate, etc.) as well as more film growth on the first substrate than on the second substrate (or a third substrate, or fourth substrate or a fifth substrate, etc.).

Figure 2A:
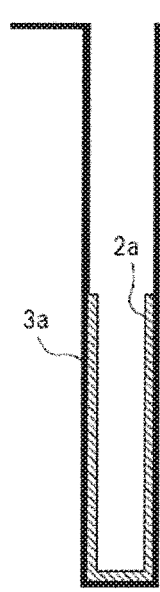
FIGS. 2a and 2b illustrate an example of super-conformal growth.
Figure 2B:
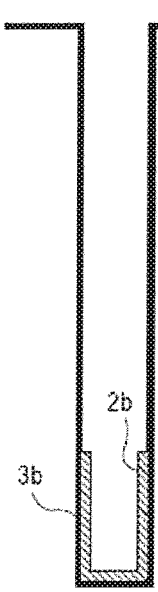

As used herein, the term "super-conformal growth" refers to a deposition process wherein substantially more material (e.g., metal-containing film) may be deposited (and/or re-deposited) at a bottom or a lower portion of a feature, including bottom surface, sidewalls and/or interior of the feature, than compared to outside the feature and/or at a top or upper portion of the feature. "Substantially more" material is intended to encompass a thickness of the material deposited at a bottom or a lower portion of a feature that is at least about 20% greater than a thickness of the material deposited within the top or upper portion of the feature and/or outside the feature, e.g., at least about 30% greater, at least about 40% greater, at least about 50% greater, at least about 75% greater, at least about 100% greater, at least about 250% greater, at least about 500% greater, at least about 750% greater, at least about 1000% greater, etc., than a thickness of the material deposited within the top or upper portion of the feature and/or outside the feature. A non-limiting example of super-conformal growth includes substantially no material deposited outside the feature and/or at the top or upper portion of the feature. Another non-limiting example of super-conformal growth includes where about 100% of the feature may be filled with material and substantially no material may be deposited outside the feature. Additional non-limiting examples of super-conformal growth include, as measured from the bottom of a feature, at least about 1.0%, at least about 5.0%, at least about 10%, at least about 15%, at least about 20%, at least about 25%, at least about 30%, at least about 35%, at least about 40%, at least about 45%, at least about 50%, at least about 55%, at least about 60%, at least about 65%, at least about 70%, at least about 75%, at least about 80%, at least about 85%, at least about 90%, at least about 95%, or about 100% of the feature may be filled. The "bottom" or "lower portion" of a feature is intended to encompass about 75% of the depth of the feature starting from the bottom of the feature, e.g., about 70% of the depth of the feature, about 60% of the depth of the feature, about 50% of the depth of the feature, about 40% of the depth of the feature, about 30% of the depth of the feature, about 20% of the depth of the feature, etc. The "top" or "upper portion" of a feature is intended to encompass the upper about 25% of the depth of the feature starting from the top of the feature, e.g., about 20% of the depth of the feature, about 10% of the depth of the feature, about 5.0% of the depth of the feature, etc. The "outside" of the feature is intended to encompass an area about 0.10 nm to about 10 mm in any direction from the opening of the feature. An example of super-conformal growth of films 2a and 2b on features 3a and 3b, respectively is illustrated in FIGS. 2a and 2b.

Figure 2C:
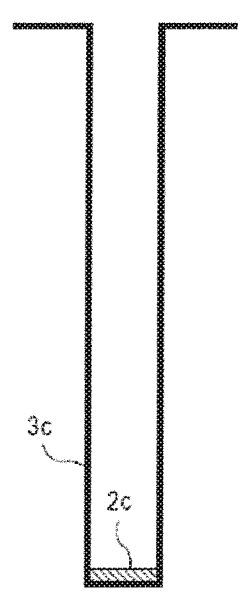
FIG. 2c illustrates an example of bottom-up-fill.

Exemplary super-conformal growth includes, but is not limited to, "bottom-up-fill," which means that material is deposited in the bottom or lower portion of a feature (about 1.0% of the feature starting from the bottom of the feature, or about 20% of the feature starting from the bottom of the feature, or about 50% of the feature starting from the bottom of the feature) and substantially no material may be deposited outside the feature or at the top or upper portion of the feature. An example of bottom-up-fill of film 2c on feature 3c is illustrated in FIG. 2c.

Figure 2D:
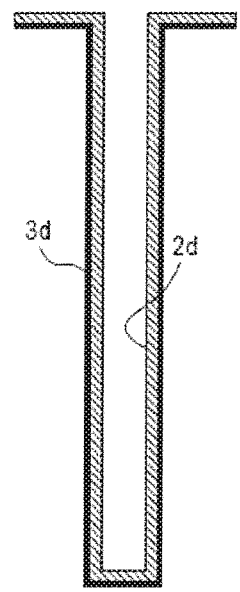
FIG. 2d illustrates an example of conformal growth.

As used herein, the term "conformal growth" refers to a deposition process wherein a film is deposited with substantially the same thickness along one or more of a bottom surface, a sidewall, an upper corner, and outside a feature. In various aspects, conformal growth may be achieved under conformal growth conditions. "Conformal growth" is also intended to encompass some variations in film thickness, e.g., the film may be thicker outside a feature and/or near a top or upper portion of the feature compared to the bottom or lower portion of the feature. An example of conformal growth of film 2d on feature 3d is illustrated in FIG. 2d.

As used herein, the term "sub-conformal growth" refers to a deposition process wherein substantially more material (e.g., metal-containing film) may be deposited (and/or re-deposited) at a top or an upper portion of a feature, including top surface, sidewalls and/or interior of the feature, than compared at a bottom or lower portion of the feature. "Substantially more" material is intended to encompass a thickness of the material deposited at a top or an upper portion of a feature that is at least about 20% greater than a thickness of the material deposited within the bottom or lower portion of the feature and/or outside the feature, e.g., at least about 30% greater, at least about 40% greater, at least about 50% greater, at least about 75% greater, at least about 100% greater, at least about 250% greater, at least about 500% greater, at least about 750% greater, at least about 1000% greater, etc., than a thickness of the material deposited within the bottom or lower portion of the feature and/or outside the feature. A non-limiting example of sub-conformal growth includes substantially no material deposited outside the feature and/or at the bottom or lower portion of the feature. Additional non-limiting examples of sub-conformal growth include, as measured from the top of a feature, at least about 1.0%, at least about 5.0%, at least about 10%, at least about 15%, at least about 20%, at least about 25%, at least about 30%, at least about 35%, at least about 40%, at least about 45%, at least about 50%, at least about 55%, at least about 60%, at least about 65%, at least about 70%, at least about 75%, at least about 80%, at least about 85%, at least about 90%, at least about 95%, or about 100% of the feature may be filled. The "bottom" or "lower portion" of a feature is intended to encompass about 75% of the depth of the feature starting from the bottom of the feature, e.g., about 70% of the depth of the feature, about 60% of the depth of the feature, about 50% of the depth of the feature, about 40% of the depth of the feature, about 30% of the depth of the feature, about 20% of the depth of the feature, etc. The "top" or "upper portion" of a feature is intended to encompass the upper about 25% of the depth of the feature starting from the top of the feature, e.g., about 20% of the depth of the feature, about 10% of the depth of the feature, about 5.0% of the depth of the feature, etc. The "outside" of the feature is intended to encompass an area about 0.10 nm to about 10 mm in any direction from the opening of the feature.

As used herein, the terms "etch" or "etching" refer to a process by which a deposited species, after deposition or interaction with a surface of a film or surface of a substrate, leaves the surface of the film or the surface of the substrate and removes additional portions or species from the film or substrate. In other words, the surface of a film or the surface of a substrate has been etched away. The "species" may include a metal-containing complex, dissociated moieties of the metal-containing complex (e.g., metal, ligands), a co-reactant, dissociated moieties of the co-reactant and/or combinations or reaction products thereof. For example, if the metal-containing complex is $MoCl_5$, etching can occur when one or more $MoCl_5$ molecules are delivered to a Mo-containing surface and Mo already contained in the surface may be removed (along with those $MoCl_5$ molecules delivered) thereby allowing for substantially complete removal of Mo.

As used herein, the terms "desorb," "desorbing" and "desorption" refer to a process by which following depositing of a species, that species leaves the surface of the film or the surface of the substrate. In other words, the surface of the film or the surface of the substrate, after that species has left, is the same as before that species' deposition. The "species" may include a metal-containing complex, dissociated moieties of the metal-containing complex (e.g., metal, ligands), a co-reactant, dissociated moieties of the co-reactant and/or combinations or reaction products thereof. For example, if the metal-containing complex is $MoCl_5$, a molecule of $MoCl_5$ may be delivered to a film surface or substrate surface and attach or deposit, and that same molecule of $MoCl_5$ may then leave or desorb from the film surface or substrate surface, wherein the film surface or substrate surface is the same as before that $MoCl_5$ molecule attached or deposited.

The term "alkyl" (alone or in combination with another term(s)) refers to a saturated hydrocarbon chain of 1 to about 12 carbon atoms in length, such as, but not limited to, methyl, ethyl, propyl, butyl, pentyl, hexyl, heptyl, octyl, decyl, and so forth. The alkyl group may be straight-chain or branched-chain. "Alkyl" is intended to embrace all structural isomeric forms of an alkyl group. For example, as used herein, propyl encompasses both n-propyl and isopropyl; butyl encompasses n-butyl, sec-butyl, isobutyl and tert-butyl; pentyl encompasses n-pentyl, tert-pentyl, neopentyl, isopentyl, sec-pentyl and 3-pentyl. Further, as used herein, "Me" refers to methyl, "Et" refers to ethyl, "Pr" refers to propyl, "i-Pr" refers to isopropyl, "Bu" refers to butyl, "t-Bu" refers to tert-butyl, and "Np" refers to neopentyl. In some embodiments, alkyl groups are $C_1$-$C_5$- or $C_1$-$C_4$-alkyl groups.

The term "alkoxy" refers to —O-alkyl containing from 1 to about 8 carbon atoms. The alkoxy may be straight-chain or branched-chain. Non-limiting examples include methoxy, ethoxy, propoxy, butoxy, isobutoxy, tert-butoxy, pentoxy and hexoxy.

As used herein, and unless otherwise specified, the term "aromatic" refers to unsaturated cyclic hydrocarbons having a delocalized conjugated n system and having from 4 to 20 carbon atoms (aromatic $C_4$-$C_{20}$ hydrocarbon). Exemplary aromatics include, but are not limited to benzene, toluene, xylenes, mesitylene, ethylbenzenes, cumene, naphthalene, methylnaphthalene, dimethylnaphthalenes, ethylnaphthalenes, acenaphthalene, anthracene, phenanthrene, tetraphene, naphthacene, benzanthracenes, fluoranthrene, pyrene, chrysene, triphenylene, and the like, and combinations thereof. The aromatic may optionally be substituted, e.g., with one or more alkyl group, alkoxy group, halogen, etc. For example, the aromatic may include anisole. Additionally, the aromatic may comprise one or more heteroatoms. Examples of heteroatoms include, but are not limited to, nitrogen, oxygen, phosphorus, boron, and/or sulfur. Aromatics with one or more heteroatom include, but are not limited to furan, benzofuran, thiophene, benzothiophene, oxazole, thiazole and the like, and combinations thereof. The aromatic may comprise monocyclic, bicyclic, tricyclic, and/or polycyclic rings (in some embodiments, at least monocyclic rings, only monocyclic and bicyclic rings, or only monocyclic rings) and may be fused rings.

The term "non-aromatic" means four or more carbon atoms joined in at least one ring structure wherein at least one of the four or more carbon atoms in the ring structure is not an aromatic carbon atom.

The term "silyl" refers to a —SiZ$^1$Z$^2$Z$^3$ radical, where each of Z$^1$, Z$^2$, and Z$^3$ is independently selected from the group consisting of hydrogen and optionally substituted alkyl, alkenyl, alkynyl, aryl, alkoxy, aryloxy, amino, halogen, dialkylamide and combinations thereof.

The term "dialkylsilyl" refers to a —SiZ$^4$Z$^5$Z$^6$ radical, wherein two of Z$^4$, Z$^5$, and Z$^6$ are the same or different alkyl, and wherein one of Z$^4$, Z$^5$, and Z$^6$ can be hydrogen. Non-limiting examples of a dialkylsilyl include dimethylsilyl, diethylsilyl diisopropylsilyl and methylethylsilyl.

The term "trialkylsilyl" refers to a —SiZ$^7$Z$^8$Z$^9$ radical, wherein Z$^7$, Z$^8$, and Z$^9$ are alkyl, and wherein Z$^7$, Z$^8$, and Z$^9$ can be the same or different alkyls. Non-limiting examples of a trialkylsilyl include trimethylsilyl (TMS), triethylsilyl (TES), triisopropylsilyl (TIPS) and tert-butyldimethylsilyl (TBDMS).

II. Methods of Selectively Growing Metal Containing Films Via ALD

Methods of forming metal-containing films by ALD, particularly where the metal-containing film is selectively grown are provided herein. In various aspects, the method may comprise delivering one or more of: at least one metal-containing complex, a purge gas, and at least one co-reactant, to at least one substrate (e.g., a first substrate, a second substrate, a third substrate, a fourth substrate, etc.) under sufficient conditions for the metal-containing complex to undergo one or more of the following: deposit a species, such as the metal-containing complex, dissociated moieties of the metal-containing complex (e.g., metal, ligands), metal nitrides, and/or metal oxides; etch the metal-containing film; and allow for desorption from the metal-containing film, such as desorption of an already deposited species (e.g., metal-containing complex and/or dissociated moieties of the metal-containing complex). The method may include vaporizing the at least one metal-containing complex and/or the at least one co-reactant and (2) delivering the at least one metal-containing complex and/or the at least one co-reactant to a substrate surface or passing the at least one metal-containing complex and/or the at least one co-reactant over a substrate (and/or decomposing the at least one metal-containing complex on the substrate surface). A layer may be formed on the surface of the substrate comprising the metal complex bound to the surface by the metal center. Upon delivery of a co-reactant, an exchange reaction can occur between the bound metal complex and co-reactant, thereby dissociating the bound metal complex and producing a first layer of elemental metal on the surface of the substrate.

In particular, a metal-containing complex, a purge gas and a co-reactant may be delivered to a substrate under sufficient conditions so that the metal-containing complex may: (i) deposit metal and etch the metal-containing film, (ii) deposit metal, etch the metal-containing film and allow for desorption from the metal-containing film, or (iii) deposit metal and allow for desorption from the metal-containing film, such that the metal-containing film selectively grows on at least a portion of the first substrate.

In various aspects, a metal-containing complex, a purge gas and a co-reactant may be delivered to at least one substrate in alternating pulses under suitable conditions to achieve desired selective film growth. A metal-containing complex, a purge gas and a co-reactant may be delivered under a desired set of conditions as a cycle. For example, a cycle may comprise delivery of a metal-containing complex, followed by delivery of a purge gas, followed by delivery of a co-reactant, and followed by delivery of a purge gas. It is contemplated herein that the methods described herein can comprise one or more cycles (e.g., 5 cycles, 10 cycles, 50 cycles, 100 cycles, 300 cycles, 600 cycles, 1000 cycles, etc.), which may be adjusted as needed for film growth, particularly selective film growth. Additionally, it is contemplated herein that the purge gas may be co-delivered with the metal-containing complex, the purge gas may be co-delivered with the co-reactant, the purge gas may be co-delivered with the metal-containing complex and the co-reactant, or the purge gas may be delivered separately from the metal-containing complex and the co-reactant. The purge gas may be any suitable gas, in particular, any suitable inert gas. Examples of suitable purge gases include, but are not limited to, nitrogen, hydrogen and noble gas, e.g., helium, neon, argon, krypton, xenon, etc.

Without being bound by theory, it is believed that a rate at which the metal-containing complex deposits a species (e.g., metal-containing complex, dissociated moieties of the metal-containing complex) (referred to as a "deposition rate"), a rate at which the metal-containing complex etches the film (referred to as an "etching rate"), and a rate at which a species desorbs from the film (referred to as a "desorption rate") can be controlled according to conditions used during the process and/or by selection of the metal-containing complex, so that a metal-containing film may be selectively grown on at least a portion of a first substrate. Thus, if a deposition rate is higher or faster than an etching rate and/or desorption rate, more film growth may occur on a substrate. Such instances can also be understood as a ratio of deposition rate to etching rate and/or desorption rate, which favors deposition. Conversely, if an etching rate and/or desorption rate is higher or faster than a deposition rate, less or no film growth may occur on a substrate. Such instances can also be understood as a ratio of deposition rate to etching rate and/or desorption rate, which favors etching and/or desorption. Therefore, by adjusting or tuning deposition rate, etching rate and/or adsorbtion rate, selective film growth may be achieved. For example, conditions may be adjusted or tuned to favor a higher or faster deposition rate compared to an etching rate and/or desorption rate at a first portion of a first substrate, while further adjustments or tuning of the conditions may occur to favor a higher or faster etching rate and/or desorption rate compared to a deposition rate at a second portion of the first substrate, so that selective film growth may occur, particularly more film growth in the first portion than in the second portion of the first substrate.

In another embodiment, conditions may be adjusted or tuned to favor a higher or faster deposition rate compared to an etching rate and/or desorption rate at a lower portion or bottom of a feature, while further adjustments or tuning of the conditions may occur to favor a higher or faster etching rate and/or desorption rate compared to a deposition rate at an upper portion or top of the feature, so that selective film growth may occur, particularly more film growth in the lower portion than in the upper portion of the feature.

In another embodiment, conditions may be adjusted or tuned to allow for selective film growth in a desired geometry for an interface between a zone where deposition occurs ("deposition zone") and a zone where no deposition occurs ("no-deposition zone") on a substrate. For example, conditions may be adjusted or tuned to create a step, where the transition between a deposition zone and no-deposition zone may be abrupt, e.g., a metal-containing film thickness gradient is steep. Additionally or alternatively, conditions may be adjusted or tuned to create a slope, where the transition between a deposition zone and no-deposition zone may be gradual, e.g., a metal-containing film thickness gradient is gradual.

In various aspects, conditions which may affect selective film growth include, but are not limited to temperature (e.g., of substrate, metal-containing complex, purge gas, co-reactant, etc.), pressure (e.g., during delivery of metal-containing complex, purge gas, co-reactant, etc.), amount of metal-containing complex delivered, and/or amount of purge gas delivered. The amount of metal-containing complex can be controlled by adjusting the concentration of the metal-containing complex and/or adjusting the duration of metal-containing complex delivery. The amount of purge gas can be controlled by adjusting the flux rate of the purge gas and/or adjusting the duration of purge gas delivery. In various aspects, these conditions may be adjusted or tuned to provide "a deposition cycle" which favors deposition over etching and/or desorption, and/or to provide "an etching/desorbing cycle" which favors etching and/or desorption over deposition.

The deposition can be carried out at atmospheric pressure but is more commonly carried out at a reduced pressure. The vapor pressure of the metal complex should be in a suitable range to be practical in such applications. The substrate temperature should be high enough to keep the bonds between the metal atoms at the surface intact and to prevent thermal decomposition of gaseous reactants. However, the substrate temperature should also be high enough to keep the source materials (i.e., the reactants) in the gaseous phase and to provide sufficient activation energy for the surface reaction. The appropriate temperature depends on various parameters, including the particular metal complex used and the pressure. The properties of a specific metal complex for use in the ALD deposition methods disclosed herein can be evaluated using methods known in the art, allowing selection of appropriate temperature and pressure for the reaction.

A deposition cycle and an etching/desorbing cycle may be performed and/or alternated as needed to provide selective film growth on one or more substrates. In a particular embodiment, the concentration of the metal-containing complex, the flux rate of the purge gas and/or the duration of purge gas delivery may be adjusted to provide for selective film growth, e.g., favoring deposition over etching and/or desorption, or favoring etching and/or desorption over deposition. Additionally or alternatively, a metal-containing complex and/or a purge gas may be delivered to a substrate in an amount suitable to vary a deposition rate of the species (e.g., metal-containing complex and/or dissociated moieties of the metal-containing complex), an etching rate of the metal-containing film, and/or a desorption rate from the metal-containing film of deposited species (e.g., metal-containing complex and/or dissociated moieties of the metal-containing complex).

In another embodiment, liquid injection ALD is used to form a metal-containing film by vaporizing and/or passing at least one metal complex disclosed herein over a substrate surface, wherein at least one metal complex is delivered to the reaction chamber by direct liquid injection as opposed to vapor draw by a bubbler. For liquid injection ALD processes see, for example, Potter R. J., et al., *Chem. Vap. Deposition,* 2005, 11(3), 159-169.

In another embodiment, photo-assisted ALD is used to form a metal-containing film by vaporizing and/or passing at least one metal complex disclosed herein over a substrate surface. For photo-assisted ALD processes see, for example, U.S. Pat. No. 4,581,249.

In another embodiment, plasma-assisted or plasma-enhanced ALD is used to form a metal-containing film by vaporizing and/or passing at least one metal complex disclosed herein over a substrate surface.

A. Super-Conformal Growth Cycle

In some embodiments, the methods described herein may be performed under conditions comprising a super-conformal growth cycle sufficient for the metal-containing film to selectively grow on a lower portion of at least one feature in a first substrate, i.e., for super-conformal growth to occur. During a super-conformal growth cycle (i) a deposition rate of the metal-containing complex may be higher in a lower portion of the feature than in an upper portion of the feature and/or (ii) an etching rate and/or a desorption rate of the metal-containing complex may be higher in an upper portion of the feature than in a lower portion of the feature.

The features described herein each independently may have a depth ≥about 1.0 nm, ≥about 5.0 nm, ≥about 50 nm, ≥about 100 nm, ≥about 250 nm, ≥about 500 nm, ≥about 750 nm, ≥about 1000 nm, ≥about 1250 nm, ≥about 1500 nm, ≥about 1750 nm, ≥about 2000 nm, ≥about 2250 nm, ≥about 2500 nm, ≥about 2750 nm, ≥about 3000 nm, ≥about 3250 nm, ≥about 3500 nm, ≥about 3750 nm, ≥about 4000 nm, ≥about 4250 nm, ≥about 4500 nm, ≥about 4750 nm, or ≥about 5000 nm. In particular, a feature may have a depth ≥about 5.0 nm, Further, each feature independently may have a depth of about 1.0 nm to about 5000 nm, about 1.0 nm to about 4000 nm, about 1.0 nm to about 3000 nm, about 1.0 nm to about 2000 nm, about 1.0 nm to about 1000 nm, about 1.0 nm to about 500 nm, about 1.0 nm to about 100 nm, about 5.0 nm to about 5000 nm, about 5.0 nm to about 4000 nm, about 5.0 nm to about 3000 nm, about 5.0 nm to about 2000 nm, about 5.0 nm to about 1000 nm, about 5.0 nm to about 500 nm, about 5.0 nm to about 100 nm, about 100 nm to about 5000 nm, about 100 nm to about 4000 nm, about 100 nm to about 3000 nm, about 100 nm to about 2000 nm, about 100 nm to about 1000 nm, about 100 nm to about 500 nm, about 500 nm to about 5000 nm, about 500 nm to about 4000 nm, about 500 nm to about 3000 nm, about 100 nm to about 2000 nm, about 500 nm to about 1000 nm, about 1000 nm to about 5000 nm, about 1000 nm to about 4000 nm, about 1000 nm to about 3000 nm, about 1000 nm to about 2000 nm, about 2000 nm to about 5000 nm, about 2000 nm to about 4000 nm, about 2000 nm to about 3000 nm, about 3000 nm to about 5000 nm, about 3000 nm to about 4000 nm, or about 4000 nm to about 5000 nm. Particularly, each feature independently may have a depth of about 5.0 nm to about 3000 nm or about 100 nm to about 2500 nm.

Additionally or alternatively, in combination with the above-described depths, each feature independently may have a uniform width or a non-uniform width, for example, a feature may have a wider width at a lower portion of a feature compared to an upper portion of the feature or vice versa. In various aspects, in combination with the above-described depths, each feature independently may have a width ≤about 3000 nm, ≤about 2500 nm, ≤about 2000 nm, ≤about 1500 nm, ≤about 1000 nm, ≤about 750 nm, ≤about 500 nm, ≤about 250 nm, ≤about 100 nm, ≤about 75 nm, ≤about 50 nm, ≤about 25 nm, ≤about 10 nm or ≤about 1.0 nm. In particular, a feature may have a width ≤about 1000 nm. Additionally, each feature independently may have a width of about 1.0 nm to about 3000 nm, about 1.0 nm to about 2000 nm, about 1.0 nm to about 1000 nm, about 1.0 nm to about 500 nm, about 1.0 nm to about 100 nm, about 1.0 nm to about 50 nm, about 1.0 nm to about 10 nm, about 10 nm to about 3000 nm, about 10 nm to about 2000 nm, about 10 nm to about 1000 nm, about 10 nm to about 500 nm, about 10 nm to about 100 nm, about 10 nm to about 50 nm, about 25 nm to about 3000 nm, about 25 nm to about 2000 nm, about 25 nm to about 1000 nm, about 25 nm to about 500 nm, about 25 nm to about 100 nm, about 25 nm to about 50 nm, about 50 nm to about 3000 nm, about 50 nm to about 2000 nm, about 50 nm to about 1000 nm, about 50 nm to about 500 nm, or about 50 nm to about 100 nm. In particular, each feature independently may have a width of about 1.0 nm to about 1000 nm. It is contemplated herein that aforementioned discussion regarding a feature's depth and/or width applies to all features described herein and is not limited to features present during a super-conformal growth cycle, but also includes features present during conformal growth cycles, and combinations thereof.

Without being bound by theory, it is believed that a critical factor allowing for super-conformal growth is the ability of some of the species (e.g., metal-containing complex and/or dissociated moieties of the metal-containing complex) that may desorb or be etched away to be re-deposited during the super-conformal growth cycle. In particular, species (e.g., metal-containing complex and/or dissociated moieties of the metal-containing complex) desorbing or being etched away from a surface of a substrate outside a feature and throughout the depth of the feature may be re-absorbed or re-deposited before being removed by a purging gas. However, during super-conformal growth, it is believed that a smaller proportion of such species may be re-absorbed or re-deposited at a surface of a substrate outside a feature while a larger proportion of such species may be re-absorbed or re-deposited within a feature before being removed by a purging gas. Further, the deeper the location within the feature, the more such re-absorbing or re-depositing may occur. It is believed that this may be because species desorbing and/or etching from deeper in a feature have a higher probability of contacting a growth surface, and thus of being re-deposited.

In various aspects, during a super-conformal growth cycle, at least about 1.0%, at least about 5.0%, at least about 10%, at least about 15%, at least about 20%, at least about 25%, at least about 30%, at least about 35%, at least about 40%, at least about 45%, at least about 50%, at least about 55%, at least about 60%, at least about 65%, at least about 70%, at least about 75%, at least about 80%, at least about 85%, at least about 90%, at least about 95% or about 100% of the feature may be filled. Additionally or alternatively, about 1.0% to about 100% of the feature may be filled, about 1.0% to about 75% of the feature may be filled, about 1.0% to about 60% of the feature may be filled, about 1.0% to about 50% of the feature may be filled, about 1.0% to about 30% of the feature may be filled, about 1.0% to about 20% of the feature may be filled, about 5.0% to about 100% of the feature may be filled, about 5.0% to about 75% of the feature may be filled, about 5.0% to about 60% of the feature may be filled, about 5.0% to about 50% of the feature may be filled, about 5.0% to about 30% of the feature may be filled, about 5.0% to about 20% of the feature may be filled, about 10% to about 100% of the feature may be filled, about 10% to about 75% of the feature may be filled, about 10% to about 60% of the feature may be filled, about 10% to about 50% of the feature may be filled, about 10% to about 30% of the feature may be filled, about 10% to about 20% of the feature may be filled, about 15% to about 20% of the feature may be filled, about 20% to about 100% of the feature may be filled, about 20% to about 75% of the feature may be filled, about 20% to about 60% of the feature may be filled, about 20% to about 50% of the feature may be filled, about 20% to about 30% of the feature may be filled, about 40% to about 75% of the feature may be filled, about 40% to about 60% of the feature may be filled, about 40% to about 50% of the feature may be filled, about 50% to about 60% of the feature may be filled.

In a particular embodiment, a super-conformal growth cycle may comprise the following:
1. delivery of a metal-containing complex (e.g., $MoCl_5$) at a concentration of about 0.00001% to about 100% or about 1 ppm to about 1000 ppm for a duration of about 0.01 second to about 1000 seconds or about 0.1 second to about 10 seconds, at a temperature of about −20° C. to about 500° C. or about 50° C. to about 200° C. and a pressure of about 0.010 mTorr to about 760 Torr or about 0.05 Torr to about 1000 mTorr or about 0.1 mTorr to about 30 mTorr or about 0.01 Torr to about 30 mTorr;
2. delivery of a purge gas (e.g., nitrogen) for a duration of about 0.01 second to about 1000 seconds or about 0.1 second to about 100 seconds, and at a flux rate of about 0.01 sccm to about 1000 sccm;
3. delivery of a co-reactant (e.g., 1,4-di-trimethylsilyl-2-methyl-cyclohexa-2,5-diene (CHD)) for a duration of about 0.01 second to about 1000 seconds or about 0.1 second to about 10 seconds, at a temperature of about −20° C. to about 500° C. or about 50° C. to about 200° C.; and 4. delivery of a purge gas (e.g., nitrogen) for a duration of about 0.01 second to about 1000 seconds or about 0.1 second to about 100 seconds, and at a flux rate of about 0.01 sccm to about 1000 sccm.

As described herein, any one or more of: the deposition temperature, deposition pressure, amount of metal-containing complex, duration of metal-containing complex exposure, duration of purge gas flow, flux rate of purge gas flow, amount of co-reactant and duration of co-reactant exposure, can be adjusted to achieve super-conformal growth.

B. Conformal Growth Cycle

Additionally or alternatively, the methods described herein may be performed under conditions comprising a conformal growth cycle. The conformal growth cycle may comprise delivering a metal-containing complex, a purge gas and a co-reactant to a substrate under conformal conditions such that conformal growth occurs. Conformal conditions include, but are not limited to temperature (e.g., of substrate, metal-containing complex, purge gas, co-reactant, etc.), pressure (e.g., during delivery of metal-containing complex, purge gas, co-reactant, etc.), amount of metal-containing complex delivered, and/or amount of purge gas delivered. In various aspects, the substrate may comprise one or more features where conformal growth may occur.

In a particular embodiment, a conformal growth cycle may comprise the following:

1. delivery of a metal-containing complex (e.g., $MoCl_5$) at a concentration of about 0.00001% to about 100% or about 1 ppm to about 1000 ppm for a duration of about 0.01 second to about 1000 seconds or about 0.1 second to about 10 seconds, at a temperature of about −20° C. to about 500° C. or about 50° C. to about 200° C. and a pressure of about 0.010 mTorr to about 760 Torr or about 0.05 Torr to about 1000 mTorr or about 0.1 mTorr to about 30 mTorr or about 0.01 Torr to about 30 mTorr;
2. delivery of a purge gas (e.g., nitrogen) for a duration of about 0.01 second to about 1000 seconds or about 0.1 second to about 100 seconds, and at a flux rate of about 0.01 sccm to about 1000 sccm;
3. delivery of a co-reactant (e.g., 1,4-di-trimethylsilyl-2-methyl-cyclohexa-2,5-diene (CHD)) for a duration of about 0.01 second to about 1000 seconds or about 0.1 second to about 10 seconds, at a temperature of about −20° C. to about 500° C. or about 50° C. to about 200° C.; and
4. delivery of a purge gas (e.g., nitrogen) for a duration of about 0.01 second to about 1000 seconds or about 0.1 second to about 100 seconds, and at a flux rate of about 0.01 sccm to about 1000 sccm.

As described herein, any one or more of: the deposition temperature, deposition pressure, amount of metal-containing complex, duration of metal-containing complex exposure, duration of purge gas flow, flux rate of purge gas flow, amount of co-reactant and duration of co-reactant exposure, can be adjusted to achieve conformal growth.

C. Sub-Conformal Growth Cycle

Additionally or alternatively, the methods described herein may be performed under conditions comprising a sub-conformal growth cycle. The sub-conformal growth cycle may comprise delivering a metal-containing complex, a purge gas and a co-reactant to a substrate under sub-conformal conditions such that sub-conformal growth occurs. Sub-conformal conditions include, but are not limited to temperature (e.g., of substrate, metal-containing complex, purge gas, co-reactant, etc.), pressure (e.g., during delivery of metal-containing complex, purge gas, co-reactant, etc.), amount of metal-containing complex delivered, and/or amount of purge gas delivered. In various aspects, the substrate may comprise one or more features where sub-conformal growth may occur.

In a particular embodiment, a sub-conformal growth cycle may comprise the following:

1. delivery of a metal-containing complex (e.g., $MoCl_5$) at a concentration of about 0.00001% to about 100% or about 1 ppm to about 1000 ppm for a duration of about 0.01 second to about 1000 seconds or about 0.1 second to about 10 seconds, at a temperature of about −20° C. to about 500° C. or about 50° C. to about 200° C. and a pressure of about 0.010 mTorr to about 760 Torr or about 0.05 Torr to about 1000 mTorr or about 0.1 mTorr to about 30 mTorr or about 0.01 Torr to about 30 mTorr;
2. delivery of a purge gas (e.g., nitrogen) for a duration of about 0.01 second to about 1000 seconds or about 0.1 second to about 100 seconds, and at a flux rate of about 0.01 sccm to about 1000 sccm;
3. delivery of a co-reactant (e.g., 1,4-di-trimethylsilyl-2-methyl-cyclohexa-2,5-diene (CHD)) for a duration of about 0.01 second to about 1000 seconds or about 0.1 second to about 10 seconds, at a temperature of about −20° C. to about 500° C. or about 50° C. to about 200° C.; and
4. delivery of a purge gas (e.g., nitrogen) for a duration of about 0.01 second to about 1000 seconds or about 0.1 second to about 100 seconds, and at a flux rate of about 0.01 sccm to about 1000 sccm.

As described herein, any one or more of: the deposition temperature, deposition pressure, amount of metal-containing complex, duration of metal-containing complex exposure, duration of purge gas flow, flux rate of purge gas flow, amount of co-reactant and duration of co-reactant exposure, can be adjusted to achieve sub-conformal growth.

D. Etch Cycle

Additionally or alternatively, the methods described herein may be performed under conditions comprising an etch cycle. The etch cycle may comprise delivering a metal-containing complex and a purge gas to a substrate under etch conditions such that etching occurs. Etch conditions include, but are not limited to temperature (e.g., of substrate, metal-containing complex, purge gas, etc.), pressure (e.g., during delivery of metal-containing complex, purge gas, etc.), amount of metal-containing complex delivered, and/or amount of purge gas delivered. In one aspect, the metal-containing complex is the same as the one used for the super-conformal and/or conformal growth cycles. In another aspect, the metal-containing complex is different from the one used for the super-conformal and/or conformal growth cycles. In various aspects, the substrate may comprise one or more features where etching may occur.

In a particular embodiment, an etch cycle may comprise the following:

1. delivery of a metal-containing complex (e.g., $MoCl_5$) at a concentration of about 0.00001% to about 100% or about 1 ppm to about 1000 ppm for a duration of about 0.01 second to about 1000 seconds or about 0.1 second to about 10 seconds, at a temperature of about −20° C. to about 500° C. or about 50° C. to about 200° C. and a pressure of about 0.010 mTorr to about 760 Torr or about 0.05 Torr to about 1000 mTorr or about 0.1 mTorr to about 30 mTorr or about 0.01 Torr to about 30 mTorr; and 2. delivery of a purge gas (e.g., nitrogen) for a duration of about 0.01 second to about 1000 seconds or about 0.1 second to about 100 seconds, and at a flux rate of about 0.01 sccm to about 1000 sccm.

As described herein, any one or more of: the deposition temperature, deposition pressure, amount of metal-containing complex, duration of metal-containing complex exposure, duration of purge gas flow, and flux rate of purge gas flow, can be adjusted to achieve etching.

E. Super-Cycle

In various aspects, the methods described herein may comprise one or more super-conformal growth cycles, one or more conformal growth cycles, one or more sub-conformal growth cycles and/or one or more etch cycles to achieve desired film growth, particularly selective film growth. For example, a combination of one or more of: super-conformal growth cycles, conformal growth cycles, sub-conformal growth cycles and etch cycles may be performed to substantially fill at least one feature in a substrate. It is contemplated herein that the super-conformal growth cycles, conformal growth cycles, sub-conformal growth cycles and/or etch cycles may be performed in any order. Further, the number of each of the super-conformal growth cycles, conformal growth cycles, sub-conformal growth cycles and/or etch cycles may be individually varied. In addition, the conditions used during the super-conformal growth cycles, conformal growth cycles, sub-conformal growth cycles and/or etch cycles may be varied. In particular, the order, number and conditions can be varied one or more times during the course of a super-cycle (described below). It is further understood that varying the order, number and conditions enables the deposition to be controlled for particular purposes (e.g., surface roughness, feature fill, etc.).

For example, in one or more embodiments, conditions may be selected such that the method comprises a super-conformal growth cycle sufficient for the metal-containing film to selectively grow over at least a portion (e.g., a first portion) of a first substrate. Additionally or alternatively, the conditions are further selected such that the method further comprises a conformal growth cycle sufficient for the metal-containing film to selectively grow over at least a portion (e.g., a second portion) of the first substrate. It is contemplated herein that a metal-containing film grown during the aforementioned super-conformal growth cycle and a metal-containing film grown during the aforementioned conformal growth cycle may respectively grow: (i) on the substantially the same portion of the first substrate (e.g., the first portion and the second portion are the same); (ii) on different portions of the first substrate (e.g., the first portion and the second portion are different); and/or (iii) on overlapping portions of the first substrate (e.g., the first portion and the second portion are overlapping). In specific embodiments, the conditions may be selected such that the method comprises a super-cycle combining one or more of: (i) a first series of one or more conformal growth cycles; (ii) a second series of one or more super-conformal growth cycles; (iii) a third series of one or more sub-conformal growth cycles; and (iv) a fourth series of one or more etch cycles. The first series of conformal growth cycles can comprise from 1 to 10 cycles, 2 to 5 cycles, or 3 cycles. The second series of super-conformal growth cycles can comprise from 1 to 10 cycles, 1 to 5 cycles, or 1 cycle. The third series of sub-conformal growth cycles can comprise from 1 to 10 cycles, 1 to 5 cycles, or 1 cycle. The fourth series of etch cycles can comprise from 1 to 10 cycles, 1 to 5 cycles, or 1 cycle.

It is contemplated herein that a super-conformal growth cycle, a conformal growth cycle, a sub-conformal growth cycle and/or an etch cycle can be performed in any order. For example, the first series of conformal growth cycles can be performed prior to the 15 second series of super-conformal growth cycles. Alternatively, the first series of conformal growth cycles can be performed after the second series of super-conformal growth cycles. The process of alternating conformal, super-conformal growth cycles, sub-conformal growth cycles, and/or etch cycles can be repeated until the desired result is obtained (e.g., the metal-containing film reaches a desired thickness, the metal-containing film reaches a desired roughness, a feature is substantially filled, etc.). By alternating conformal growth cycles, super-conformal growth cycles, sub-conformal growth cycles, and/or etch cycles, the root mean (RMS) square roughness of the metal-containing film can be tuned. The RMS roughness can be measured according to ASME B46.1. For example, the first series of conformal growth cycles and the second series of super-conformal growth cycles can be chosen to provide a metal-containing film having a root mean square roughness of less than about 1.5 nm, or less than 5% of the film's thickness. Further, the first series of conformal growth cycles and the second series of super-conformal growth cycles can be chosen to provide a metal-containing film having a root mean square roughness of less than about 1 nm, or less than 3% of the film's thickness. Even further, the first series of conformal growth cycles and the second series of super-conformal growth cycles can be chosen to provide a metal-containing film having a root mean square roughness of less than about 0.8 nm, or less than 2% of the film's thickness.

In one or more embodiments, a metal-containing film grown during a super-conformal growth cycle, a conformal growth cycle, and/or a sub-conformal growth cycle may have substantially no voids and/or hollow seams.

F. Film Roughness Controllability

In one or more embodiments, the roughness of a metal-containing film can be chosen by tuning the ratio of super-conformal growth cycles and conformal growth cycles.

In certain embodiments, the super-conformal growth cycles and the conformal growth cycles may both utilize the same metal-containing complex and the same co-reactant (e.g., metal-containing complex "A" and co-reactant "B"). The process parameters controlling whether a cycle is conformal or super-conformal can include the amount of purge gas separating pulses of A and pulses of B and the amount of A or B (i.e., the duration of pulses A or B and/or the concentration of A or B).

Additionally, the number of conformal growth cycles and super-conformal growth cycles can be adjusted during the deposition of a metal-containing film, so as to obtain specified desired properties including but not limited to roughness, seam-free fill, or super-conformality. For example, the deposition of a metal-containing film could be carried out with super-cycles consisting, initially, of three conformal growth cycles and one super-conformal growth cycle, and ending with super-cycles consisting of one conformal growth cycle and three super-conformal growth cycles. During the deposition of a metal-containing film, there could be multiple adjustments of the number of conformal and super-conformal growth cycles.

G. Selective Film Growth on More than One Substrate

In additional aspects, the methods described herein can result in selective film growth on more than one substrate. For example, a metal-containing film may selectively grow on at least a portion of a first substrate compared to a second substrate (e.g., or a third substrate, a fourth substrate, a fifth substrate, etc.). Additionally or alternatively, a metal-containing film may selectively grow on at least a portion of a first substrate and at least a portion of a second substrate compared to a third substrate and so on. Non-limiting examples of substrates include silicon, crystalline silicon, Si(100), Si(111), silicon oxide (e.g., $SiO_2$ or silica), glass, strained silicon, silicon on insulator (SOI), doped silicon or silicon oxide(s) (e.g., carbon doped silicon oxides), silicon nitride, germanium, gallium arsenide, tantalum, tantalum nitride, aluminum, copper, ruthenium, titanium, titanium nitride, tungsten, tungsten nitride, molybdenum and any number of other substrates commonly encountered in nanoscale device fabrication processes (e.g., semiconductor fabrication processes). In particular, the substrate(s) (e.g., first substrate, second substrate, third substrate, etc.) may be independently selected from the group consisting of silica, titanium nitride, and molybdenum. As will be appreciated by those of skill in the art, substrates may be exposed to a pretreatment process to polish, etch, reduce, oxidize, hydroxylate, anneal and/or bake the substrate surface. In one or more embodiments, the substrate surface may contain a hydrogen-terminated surface. In one or more embodiments, the substrate surface may contain a hydroxyl-terminated surface.

Without being bound by theory, it is believed that depending upon the substrate, the ratio of deposition rate to etching rate and/or desorption rate may favor deposition or may favor etching and/or desorption. Thus, each substrate (e.g., a first substrate, a second substrate, a third substrate) may have a different ratio of deposition rate to etching rate and/or desorption rate. For example, a ratio of deposition rate to etching rate and/or desorption rate may favor etching and/or desorption on a silica substrate, while a ratio of deposition rate to etching rate and/or desorption rate may favor deposition on a titanium nitride substrate and/or molybdenum substrate. Therefore, more film growth may occur on a titanium nitride substrate and/or a molybdenum substrate compared to a silica substrate. Furthermore, conditions as described herein (e.g. duration of purge gas delivery, etc.) may be adjusted or tuned to further favor deposition on one substrate (e.g., a first substrate) over another substrate (e.g. second substrate) and/or to favor etching and/or desorption on one substrate (e.g., a second substrate) over another substrate (e.g. first substrate). For example, the duration of delivery of a purge gas may be varied between delivery of a metal-containing complex and a co-reactant such that film growth can be promoted on a first substrate while growth may be inhibited or less on a second substrate.

H. Metal-Containing Complexes

Any suitable volatile metal-containing complex may be used in the methods described herein. The metal-containing complex may comprise one or more metal atoms and ligands. Suitable metals include, but are not limited to a Group 1 metal (e.g., Li, Na, K, Rb, etc.), a Group 2 metal (e.g., Be, Mg, Ca, Sr, etc.), a Group 13 metal (e.g., B, Al, Ga, In, Tl, etc.), a Group 14 metal (e.g., Si, Ge, Sn, Pb, etc.), a Group 15 metal (e.g., As, Sb, Bi, etc.), a Group 16 metal (e.g., Se, Te, etc.), a transition metal (e.g., Mo, W, V, Nb, Fe, Ti, Ta, Co, Ni, etc.), a lanthanide metal (e.g., La, Ce, Pr, Nd, Pm, etc.) and an actinide metal (e.g., Ac, Th, Pa, U, Np, Pu, etc.). In a particular embodiment, the metal may be selected from the group consisting of a transition metal, a lanthanide metal, an actinide metal, aluminum, gallium, indium, silicon, germanium, tin, lead, arsenic, antimony, bismuth, selenium, and tellurium. In another embodiment, the metal may a transition metal, e.g., selected from the group consisting of Mo, W, V, Nb, Fe, Ti, Ta, Co, and Ni, particularly, Mo, W or Ta.

Suitable ligands include, but are not limited to ligands having a negative charge when separated from the metal center. Additionally or alternatively, suitable ligands may be capable of reacting with dissociated co-reactant moieties to form stable, neutral (non-ionic), volatile species, which may be removed via a purge gas or carrier gas. Examples of dissociated co-reactant moieties include, but are not limited to silyls, —$SiZ^1Z^2Z^3$ radical, where each of $Z^1$, $Z^2$, and $Z^3$ is independently selected from the group consisting of hydrogen and optionally substituted alkyl, alkenyl, alkynyl, aryl, alkoxy, aryloxy, amino, halogen, dialkylamide and combinations thereof. For example, dissociated co-reactant moieties include, but are not limited to —$SiMe_3$, —$SiHMe_2$, —$SiH_2Me$, and —$SiH_3$.

In various aspects, the metal-containing complex may comprise one or more ligands selected from the group consisting of a halogen (e.g., F, Cl, Br), a hydride, an alkoxy (e.g., methoxy, ethoxy, propoxy, butoxy, etc.), an amidinate, an alkylamide, dialkyl-amide, an alkyl-sulfide, a dialkyl phosphide, an N,N'-dialkylamidinate, a cyclopentadienyl optionally substituted with at least one alkyl and/or at least one silyl, a carboxylate, an imide, an acetylacetonate, a diketiminate, a mono-iminoketiminate, a trialkylsilyl, trihydrosilyl, a dialkylhydrosilyl, alkyldihydrosilyl, trialkylgermanyl, trihydrogermanyl, dialkylhydrogermanyl, alkyldihydrogermanyl, trialkylstannyl, trihydrostannyl, alkyldihydrostannyl, an amide optionally substituted with at least one silyl, a siloxy, a formamidinate optionally substituted with one or more hydride, alkyl and/or silyl, a acetamidinate optionally substituted with one or more hydride, alkyl and/or silyl, and a combination thereof and combinations thereof. In a particular embodiment, the metal-containing complex may comprise one or more ligands selected from the group consisting of a halogen, an alkoxy, a dialkylamide and a combination thereof. In another embodiment, the metal-containing complex may comprise one or more halogen ligands (e.g., Cl), e.g., the metal-containing complex may be $MoCl_5$, $TiCl_4$, $TaCl_5$, $ZrCl_4$, $HfCl_4$, $WCl_6$, particularly, $MoCl_5$.

The metal-containing complexes described herein may be capable of one or more of: depositing metal, etching the metal-containing film, and allowing for desorption from the metal-containing film. The metal-containing complex will have all of the requirements for sufficient vapor pressure, sufficient thermal stability at the selected substrate temperature and sufficient reactivity to produce a reaction on the surface of the substrate without unwanted impurities in the thin film. Sufficient vapor pressure ensures that molecules of the source compound are present at the substrate surface in sufficient concentration to enable a complete self-saturating reaction. Sufficient thermal stability ensures that the source compound will not be subject to the thermal decomposition which produces impurities in the thin film.

Thus, the metal complexes disclosed herein utilized in these methods may be liquid, solid, or gaseous. Typically, the metal complexes are liquids or solids at ambient temperatures with a vapor pressure sufficient to allow for consistent transport of the vapor to the process chamber.

In certain embodiments, the metal-containing complex may be dissolved in a suitable solvent such as a hydrocarbon or an amine solvent to facilitate the vapor deposition process. Appropriate hydrocarbon solvents include, but are not limited to, aliphatic hydrocarbons, such as hexane, heptane and nonane; aromatic hydrocarbons, such as toluene and xylene; and aliphatic and cyclic ethers, such as diglyme, triglyme, and tetraglyme. Examples of appropriate amine solvents include, without limitation, octylamine and N,N-dimethyldodecylamine. For example, the metal-containing complex may be dissolved in toluene to yield a solution with a concentration from about 0.05 M to about 1 M.

In another embodiment, the at least one metal complex may be delivered "neat" (undiluted by a carrier gas) to a substrate surface.

In another embodiment, a mixed-metal film can be formed the methods described herein which vaporizes at least a first metal-containing complex as disclosed herein in combination, but not necessarily at the same time, with a second metal-containing complex comprising a metal other than that of the first metal-containing complex disclosed herein (and/or with a third metal-containing complex and/or with a fourth metal-containing complex and so on). For example, the first metal-containing complex can comprise Mo and the second metal-containing complex can comprise W to form a mixed-metal, Mo—W film. In some embodiments, the mixed-metal film may be a mixed-metal oxide, a mixed-metal nitride, or a mixed-metal oxy-nitride.

I. Co-Reactants

In various aspects, the method may comprise delivering at least one metal-containing complex, a purge gas and at least one co-reactant to at least one substrate (e.g., a first substrate, a second substrate, a third substrate, a fourth substrate, etc.) under sufficient conditions for the co-reactant to undergo one or more of the following: deposit a species, such as the co-reactant and/or dissociated moieties of the co-reactant; etch the metal-containing film; and allow for desorption from the metal-containing film, such as desorption of an already deposited species (e.g., co-reactant and/or dissociated moieties of the co-reactant). In particular, a metal-containing complex, a purge gas and a co-reactant may be delivered to a substrate under sufficient conditions so that the co-reactant may: (i) deposit metal and etch the metal-containing film, (ii) deposit metal, etch the metal-containing film and allow for desorption from the metal-containing film, or (iii) deposit metal and allow for desorption from the metal-containing film, such that the metal-containing film selectively grows on at least a portion of the first substrate.

Any suitable volatile co-reactant may be used in the methods described herein. As will be readily appreciated, the particular co-reactant used can determine the type of metal-containing film is obtained, e.g., metal oxide, metal nitride, etc. Suitable volatile co-reactants may be capable of behaving as a reducing agent and/or quenching etching and/or desorption. In particular, the co-reactant may be a volatile reducing agent, e.g., hydrogen. Additionally or alternatively, suitable co-reactants may be capable of forming dissociated co-reactant moieties as described above (e.g., silyls), which may react with one or more ligands as described herein (e.g., from the metal-containing complex), for example, present on the surface of a film, to form stable, neutral (non-ionic), volatile species, which may be removed via a purge gas or carrier gas.

Examples of suitable co-reactants include, but are not limited to the reducing agents described in U.S. Pat. No. 9,157,149, U.S. Patent Publication No. 2015/0004314 and U.S. Patent Publication No. 2015/0004315, each of which are incorporated herein by reference in their entirety.

In a particular embodiment, the co-reactant may be 1,4-bis-trimethylsilyl-2-methyl-cyclohexa-2,5-diene (CHD), 1-trimethylsilylcyclohexa-2,5-diene (TSC), or 1,4-bis-trimethylsilyl-1,4-dihydropyrazine (DHP).

Further examples of suitable co-reactants include, but are not limited to compounds (1)-(13) in Table 1 below.

TABLE 1

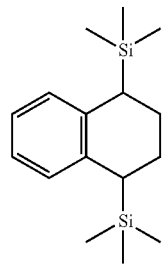 [SMILES: C[Si](C)(C)C1CCC([Si](C)(C)C)c2ccccc21]

(1)

1,4-bis(trimethylsilyl)-1,2,3,4-tetrahydronaphthalene

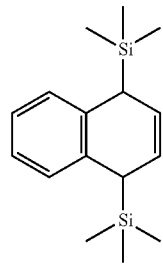 [SMILES: C[Si](C)(C)C1C=CC([Si](C)(C)C)c2ccccc21]

(2)

1,4-bis(trimethylsilyl)-1,4-dihydronaphthalene

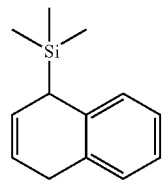

(3)

(1,4-dihydronaphthalen-1-yl)trimethylsilane

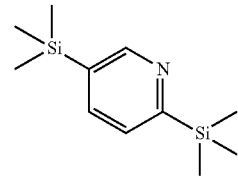

(4)

2,5-bis(trimethylsilyl)pyridine

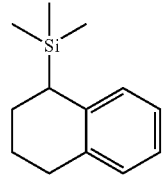

(5)

trimethyl(1,2,3,4-tetrahydronaphthalen-1-yl)silane

TABLE 1-continued

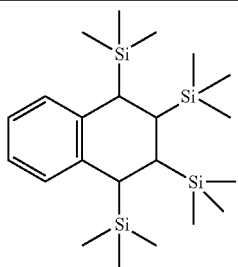

(6)

(1,2,3,4-tetrahydronaphthahalene-1,2,3,4-tetrayl)tetrakis(trimethylsilane)

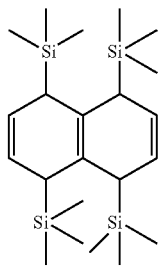 [SMILES: C[Si](C)(C)C1C=CC([Si](C)(C)C)C2=C1C([Si](C)(C)C)C=CC2[Si](C)(C)C]

(7)

1,4,5,8-tetrakis(trimethylsilyl)-1,4,5,8-tetrahydronaphthalene

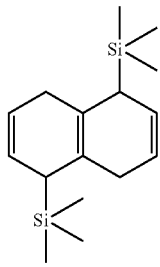 [SMILES: C[Si](C)(C)C1C=CCC2=C1CC=CC2[Si](C)(C)C]

(8)

1,5-bis(trimethylsilyl)-1,4,5,8-tetrahydronaphthalene

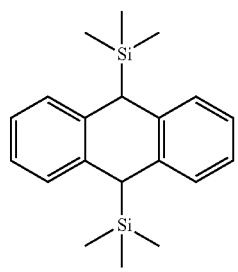 [SMILES: C[Si](C)(C)C1c2ccccc2C([Si](C)(C)C)c2ccccc21]

(9)

9,10-bis(trimethylsilyl)-9,10-dihydroanthracene

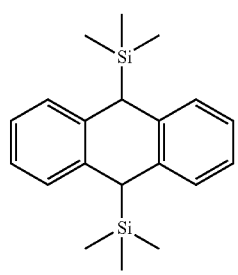 [SMILES: C[Si](C)(C)C1c2ccccc2C([Si](C)(C)C)c2ccccc21]

(10)

TABLE 1-continued 1,4-bis(trimethylsilyl)-1,4-dihydroanthracene (11)

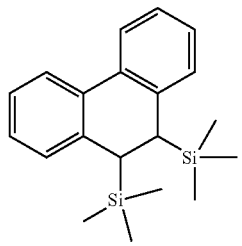 [SMILES: C[Si](C)(C)C1c2ccccc2-c2ccccc2C1[Si](C)(C)C]

9,10-bis(trimethylsilyl)-9,10-dihydrophenanthrene (12)

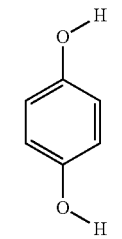

hydroquinone (13)

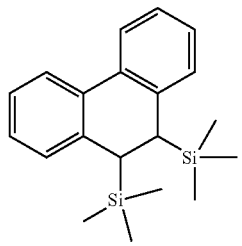 [SMILES: C[Si](C)(C)C1c2ccccc2-c2ccccc2C1[Si](C)(C)C]

1,4-bis((trimethylsilyl)oxy)benzene

In various aspects, upon loss of certain moieties (e.g., silyls), the co-reactant may become a more unsaturated volatile species, for example, an aromatic compound. Thus, a co-reactant may be a non-aromatic compound which converts to an aromatic compound during the methods described herein. For example, when the co-reactant is CHD, toluene may form upon the loss of two trimethylsilyl groups (—SiMe$_3$). When the co-reactant is DHP, pyrazine may form upon the loss of two trimethylsilyl groups (—SiMe$_3$). When the co-reactant is TSC, benzene may form upon the loss of one trimethylsilyl group (—SiMe$_3$) and one hydrogen atom.

In some embodiments, the co-reactants include, but are not limited to hydrogen, hydrogen plasma, oxygen, air, water, an alcohol, $H_2O_2$, $N_2O$, ammonia, a hydrazine, a borane, a silane, ozone, or a combination of any two or more thereof. Examples of suitable alcohols include, without limitation, methanol, ethanol, propanol, isopropanol, tert-butanol, and the like. Examples of suitable boranes include, without limitation, hydridic (i.e., reducing) boranes such as borane, diborane, triborane and the like. Examples of suitable silanes include, without limitation, hydridic silanes such as silane, disilane, trisilane, and the like. Examples of suitable hydrazines include, without limitation, hydrazine ($N_2H_4$), a hydrazine optionally substituted with one or more alkyl groups (i.e., an alkyl-substituted hydrazine) such as methylhydrazine, tert-butylhydrazine, N,N- or N,N'-dimethylhydrazine, a hydrazine optionally substituted with one or more aryl groups (i.e., an aryl-substituted hydrazine) such as phenylhydrazine, and the like.

In a particular embodiment, the methods of the present technology are utilized for applications such as dynamic random access memory (DRAM) and complementary metal oxide semi-conductor (CMOS) for memory and logic applications, on substrates such as silicon chips.

Any of the metal complexes disclosed herein may be used to prepare thin films of the elemental metal, metal oxide, metal nitride, and/or metal silicide. Such films may find application as oxidation catalysts, anode materials (e.g., SOFC or LIB anodes), conducting layers, sensors, diffusion barriers/coatings, super- and non-superconducting materials/coatings, tribological coatings, and/or, protective coatings. It is understood by one of ordinary skill in the art that the film properties (e.g., conductivity) will depend on a number of factors, such as the metal(s) used for deposition, the presence or absence of co-reactants and/or co-complexes, the thickness of the film created, the parameters and substrate employed during growth and subsequent processing.

Reference throughout this specification to "one embodiment," "certain embodiments," "one or more embodiments" or "an embodiment" means that a particular feature, structure, material, or characteristic described in connection with the embodiment is included in at least one embodiment of the present technology. Thus, the appearances of the phrases such as "in one or more embodiments," "in certain embodiments," "in one embodiment" or "in an embodiment" in various places throughout this specification are not necessarily referring to the same embodiment of the present technology. Furthermore, the particular features, structures, materials, or characteristics may be combined in any suitable manner in one or more embodiments.

Although the present technology herein has been described with reference to particular embodiments, it is to be understood that these embodiments are merely illustrative of the principles and applications of the present technology. It will be apparent to those skilled in the art that various modifications and variations can be made to the method and apparatus of the present technology without departing from the spirit and scope of the present technology. Thus, it is intended that the present technology include modifications and variations that are within the scope of the appended claims and their equivalents. The present technology, thus generally described, will be understood more readily by reference to the following examples, which is provided by way of illustration and is not intended to be limiting.

EXAMPLES

Unless otherwise noted, the coupons or substrates described in the examples are silica with a 50 Å coating of TiN, and the features described herein have a width of approximately 90 nm and a depth of approximately 1800 nm. The designations "A1," "A2," "B1," "B2," "C1," "D1," "E1", "F1," "G1," "H1," and so on are used to identify individual features described in the examples below.

Example 1: Selective ALD Film Growth In and Around Features in a Substrate

Example 1A: ALD Under Conformal Growth Conditions I: Conformal ALD Growth of Molybdenum Film ALD was performed over the course of 300 cycles at 275° C. under conformal growth conditions as provided herein (referred to herein as "conformal growth conditions I"). Each cycle consisted of:
1. a 1-second exposure of $MoCl_5$ (delivered by vapor-draw, while held at 120° C. (corrected temperature), which resulted in a pressure spike of 0.020-0.022 Torr),
2. followed by a 10-second purge with 20 sccm (standard cubic centimeter per minute) of nitrogen,
3. a 3-second exposure of 1,4-di-trimethylsilyl-2-methylcyclohexa-2,5-diene (CHD) (delivered by bubbling nitrogen in a CHD cylinder, which was heated to 50° C.),
4. followed by a 10-second purge with 20 sccm of nitrogen.

Two zones were seen in the deposition reactor: one where no growth was observed on the coupons serving as the substrate (etch/desorption was greater than deposition), and one where growth was observed on the coupons (deposition was greater than etch/desorption). The film thickness was homogenous within the area where growth was observed, and the film was 24-26 nm thick (growth rate 0.8-0.857 Å/cycle) with a resistivity of 190-250 µΩ·cm. Conformal growth was observed for the substrate with features placed in the area where growth was observed. The roughness of the sample was analyzed by atomic force microscopy (AFM) on five different locations. An average of these five measurements gave an average root mean square (RMS) roughness of 2.818 nm (standard deviation=0.076), which is 11.3% of the film's thickness. Unless otherwise indicated throughout the examples, the AFM equipment used was a Park Systems NX20. Scans were collected using a 1 µm square scan area with a resolution of 256 pixels per line. Adaptive scan (0.8-0.2 Hz) in non contact mode (NCM) was used. The AFM tip utilized was a PPP-NCHR. Images were analyzed using XEI from Park Systems. Scanning electron microscopy (SEM) images were taken of various features after deposition as shown in FIGS. 3-6.

Figure 3:
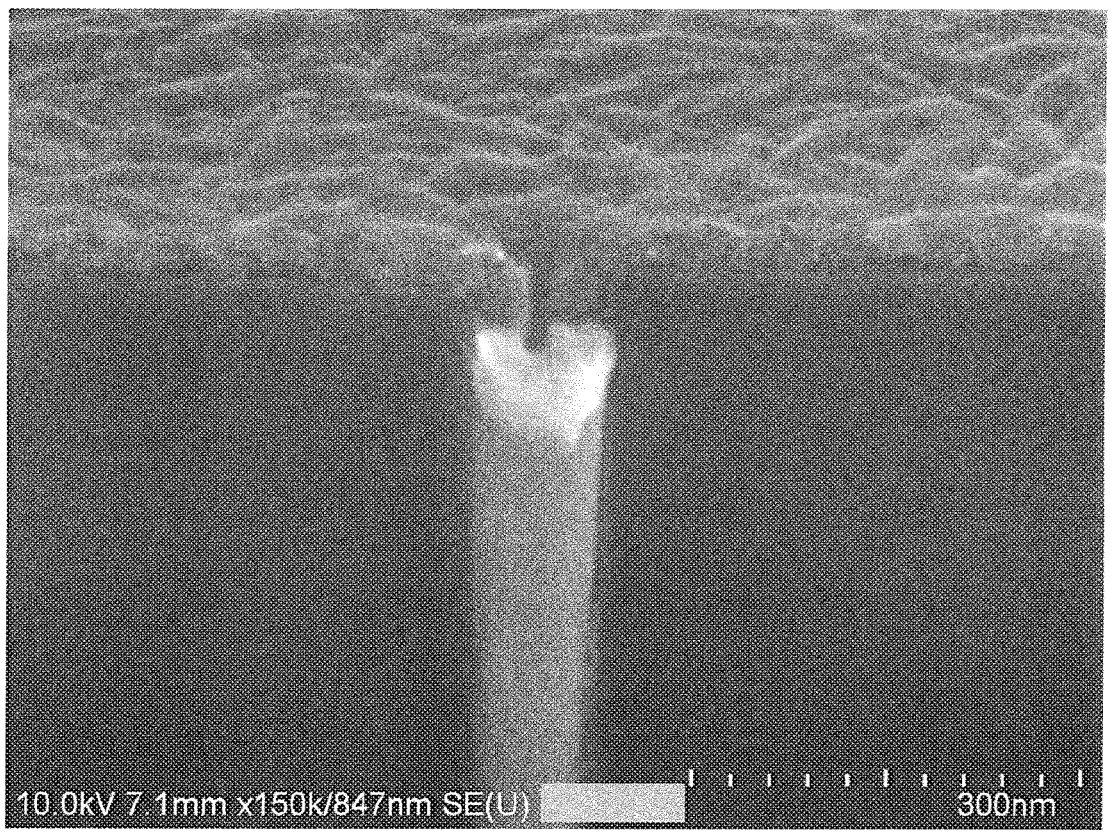
FIG. 3 provides a scanning electron microscopy (SEM) image of a top portion of feature A1, at 150 K magnification, tilted view, showing a thick molybdenum film was deposited both at an upper portion of feature A1 and outside the feature A1.

FIG. 3 shows that a thick molybdenum film was deposited at an upper portion of a feature A1 and outside the feature A1, where deposition was greater than etch/desorption.

Figure 4:
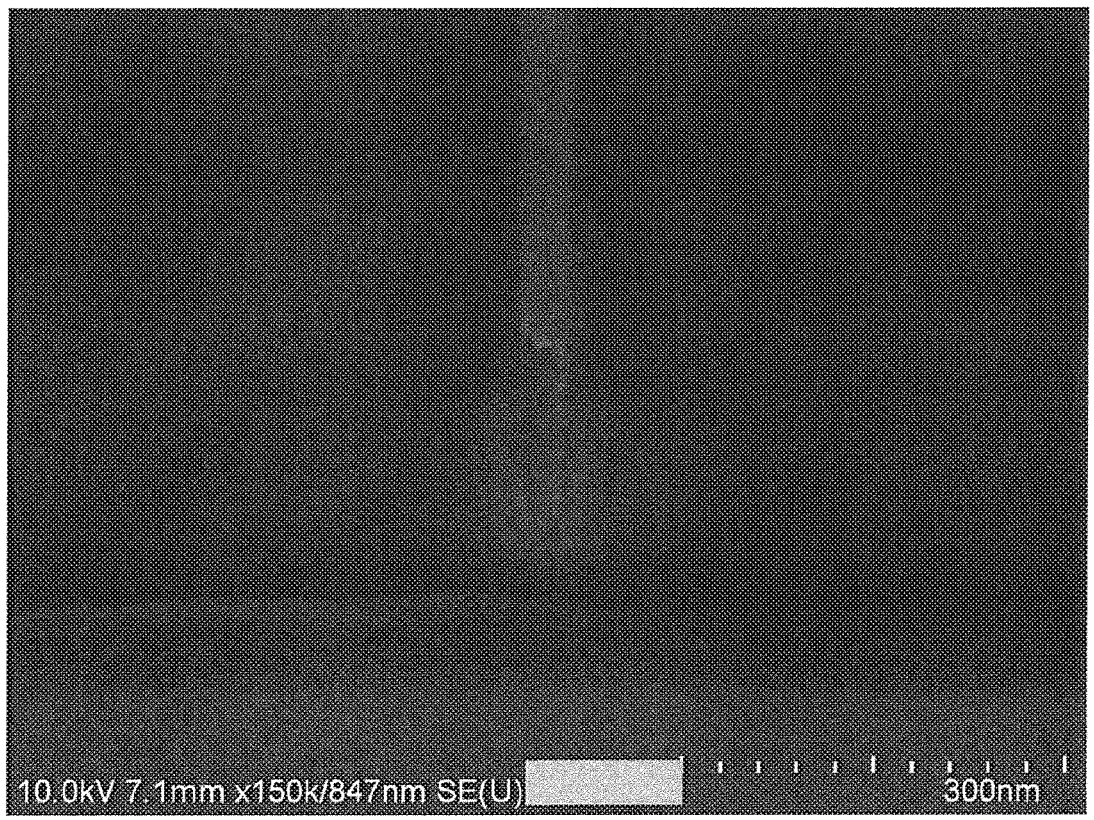
FIG. 4 provides an SEM image of a bottom portion of feature A2, at 150 K magnification, perpendicular view, showing that a thick molybdenum film was deposited at a lower portion of feature A2.

FIG. 4 shows that a thick molybdenum film was deposited at a lower portion of a feature A2, where deposition was greater than etch/desorption. The lower 100 nm of the film was cracked during the cleave.

Figure 5:
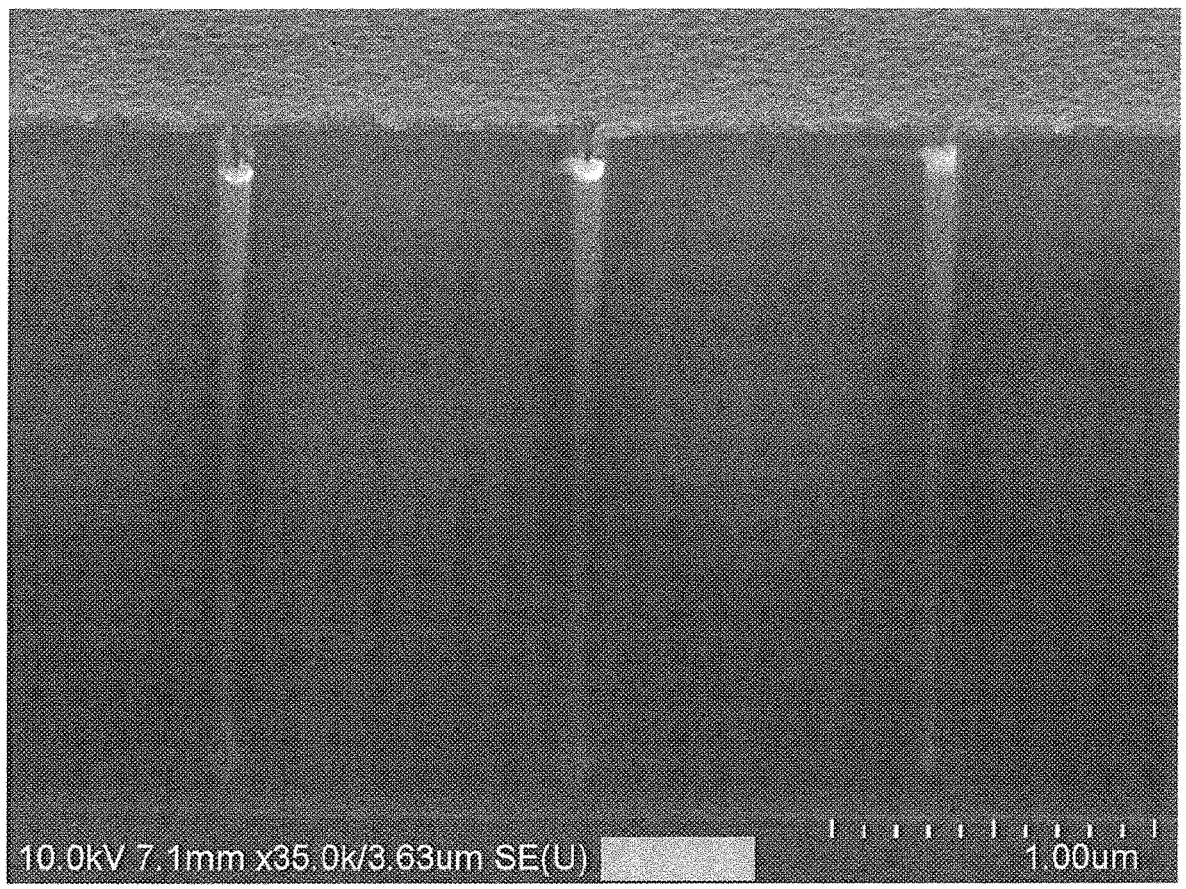
FIG. 5 provides an SEM image of entire lengths of features A3, A4, and A5 (from left to right), at 35 K magnification, tilted view, showing that a thick molybdenum film was deposited throughout the features' lengths.

FIG. 5 illustrates how the amount of molybdenum within a feature varies from top to bottom, showing that a thick film of molybdenum was deposited throughout the lengths of feature A3, feature A4, and feature A5 (from left to right). Additionally, the right feature A5 was not broken during cleave while the left feature A3 and middle feature A4 were partially broken off (at the bottom) during cleave. The film profile within the features was consistent with conformal growth with some variations in film thickness.

Figure 6:
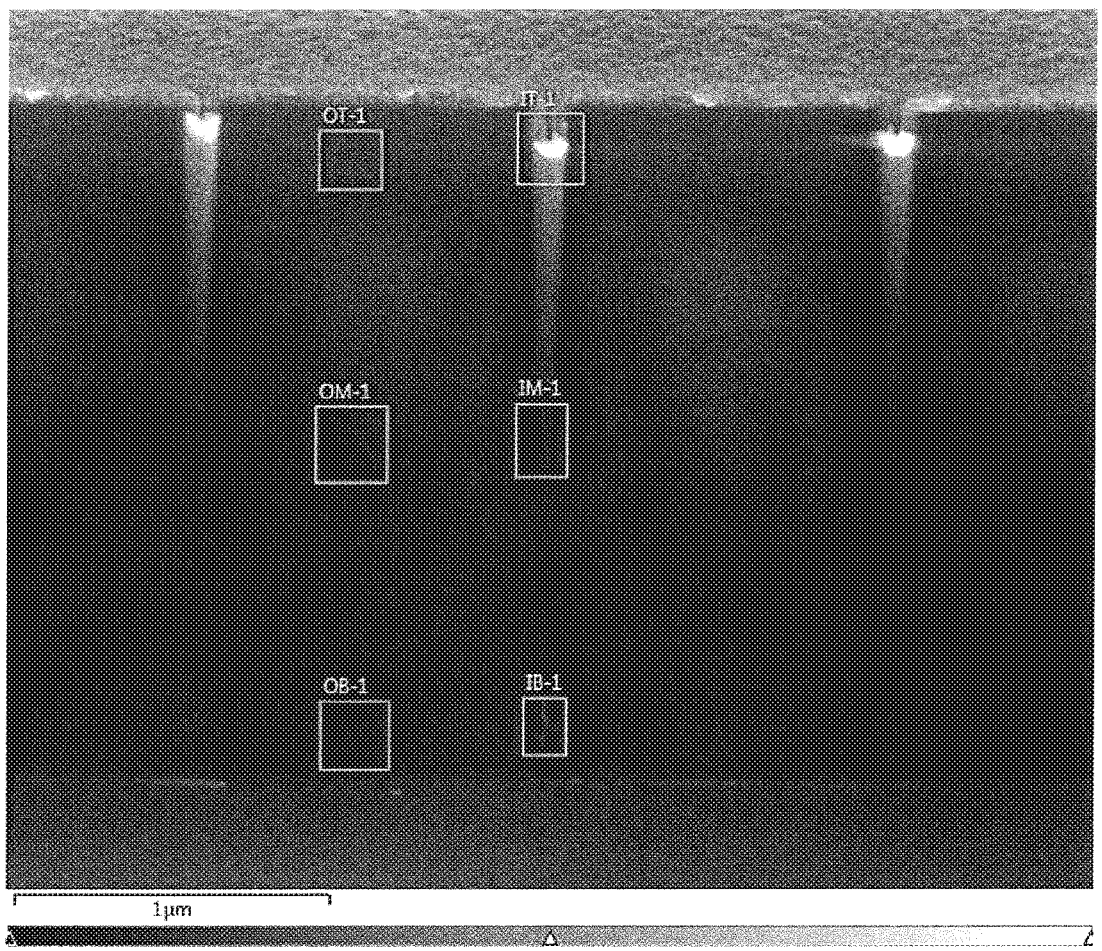
FIG. 6 provides an SEM image showing six approximate locations where the amount of molybdenum was quantified by energy-dispersive X-ray spectroscopy (EDS) inside and outside feature A6.

FIG. 6 illustrates six approximate locations where the amount of molybdenum was quantified by energy-dispersive X-ray spectroscopy (EDS). Three locations within a feature A6 (middle feature) were analyzed, within an upper portion of the feature (IT-1), within a middle portion of the feature (IM-1), and within a lower portion of the feature (IB-1). For reference, an additional three locations were analyzed outside the feature A6, outside an upper portion of the feature (OT-1), outside a middle portion of the feature (OM-1), and a lower portion of the feature (OB-1).

Figure 7:
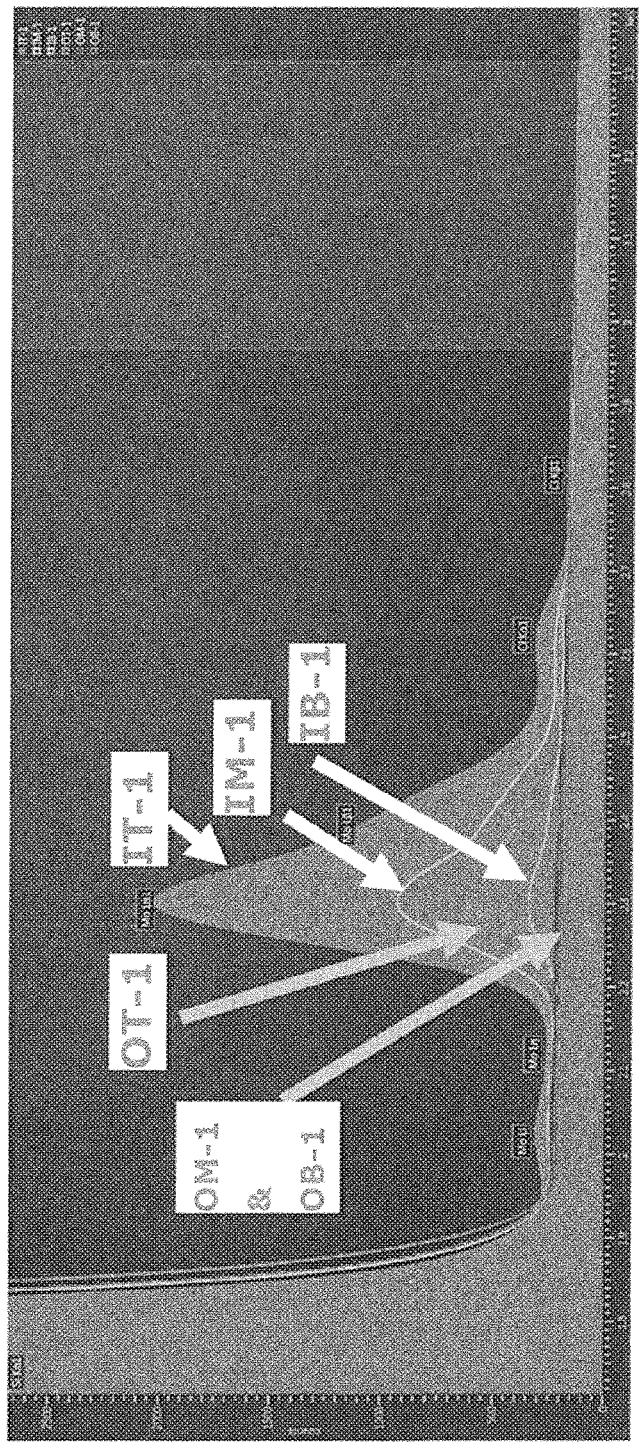
FIG. 7 illustrates the intensity of the EDS scans for the six approximate locations shown in FIG. 6.

FIG. 7 shows the intensity of the EDS scans for the six approximate locations (for a sample with conformal molybdenum growth) in FIG. 6, and shows that molybdenum was present at three locations (IT-1, IM-1, and IB-1) in feature A6 (middle feature) and outside an upper portion (OT-1) of the feature A6. This indicated that molybdenum was present throughout the feature A6. The respective intensity of the molybdenum signal at these locations (IT-1, IM-1, and IB-1) of feature A6 was an indication of film thickness, feature width, and the way the molybdenum film was cleaved when the substrate was cleaved, so the respective signal intensity should not be interpreted as an indication of the as-deposited film thickness alone. Molybdenum was also seen at location OT-1 because some of the molybdenum present in the flat surface outside an upper portion of the feature A6 was in the analyzed area.

Figure 8:
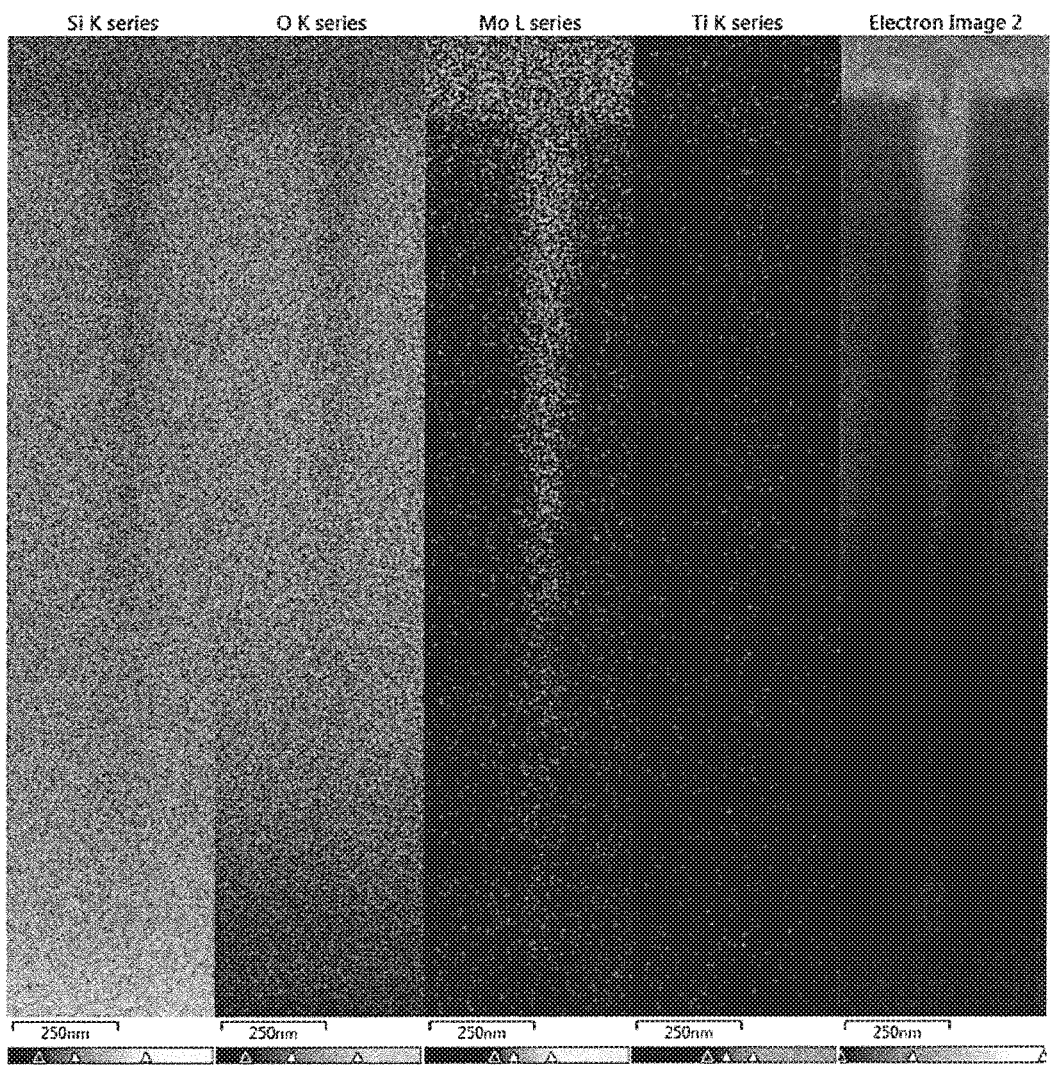
FIG. 8 illustrates the quantification of molybdenum, silicon, oxygen, and titanium (measured by EDS) within a rectangle covering a whole feature A7 (SEM image provided on the far right).

FIG. 8 shows the quantification of molybdenum, silicon, oxygen, and titanium (measured by EDS) within a rectangle covering a whole feature A7 (SEM image provided on the far right), which illustrates a strong signal of molybdenum that was somewhat constant within the whole feature A7. This strong molybdenum "shadows" the silicon and oxygen signals, which originate from the silica substrate. The silica substrate was coated with a 50 Å TiN liner, and the titanium was analyzed to provide confirmation that the analysis was as sensitive as desired. This pattern of thickness across the feature with a 20:1 aspect ratio was consistent with a conformal ALD process with some variations in film thickness.

Figure 9:
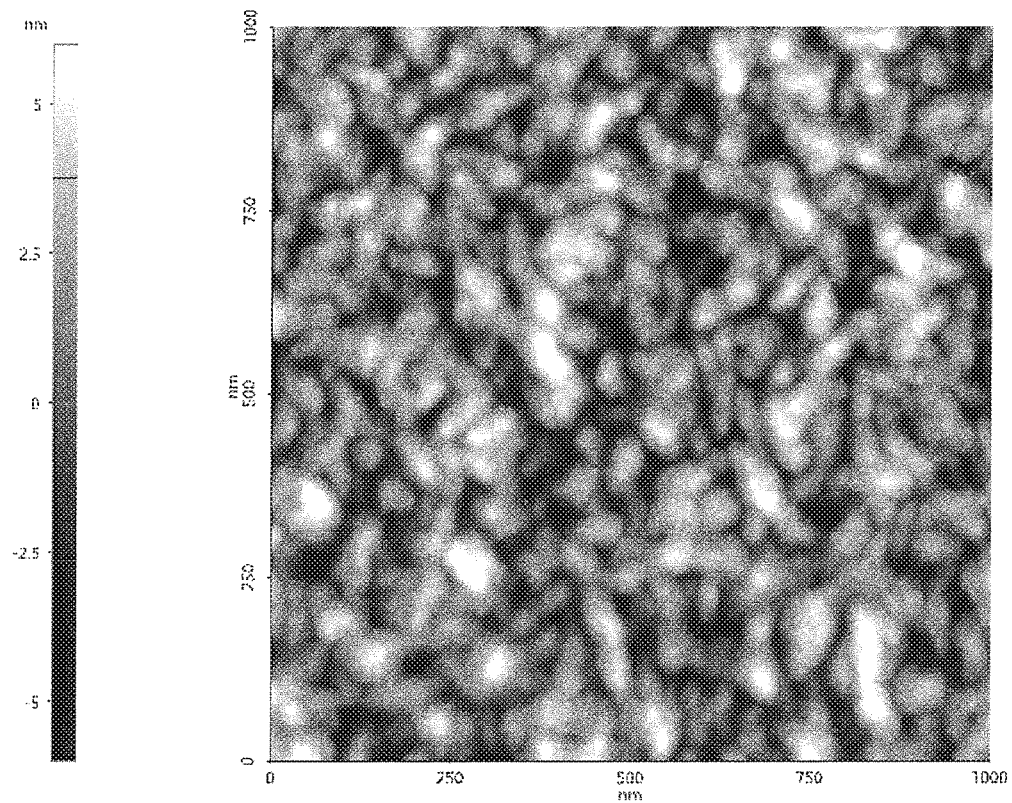
FIG. 9a (right side) provides an atomic force microscopy (AFM) map of a 1 µm square area of a deposited Mo film, showing that the deposited film is rough.
FIG. 9b is a histogram showing the distribution of pixels by height.
Figure 9:
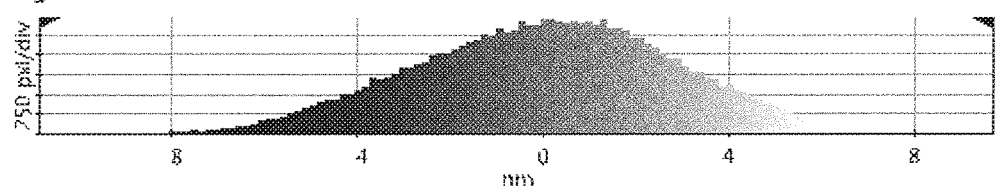

FIG. 9a (right side) provides an AFM map of a 1 μm square area of a deposited Mo film on a top surface of a sample showing that the deposited film is rough. FIG. 9a (left side) shows the palette of colors used to illustrate the height of each pixel of the AFM map. This palette of colors is the same for all AFM data shown in FIGS. 9, 42, 50, 58, and 66. FIG. 9b is a histogram showing the distribution of pixels by height. The RMS roughness on that sample was 2.843 nm, which means the RMS roughness was 11.4% of the film thickness. Four additional 1 μm square areas were similarly analyzed (data not shown) and each provided an RMS roughness of 2.786 nm (11.1%), 2.709 nm (10.8%), 2.914 nm (11.7%) and 2.838 nm (11.4%), respectively.

Example 1B: ALD Under Super-Conformal Growth Conditions 11: Super-Conformal ALD Growth of Molybdenum Film ALD was performed over the course of 500 cycles at 275° C. under super-conformal growth conditions as provided herein (referred to herein as "super-conformal growth conditions 11"). Each cycle consisted of:
1. a 1-second exposure of $MoCl_5$ (delivered by vapor-draw, while held at 117° C. (corrected temperature)), which resulted in a pressure spike of 0.014-0.016 Torr),
2. followed by a 20-second purge with 20 sccm of nitrogen,
3. a 3-second exposure of CHD (delivered by bubbling nitrogen in a CHD cylinder, which was heated to 50° C.),
4. followed by a 20-second purge with 20 sccm of nitrogen.

Only one zone was seen in the deposition reactor, where no growth was observed on the coupons serving as the substrate (etch/desorption was greater than deposition). By X-ray fluorescence (XRF), a maximum thickness of 1.1 nm molybdenum (growth rate 0.022 Å/cycle) was measured on the coupons in an area where the patterned coupon (i.e., a coupon with features) was located. Elsewhere in the reactor, a maximum thickness of 2.1 nm molybdenum (0.042 Å/cycle) was measured. In no area of the reactor was a "true ALD" growth rate observed, which would be at least 0.1 Å/cycle confirmed by that nowhere else in the deposition chamber was a higher growth rate observed when it was confirmed that no CVD was occurring. Finally the backside of the coupons showed that some areas had up to 25 nm molybdenum (0.50 Å/cycle).

On the back-side of the coupons (which were on a substrate holder), desorption/etch was decreased because the amount of purge gas was minimized, and desorption/etch was more likely to lead to re-deposition. The same was expected to occur at the bottom of the features. Scanning electron microscopy (SEM) and EDS analysis confirmed that no molybdenum was detected on the flat surface of the patterned coupon and no molybdenum was detected in an upper portion of the features. Molybdenum was detected only in a lower portion of the features indicating that super-conformal growth occurred. SEM images were taken of various features after deposition as shown in FIGS. 10-15.

Figure 10:
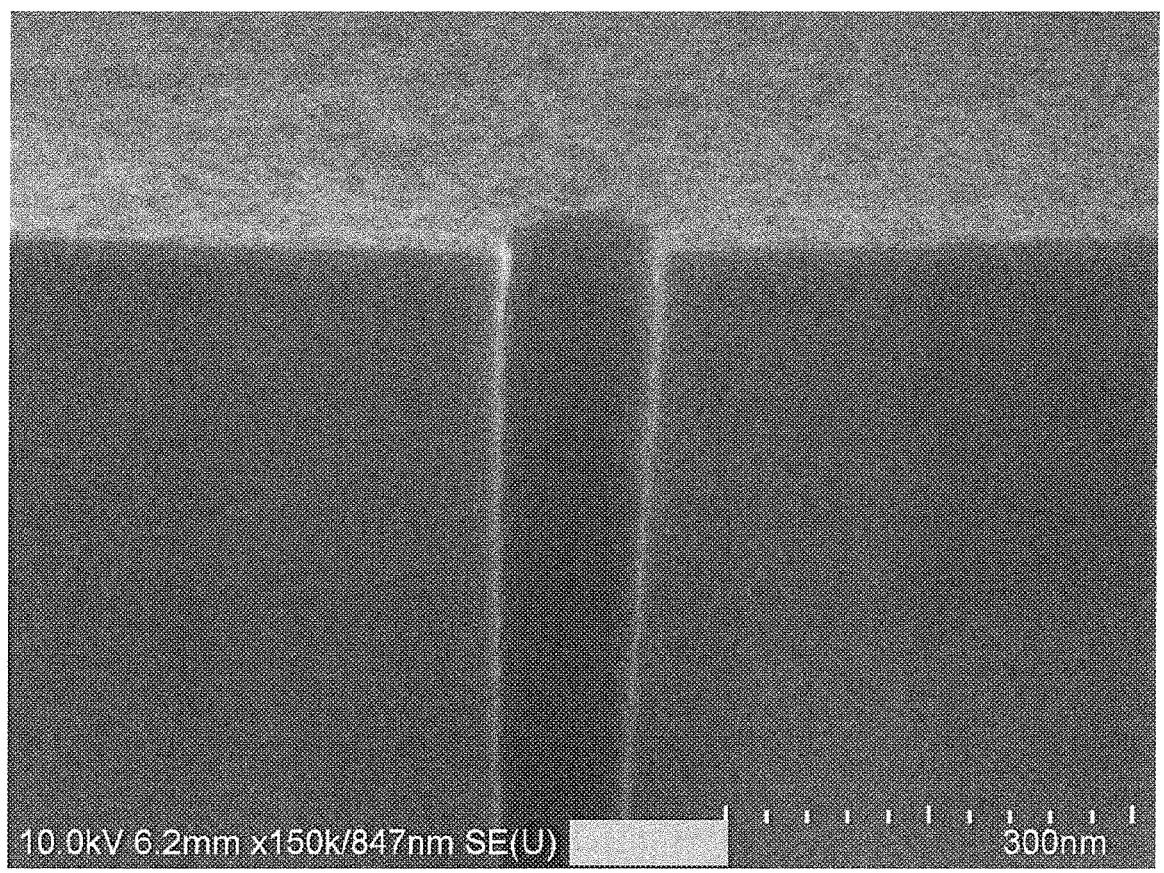
FIG. 10 provides an SEM image of a top portion of feature B1, at 150 K magnification, tilted view, showing that very little or no molybdenum was deposited at an upper portion of feature B1, and outside the feature B1.

FIG. 10 shows that very little or no molybdenum was deposited at an upper portion of a feature B1, and outside the feature B1, where etch/desorption was greater than deposition.

Figure 11:
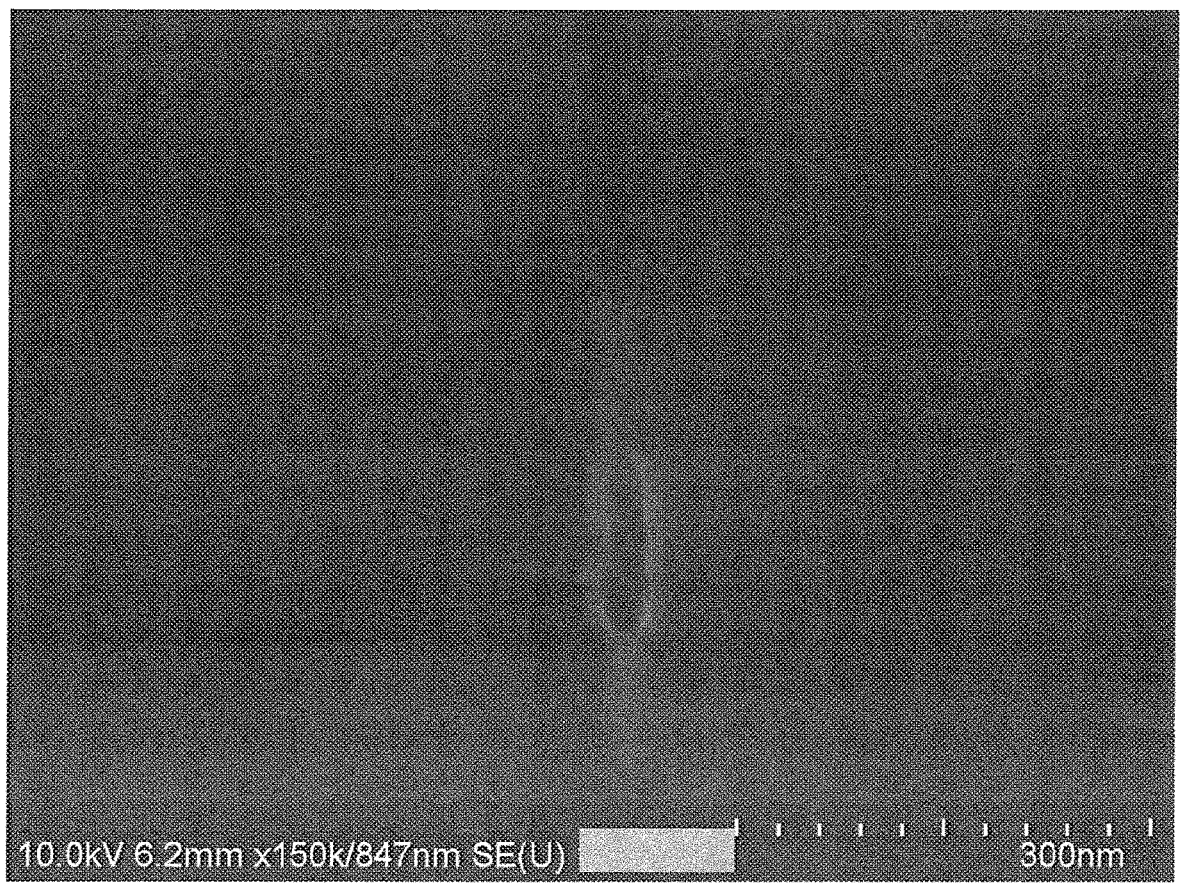
FIG. 11 provides an SEM image of a bottom portion feature B2, at 150 K magnification, tilted view, showing that a molybdenum film was deposited in a lower portion of a feature.

FIG. 11 shows that a molybdenum film was deposited in a lower portion of a feature B2, where deposition was greater than etch/desorption.

Figure 12:
FIG. 12 provides an SEM image of a bottom portion of feature B3, at 150 K magnification, tilted view, showing that a molybdenum film was deposited in a lower portion of feature B3.

FIG. 12 shows that a molybdenum film was deposited in a lower portion of a feature B3, where deposition was greater than etch/desorption.

Figure 13:
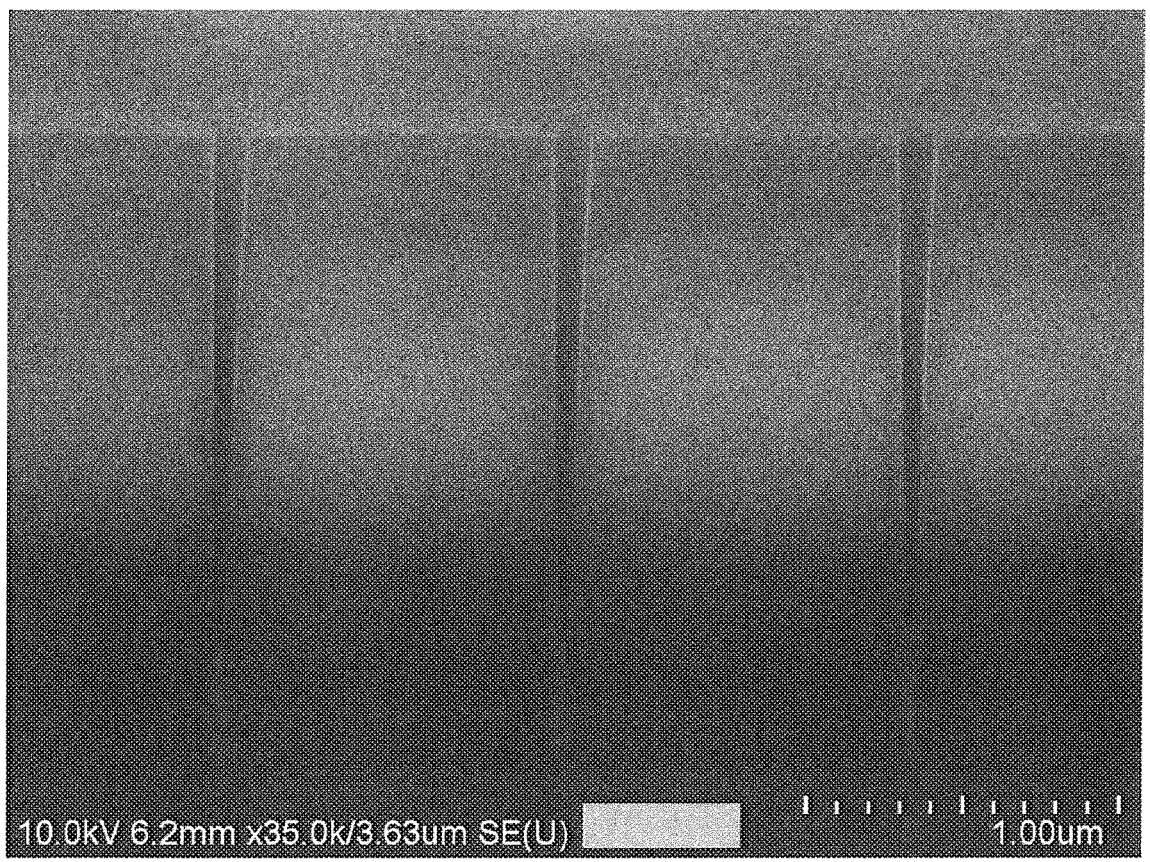
FIG. 13 provides an SEM image of entire lengths of respective features B4, B5, and B6 (from left to right), at 35 K magnification, tilted view, showing that a molybdenum film was deposited in a lower portion of the features.
Figure 14:
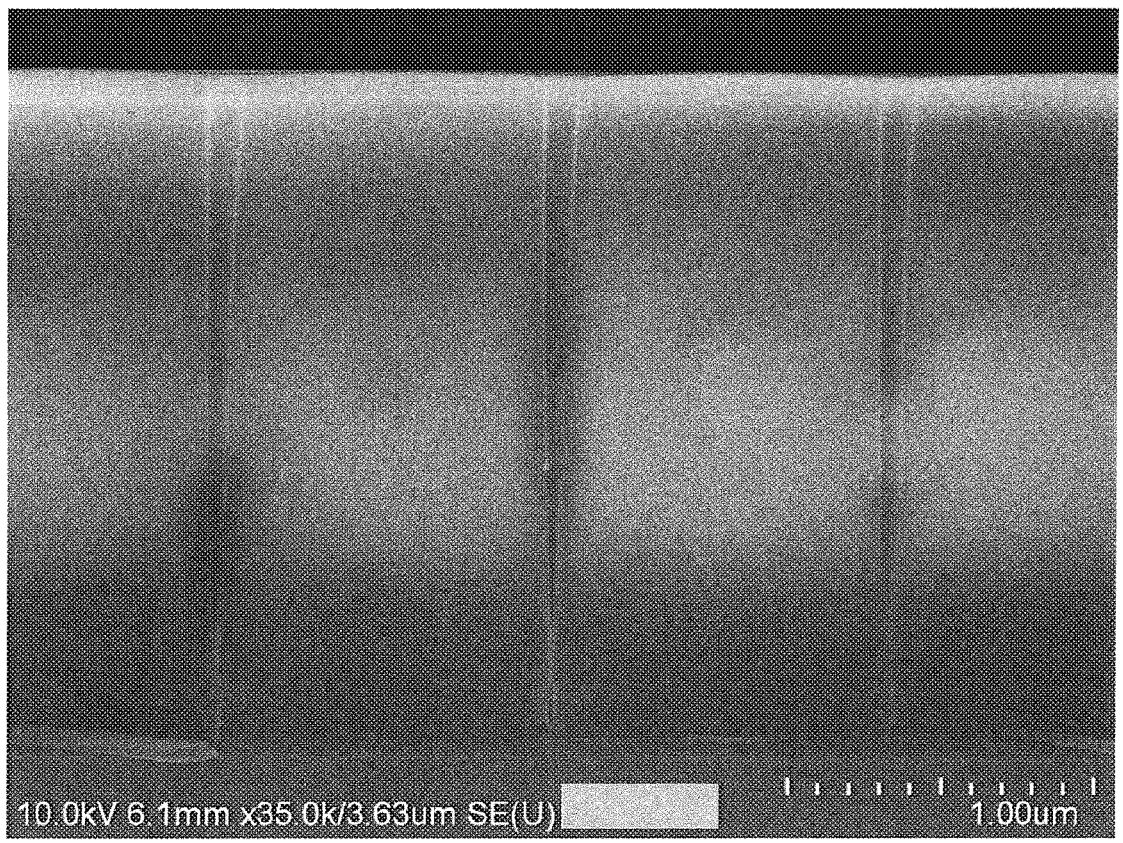
FIG. 14 provides an SEM image of entire lengths of respective features B7, B8, and B9 (from left to right), at 35 K magnification, perpendicular view, showing that a molybdenum film was deposited in a lower portion of the features.

FIG. 13 shows that a molybdenum film was deposited in a lower portion of respective features B4, B5, and B6 (from left to right) and FIG. 14 shows that a molybdenum film was deposited in a lower portion of respective features B7, B8, and B9 (from left to right). FIGS. 13 and 14 illustrate how the amount of molybdenum within a feature varies from an upper portion to a lower portion of the feature and shows a molybdenum film was deposited in approximately 15-20% of each of the features, as measured starting from the bottom of the respective features (i.e., in lower portion of feature).

Figure 15:
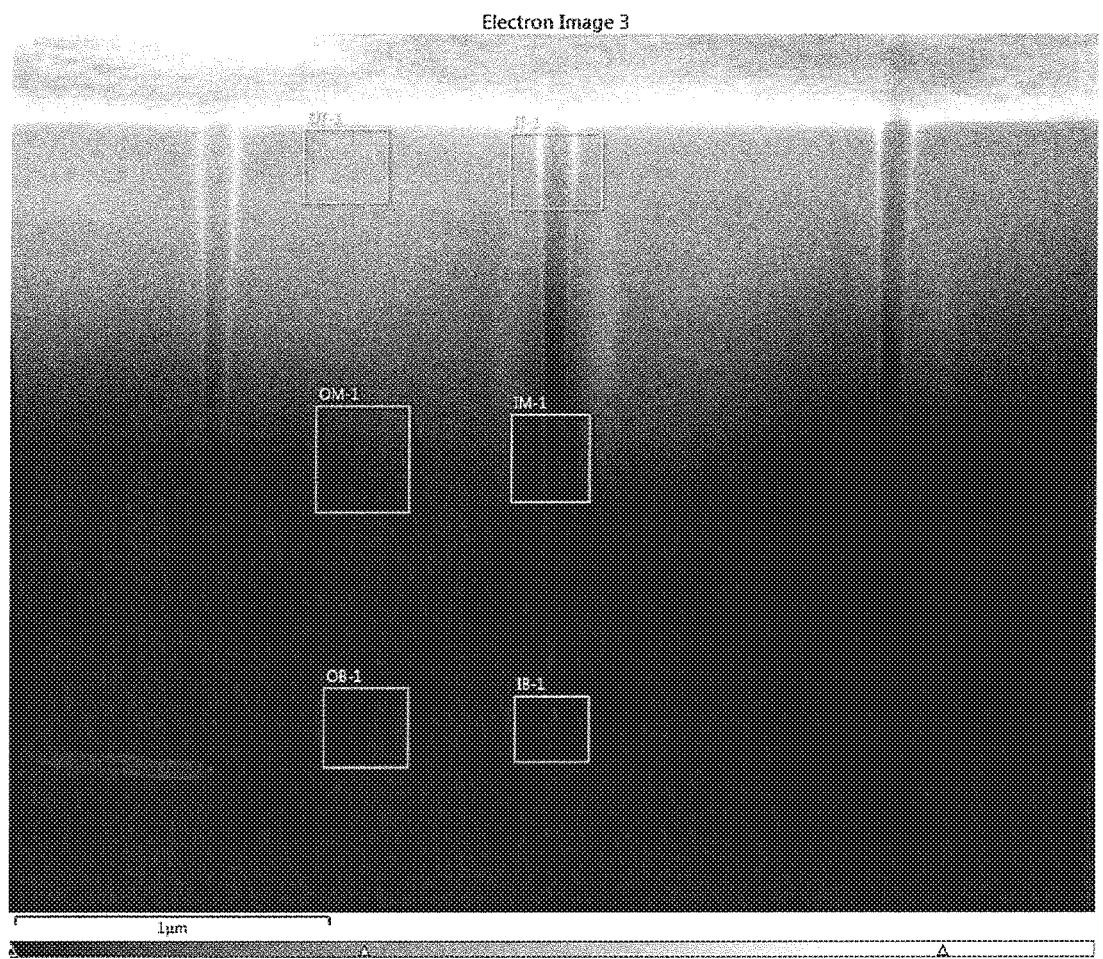
FIG. 15 provides an SEM micrograph showing six approximate locations where the amount of molybdenum was quantified by EDS inside and outside feature B10.

FIG. 15 illustrates six approximate locations where the amount of molybdenum was quantified by EDS. Three locations within a feature B10 (middle feature) were analyzed within an upper portion of the feature (IT-1), within a middle portion of the feature (IM-1), and within a lower portion of the feature (IB-1). For reference, an additional three locations were analyzed outside the feature B10, outside an upper portion of the feature (OT-1), outside a middle portion of the feature (OM-1), and a lower portion of the feature (OB-1).

Figure 16:
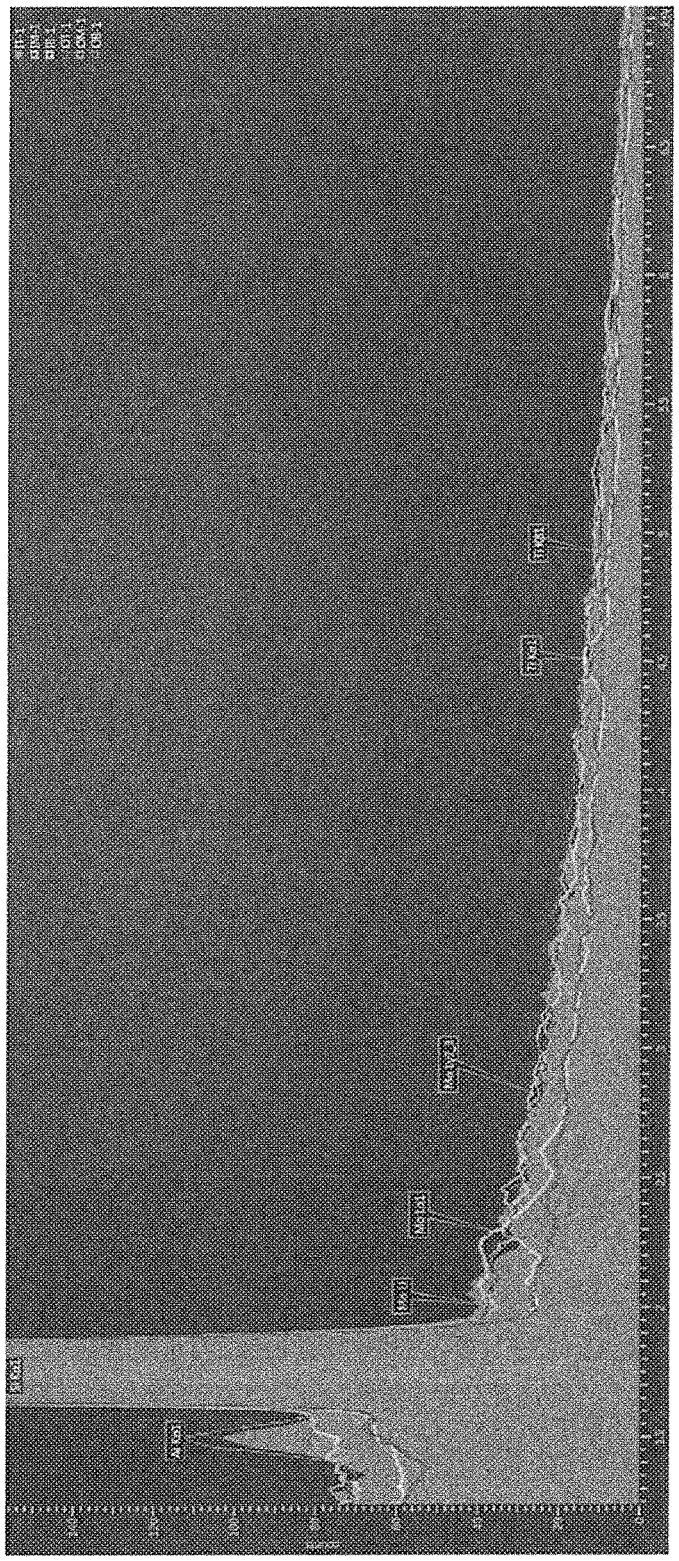
FIG. 16 illustrates the intensity of the EDS scans for the six approximate locations shown in FIG. 14.

FIG. 16 shows the intensity of the EDS scans for the six approximate locations indicated in FIG. 15. According to FIG. 16, within a lower portion (IB-1) of feature B10 shows the only un-ambiguous signal for molybdenum, which indicates that the only location where molybdenum was present was within a lower portion (IB-1) of the feature B10.

Figure 17:
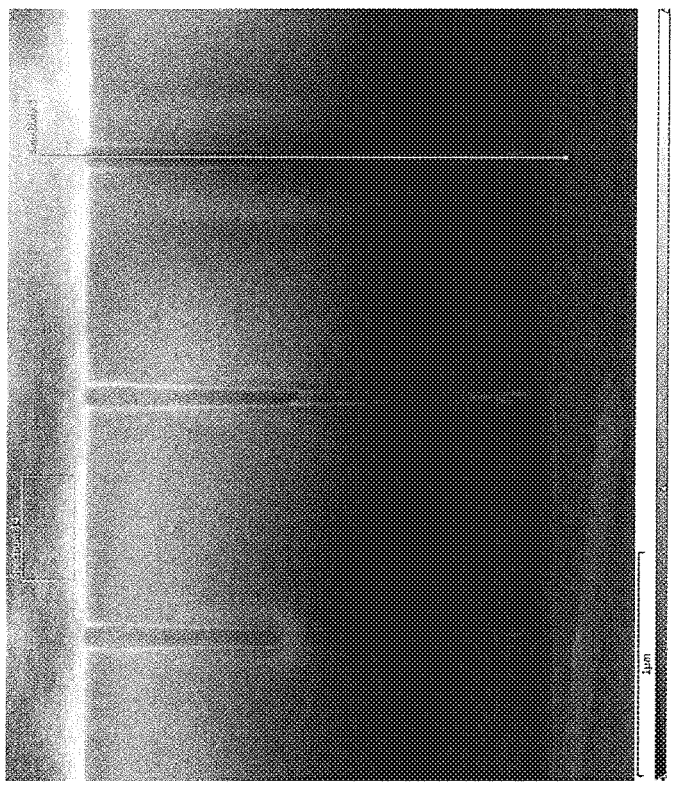
FIG. 17a is an SEM image showing the position of an EDS line scan in a feature B11 (right side feature)
FIG. 17b shows the EDS counts for the molybdenum intensity along the length of feature B11. The right side of the EDS intensity count in FIG. 17b corresponds to the top of feature B11, and the left side of the EDS intensity count corresponds to the bottom of feature B11.
Figure 17:
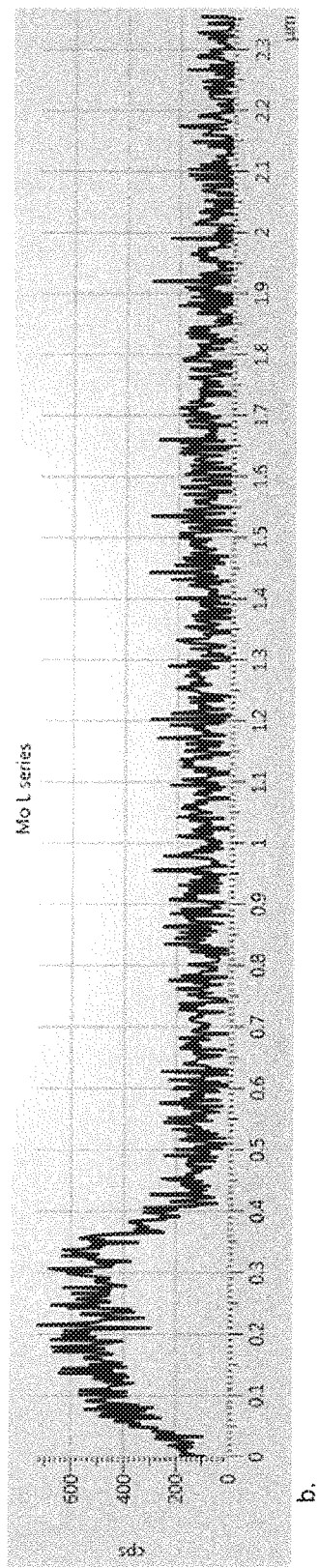

FIGS. 17a and 17b show the quantification of molybdenum (measured by EDS) as a function of position within a feature, which illustrates how the amount of molybdenum increased as the location became deeper within the feature. In particular, FIG. 17a is an SEM image showing the position of an EDS line scan in a feature B11 (right side feature), and FIG. 17b shows the EDS counts for the molybdenum intensity along the length of feature B11. The right side of the EDS intensity count in FIG. 17b corresponds to the top of feature B11, and the left side of the EDS intensity count corresponds to the bottom of feature B11. The concentration of molybdenum was high and constant for the lowest 0.4 m portion of the feature, which was consistent with super-conformal growth.

Figure 18:
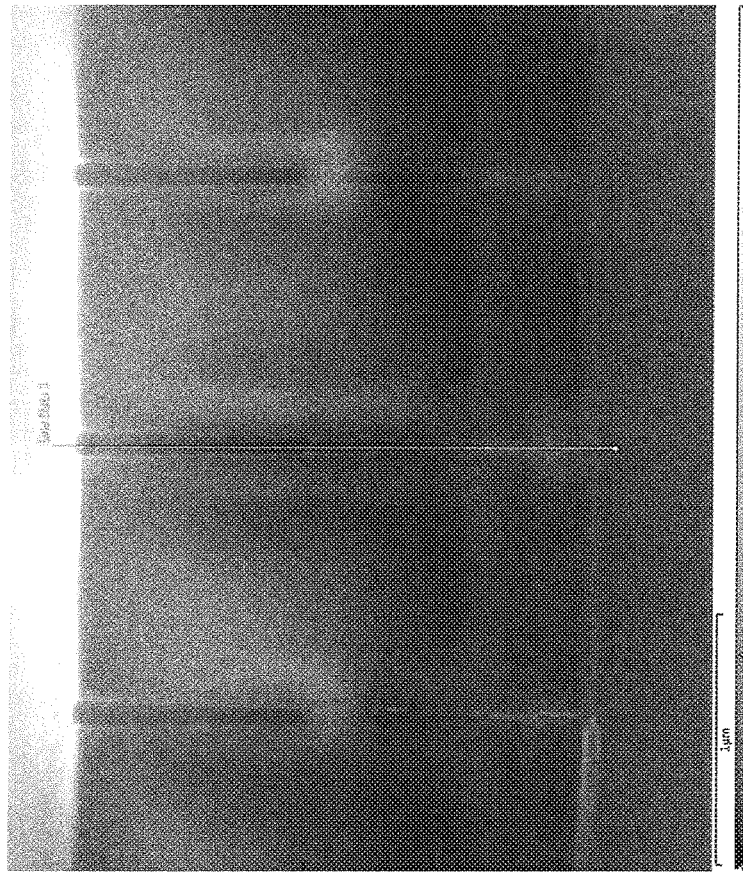
FIG. 18a is an SEM image showing the position of an EDS line scan in a feature B12 (middle feature)
FIG. 18b shows the EDS counts for the molybdenum intensity along the length of feature B12. The right side of the EDS intensity count in FIG. 18b corresponds to the top of feature B12, and the left side of the EDS intensity count corresponds to the bottom of feature B12.
Figure 18:
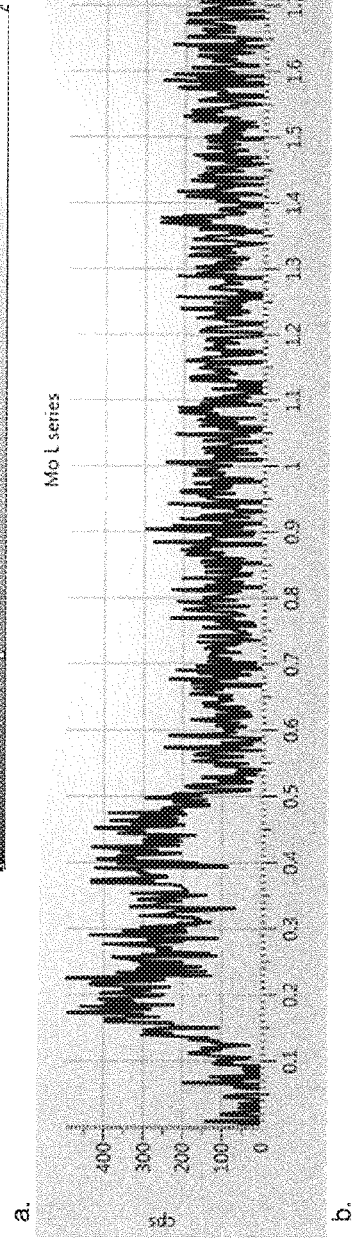

FIGS. 18a and 18b show the quantification of molybdenum (measured by EDS) as a function of the position within a feature, which illustrates how the amount of molybdenum increased with increased depth within the feature. In particular, FIG. 18a is an SEM image showing the position of an EDS line scan in a feature B12 (middle feature), and FIG. 18b shows the EDS counts for the molybdenum intensity along the length of feature B12. The right side of the EDS intensity count in FIG. 18b corresponds to the top of feature B12, and the left side of the EDS intensity count corresponds to the bottom of feature B12. The concentration of molybdenum was high and constant for the lowest 0.4 μm section of the second feature, which was consistent with super-conformal growth.

Example 1C: ALD Under Super-Conformal Growth Conditions III: Super-Conformal ALD Growth of Molybdenum Film ALD was performed over 700 cycles at 280° C. under super-conformal growth conditions as provided herein (referred to herein as "super-conformal growth conditions III"). Each cycle consisted of:
1. a 1-second exposure of $MoCl_5$ (delivered by vapor-draw, while held at 117° C. (corrected temperature), which resulted in a pressure spike of 0.012-0.015 Torr),
2. followed by a 20-second purge with 20 sccm of nitrogen,
3. a 3-second exposure of CHD (delivered by bubbling nitrogen in a CHD cylinder, which was heated to 50° C.),
4. followed by a 20-second purge with 20 sccm of nitrogen.

Only one zone was observed in the deposition reactor where no growth (or very little growth) was observed on the coupons serving as the substrate (etch/desorption was greater than deposition). A maximum thickness of 4.3 nm molybdenum (growth rate 0.062 Å/cycle) was measured on the coupons in the area where the patterned coupon was located. Elsewhere in the reactor, no thicker molybdenum film was measured. In no area of the reactor was a "true ALD" growth rate observed, which would be at least 0.1 Å/cycle confirmed by that nowhere else in the deposition chamber was a higher growth rate observed when it was confirmed that no CVD was occurring. Finally the backside of the coupons showed that some areas had up to 28.6 nm molybdenum (0.41 Å/cycle).

On the back-side of the coupons (which were on the substrate holder), desorption/etch was decreased because the amount of purge gas was minimized, and desorption/etch was more likely to lead to re-deposition. The same was expected to occur at the bottom of the features. SEM and EDS analysis confirmed that no molybdenum was detected on the flat surface of the patterned coupon and no molybdenum was detected in an upper portion of the features. Molybdenum was detected only in a lower portion of the features indicating that super-conformal growth occurred, where approximately 20-30% of the feature was filled, as measured starting from the bottom of the feature. SEM images were taken of various features after deposition as shown in FIGS. 19-22.

Figure 19:
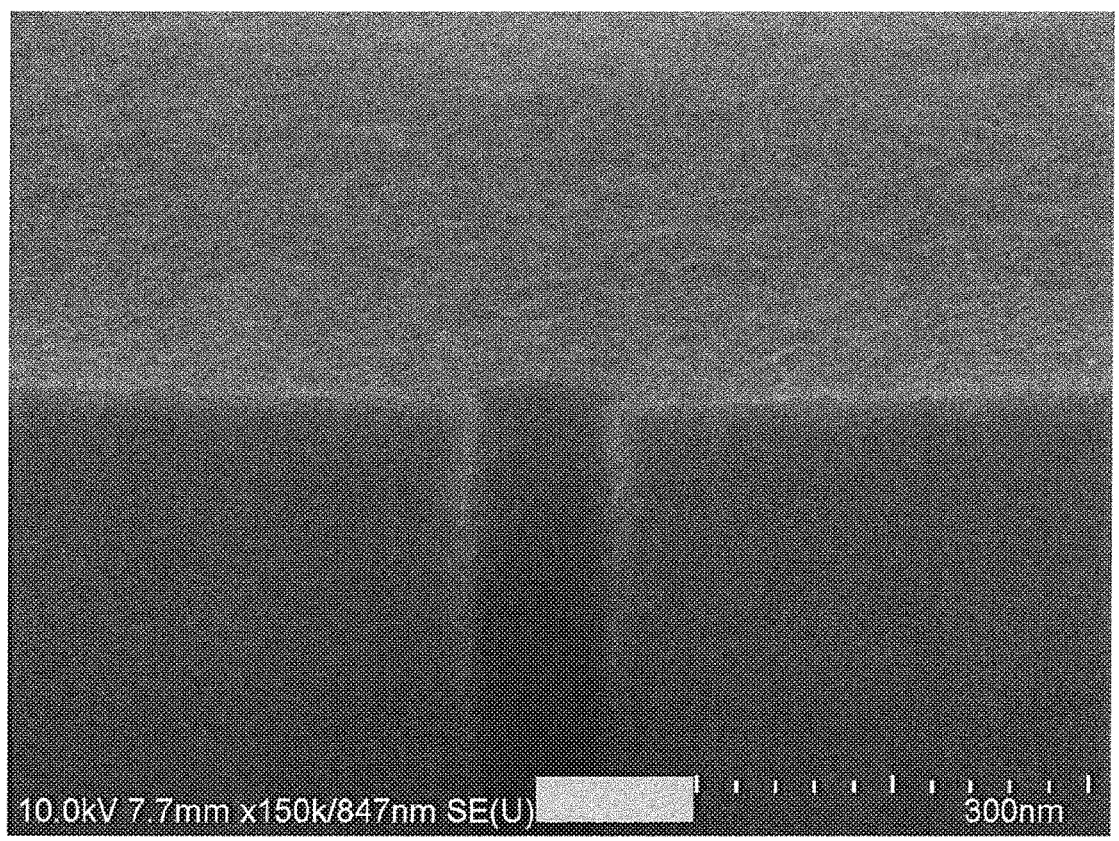
FIG. 19 provides an SEM image of a top portion of feature C1, at 150 K magnification, tilted view, showing that very little or no molybdenum was deposited at an upper portion of feature C1, and outside the feature C1.

FIG. 19 shows that very little or no molybdenum was deposited at an upper portion of a feature C1, and outside the feature C1, where etch/desorption was greater than deposition.

Figure 20:
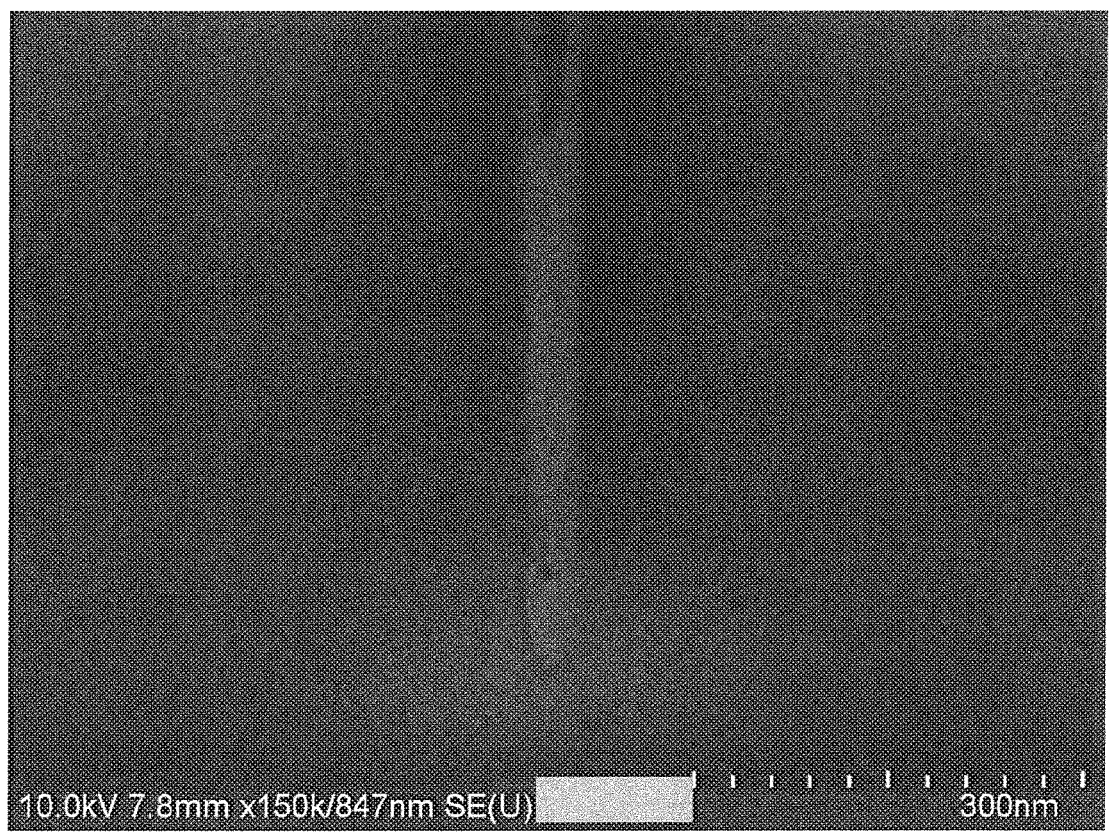
FIG. 20 provides an SEM image of a bottom portion of feature C2, at 150 K magnification, perpendicular view, showing that a thick molybdenum film was deposited in a lower portion of feature C2. This molybdenum film was not broken during sample cleave.

FIG. 20 shows that a thick molybdenum film was deposited in a lower portion of a feature C2, where deposition was greater than etch/desorption; this molybdenum film was not broken during sample cleave.

Figure 21:
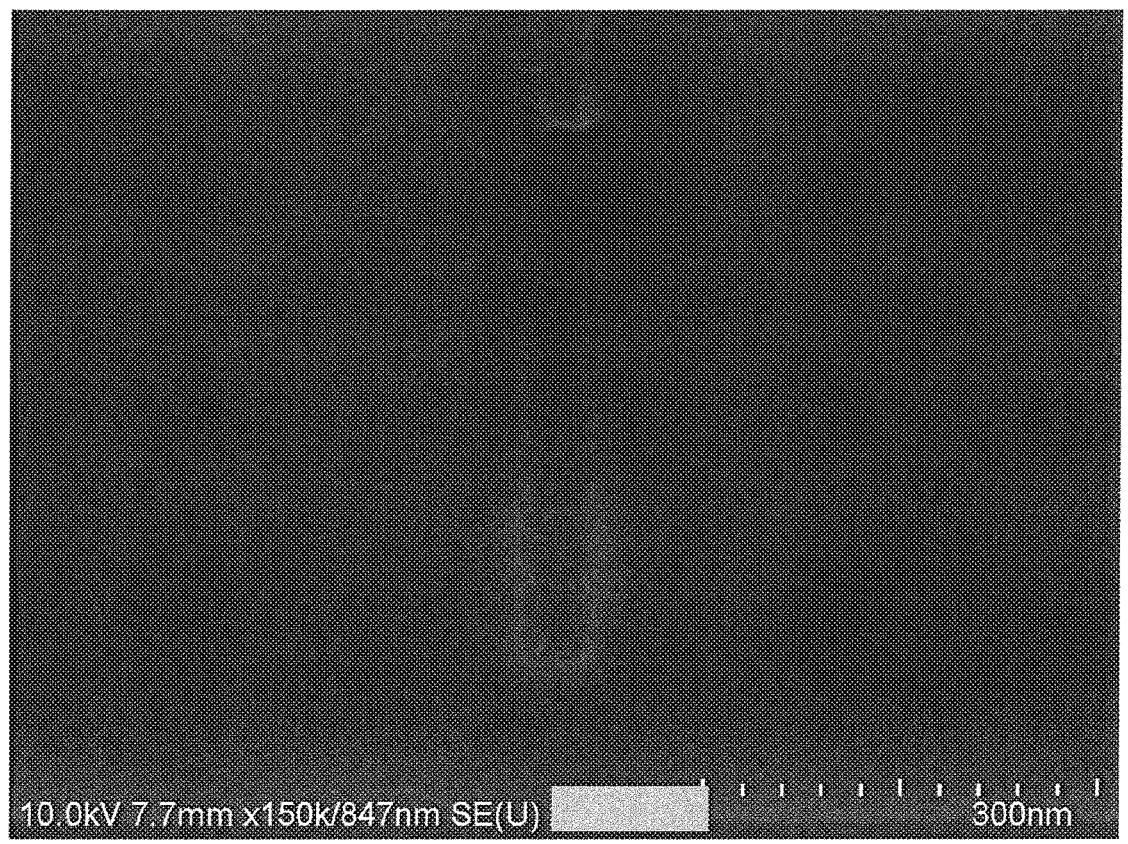
FIG. 21 provides an SEM image of a bottom portion of feature C3, at 150 K magnification, tilted view, showing that a thick molybdenum film was deposited in a lower portion of feature C3. This molybdenum film was broken during sample cleave.

FIG. 21 shows that a thick molybdenum film was deposited in a lower portion of a feature C3, where deposition was greater than etch/desorption; this molybdenum film was broken during sample cleave.

Figure 22:
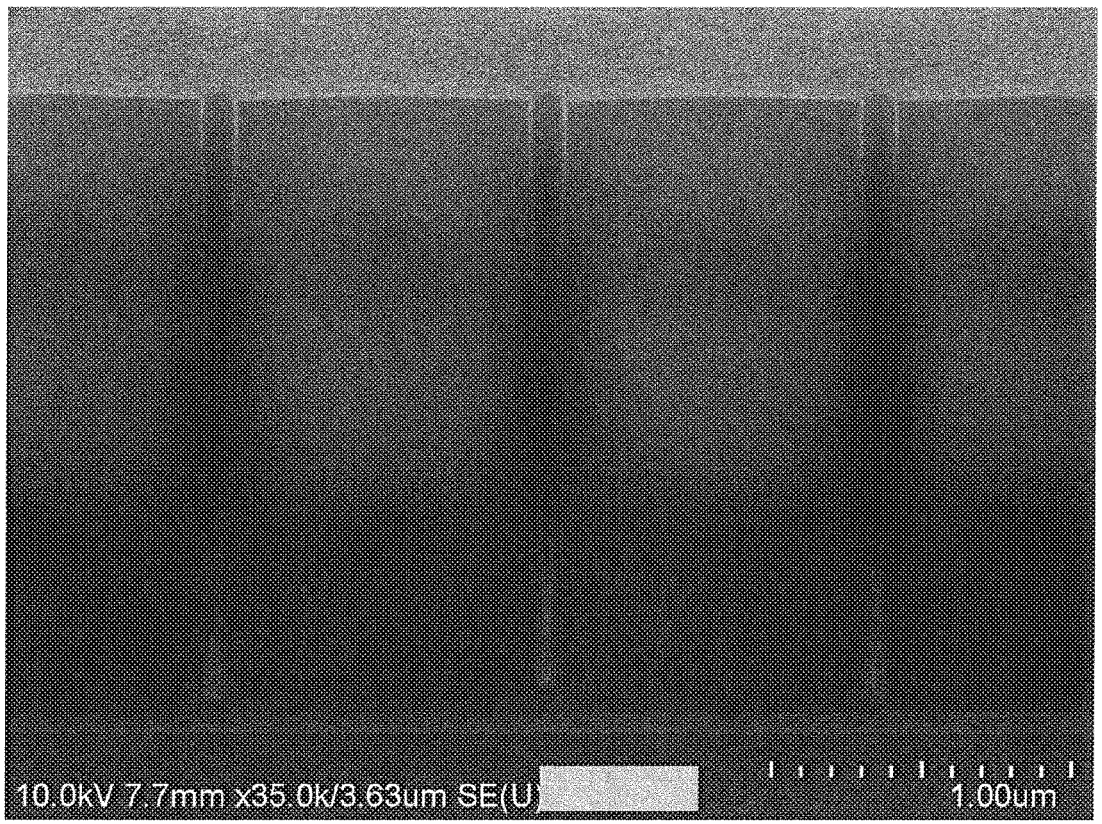
FIG. 22 provides an SEM image of entire lengths of respective features C4, C5, and C6 (from left to right), at 35 K magnification, tilted view, showing that a molybdenum film was deposited in a lower portion of the features.

FIG. 22 shows that a molybdenum film was deposited in a lower portion of features C4, C5, and C6 (from left to right). FIG. 22 illustrates how the amount of molybdenum within a feature varies from an upper portion to a lower portion of the feature and that a thick molybdenum film was deposited approximately in 25% of each of the features as measured starting from the bottom of the feature, (i.e., in lower portion of feature).

Figure 23:
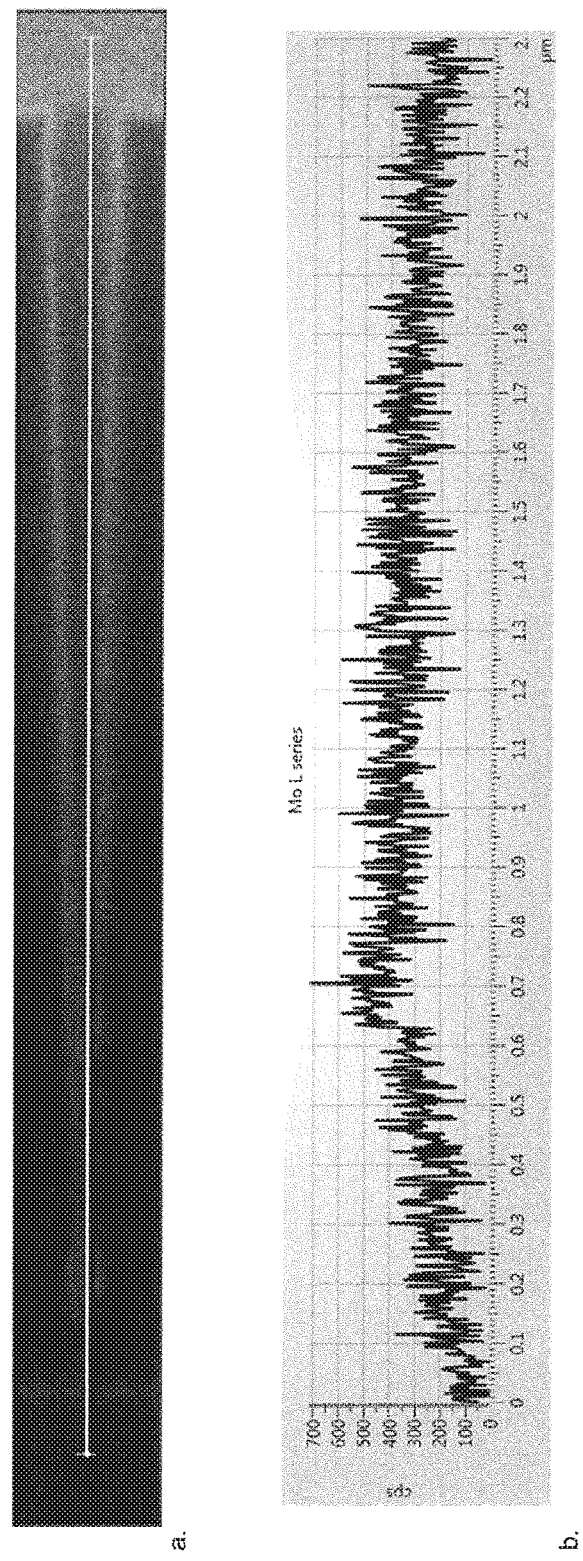
FIG. 23a is an SEM image showing the position of an EDS line scan in a feature C7.
FIG. 23b shows the EDS counts for the molybdenum intensity along the length of feature C7. The right side of the EDS intensity count in FIG. 23b corresponds to the top of feature C7, and the left side of the EDS intensity count corresponds to the bottom of feature C7.

FIGS. 23a and 23b show quantification of molybdenum (measured by EDS) as a function of the position within the feature, which illustrates how the amount of molybdenum increased with increased depth within the feature. In particular, FIG. 23a is an SEM image showing the position of an EDS line scan in a feature C7, and FIG. 23b shows the EDS counts for the molybdenum intensity along the length of feature C7. The right side of the EDS intensity count in FIG. 23b corresponds to the top of feature C7, and the left side of the EDS intensity count corresponds to the bottom of feature C7. The concentration of molybdenum was lower for the bottom 0.35 m of the feature because the lowest part of the molybdenum film was broken off during the sample cleave.

Figure 24:
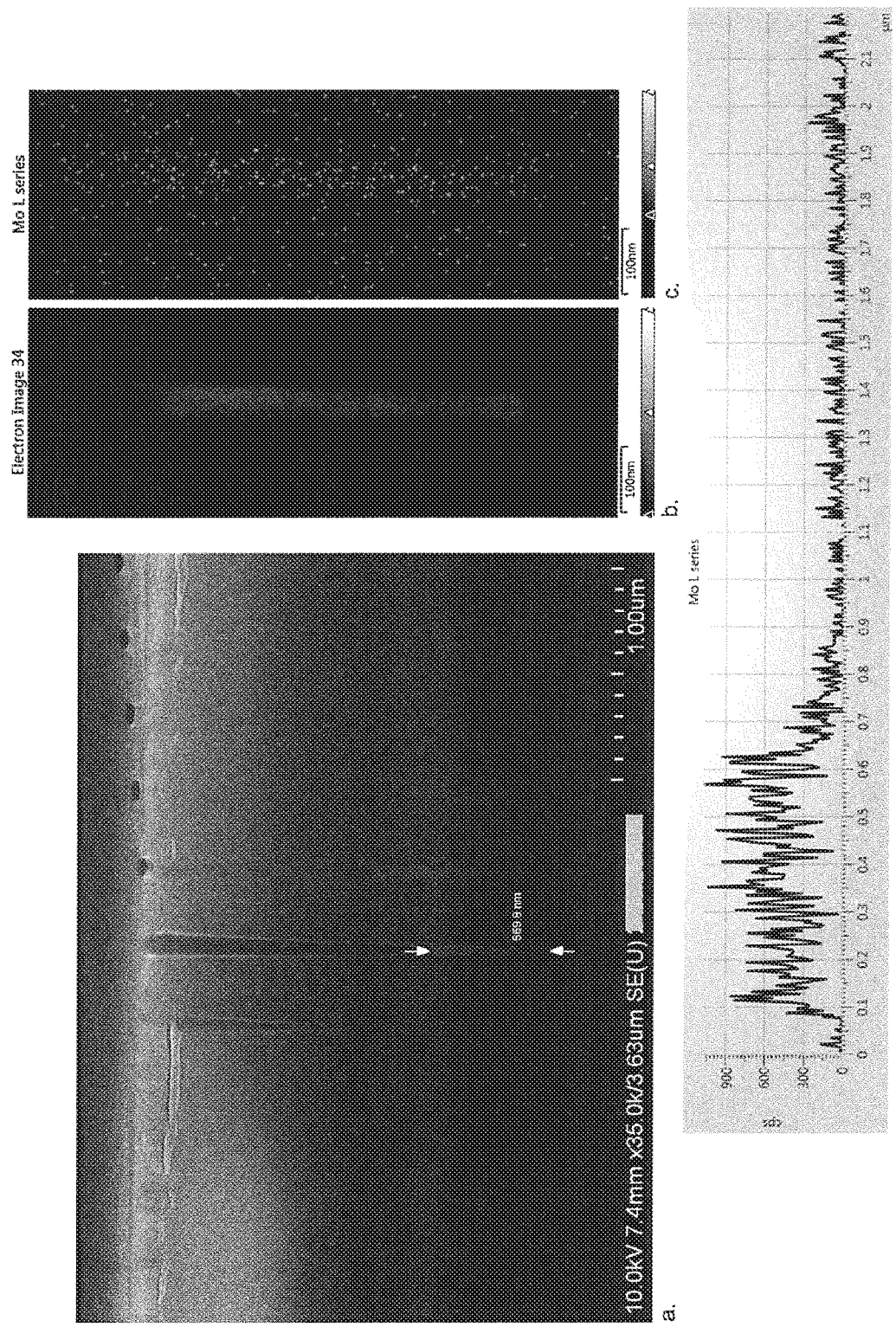
FIG. 24a is an SEM image of an entire length of feature C8 (feature with arrows), at 35 K magnification, tilted view, to illustrate the position where the EDS counts for molybdenum intensity (insert, left side) was measured along feature C8.
FIG. 24b is shows a magnification (at 150 K magnification) of the SEM image in FIG. 24a illustrating the area of molybdenum at the bottom of the feature C8.
FIG. 24c is the quantification of molybdenum (measured by EDS, data collected at 15 keV) within the area of feature C8 shown in FIG. 24b.
FIG. 24d shows the EDS counts for the molybdenum intensity along the length of feature C8. The right side of the EDS intensity count in FIG. 24d corresponds to the top of feature C8 and the left side of the EDS intensity count in FIG. 24d corresponds to the bottom of feature C8.

FIG. 24a shows that a molybdenum film was deposited in a lower portion of feature C8. FIG. 24a illustrate how the amount of molybdenum within a feature varies from an upper portion to a lower portion of the feature and shows a molybdenum film was deposited in approximately the bottom 25-40% of the feature C8, as measured starting from the bottom of the feature, (i.e., in lower portion of feature). Additionally, FIG. 24b shows a magnification of the SEM image in FIG. 24a illustrating the area of molybdenum at the bottom of the feature C8. FIG. 24c is the quantification of molybdenum (measured by EDS, data collected at 15 keV) within the area of feature C8 shown in FIG. 24b. FIG. 24d shows the EDS counts for the molybdenum intensity along the length of feature C8. Three additional features were similarly analyzed and the analysis confirmed (data not shown) that the height at which molybdenum was deposited within features was constant from feature to feature.

Example 1D: ALD Under Super-Conformal Growth Conditions IV: Super-Conformal ALD Growth of Molybdenum Film ALD was performed over 300 cycles at 295° C. under super-conformal growth conditions as provided herein (referred to herein as "super-conformal growth conditions IV"). Each cycle consisted of:
1. a 1-second exposure of $MoCl_5$ (delivered by vapor-draw, while held at 117° C. (corrected temperature), which resulted in a pressure spike of 0.011-0.016 Torr), 2. followed by a 10-second purge with 20 sccm of nitrogen,
3. a 3-second exposure of CHD (delivered by bubbling nitrogen in a CHD cylinder, which was heated to 50° C.),
4. followed by a 10-second purge with 20 sccm of nitrogen.

Only one zone was observed in the deposition reactor where no growth (or very little growth) was observed the coupons serving as the substrate (etch/desorption was greater than deposition). A maximum thickness of 0.9 nm molybdenum (growth rate 0.029 Å/cycle) was measured on the coupons in the area where the patterned coupon was located. Elsewhere in the reactor, no thicker molybdenum film was measured (except at the very edge, near the reactor outlet, where approximately 10 nm was measured on a small area). In no area of the reactor was a "true ALD" growth rate observed, which would be at least 0.1 Å/cycle confirmed by that nowhere else in the deposition chamber was a higher growth rate observed when it was confirmed that no CVD was occurring. Finally the backside of the coupons showed that some areas had up to 15.7 nm molybdenum (0.52 Å/cycle).

On the back-side of the coupons (which were on the substrate holder), desorption/etch was decreased because the amount of purge gas was minimized, and desorption/etch was more likely to lead to re-deposition. The same was expected to occur at the bottom of the features. SEM and EDS analysis confirmed that no molybdenum was detected on the flat surface of the patterned coupon and no molybdenum was detected in an upper portion of the features. Molybdenum was detected only in a lower portion of the features indicating that super-conformal growth occurred, where approximately 50-65% of the feature was filled, as measured starting from the bottom of the feature. SEM images were taken of various features after deposition as shown in FIGS. 25-28.

Figure 25:
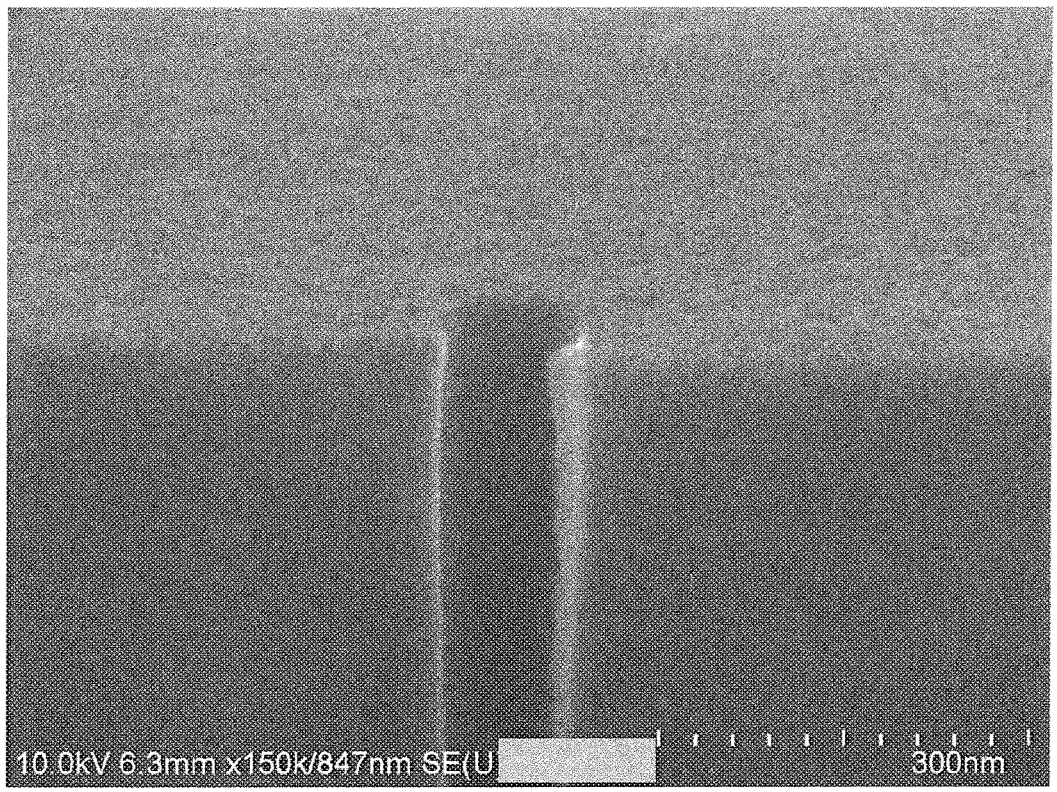
FIG. 25 provides an SEM image of a top portion of feature D1, at 150 K magnification, tilted view, showing that very little or no molybdenum was deposited at an upper portion of feature D1 and outside the feature D1.

FIG. 25 shows that very little or no molybdenum was deposited at an upper portion of a feature D1, and outside the feature D1, where etch/desorption was greater than deposition.

Figure 26:
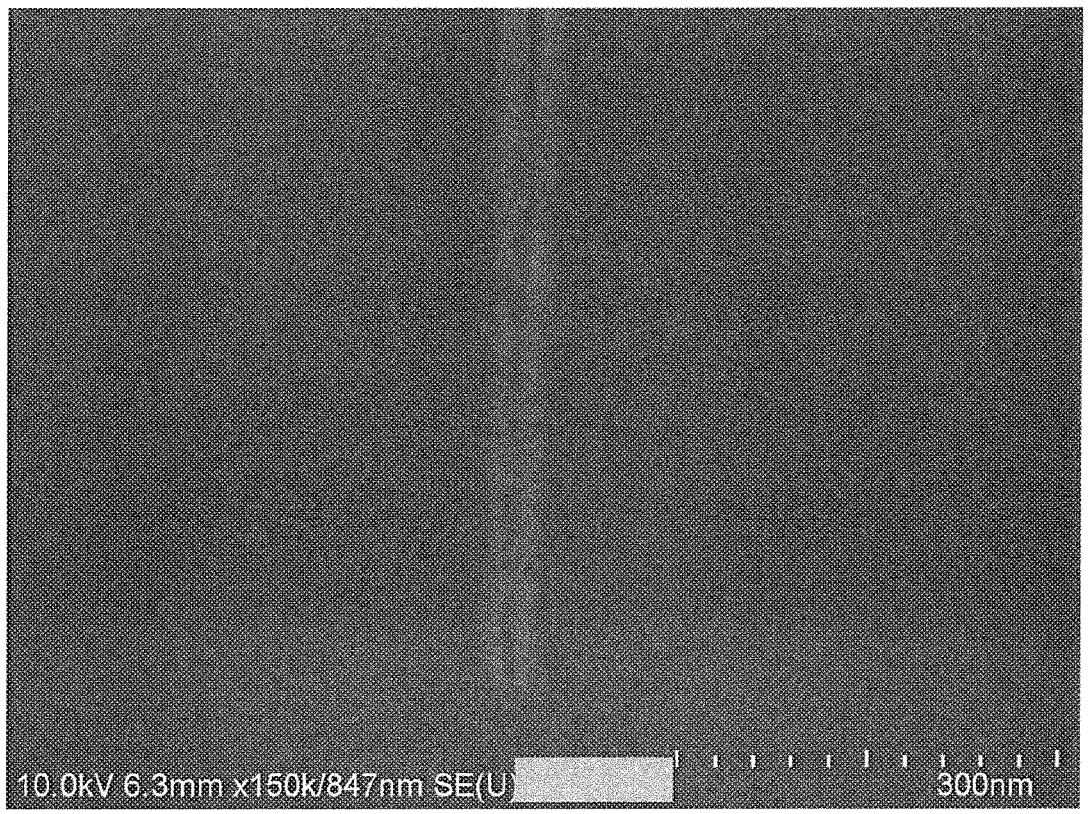
FIG. 26 provides an SEM image of a bottom portion of feature D2, at 150 K magnification, tilted view, showing that a thick molybdenum film was deposited in a lower portion of feature D2.

FIG. 26 shows that a thick molybdenum film was deposited in a lower portion of a feature D2, where deposition was greater than etch/desorption; this molybdenum film was not broken during sample cleave.

Figure 27:
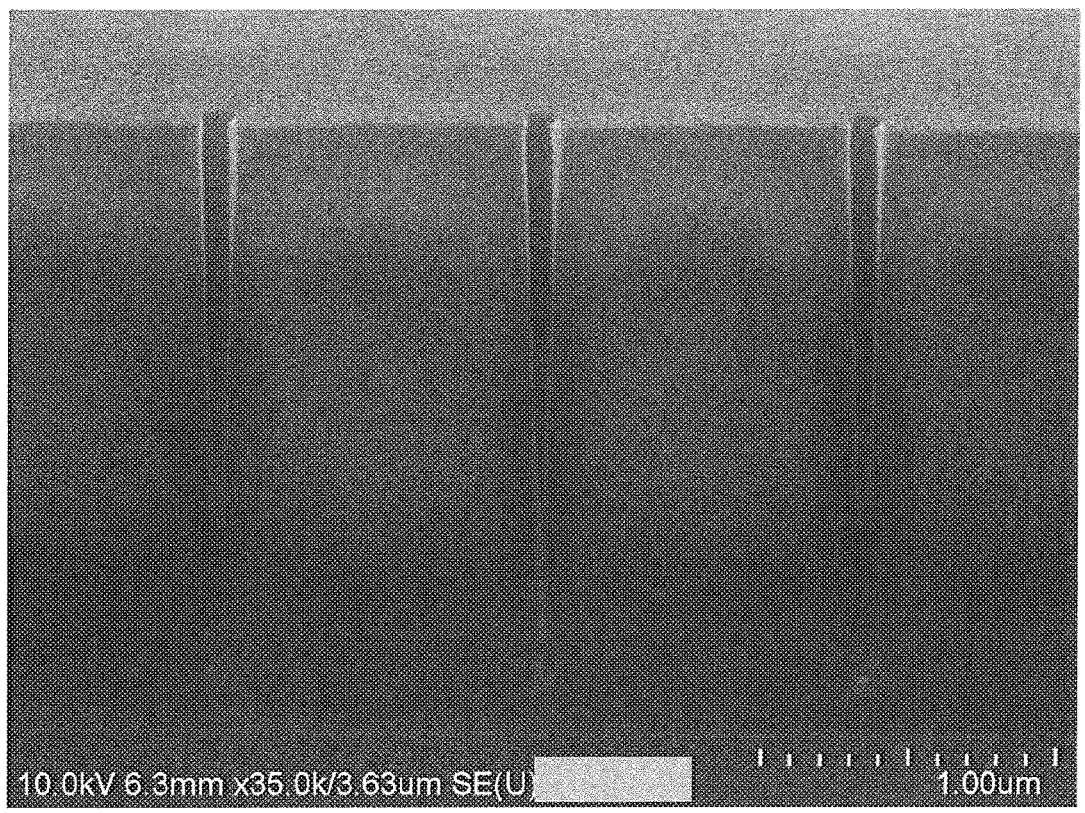
FIG. 27 provides an SEM image of entire lengths of respective features D3, D4, and D5 (from left to right), at 35 K magnification, tilted view, showing how the amount of molybdenum within a feature varies from an upper portion to a lower portion of the feature.

FIG. 27 shows that a molybdenum film was deposited in a lower portion of features D3, D4, and D5 (from left to right). FIG. 27 illustrates how the amount of molybdenum within a feature varies from an upper portion to a lower portion of the feature and that a molybdenum film was deposited in approximately 50-65% of each of the features, as measured starting from the bottom of the feature, (i.e., in lower portion of feature). Additionally, FIG. 27 shows that the molybdenum film can be sheared off during the cleave (features D3 and D5) or the molybdenum film can be un-sheared and clearly visible all the way to the bottom of the feature D4.

Figure 28:
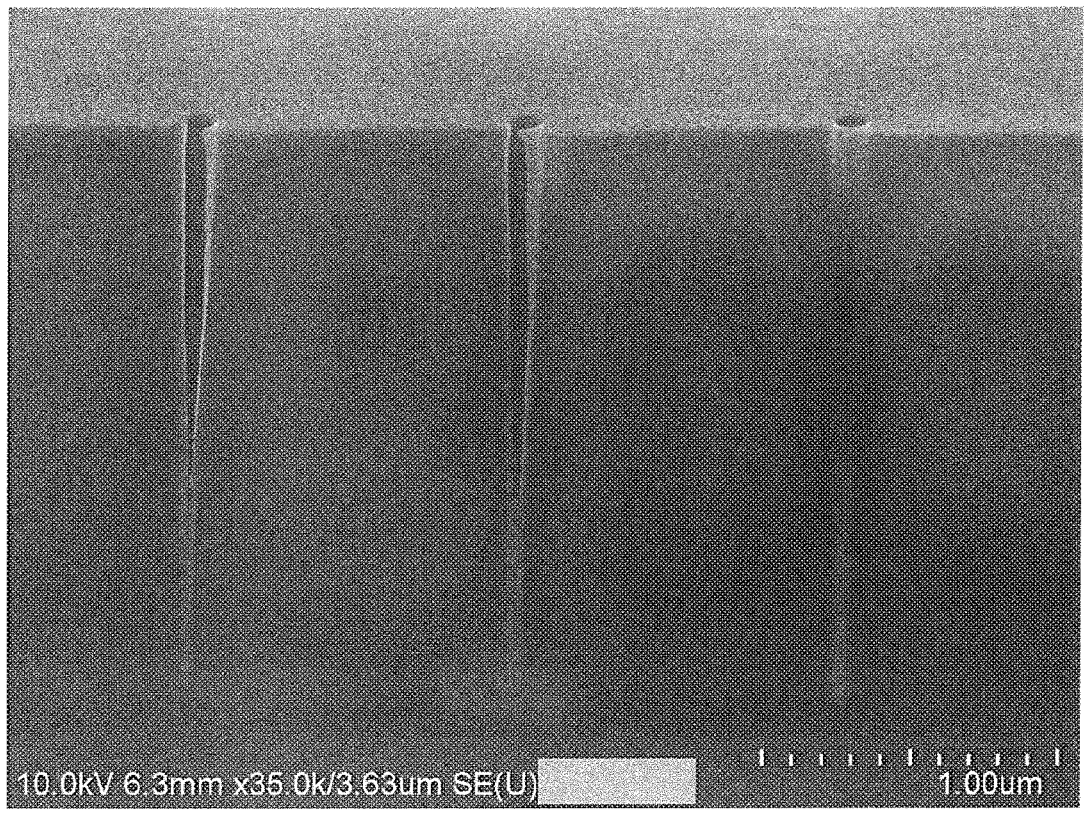
FIG. 28 provides an SEM image of entire lengths of respective features D6, D7, and D8 (from left to right), at 35 K magnification, tilted view, showing how the amount of molybdenum within a feature varies from an upper portion to a lower portion of the feature.

FIG. 28 shows that a molybdenum film was deposited in a lower portion of features D6, D7, and D8 (from left to right). FIG. 28 illustrates how the amount of molybdenum within a feature varies from an upper portion to a lower portion of the feature and that a molybdenum film was deposited in approximately 50-65% of each of the features, as measured starting from the bottom of the feature. Additionally, in FIG. 28 no molybdenum film was sheared off during the cleave.

Figure 29:
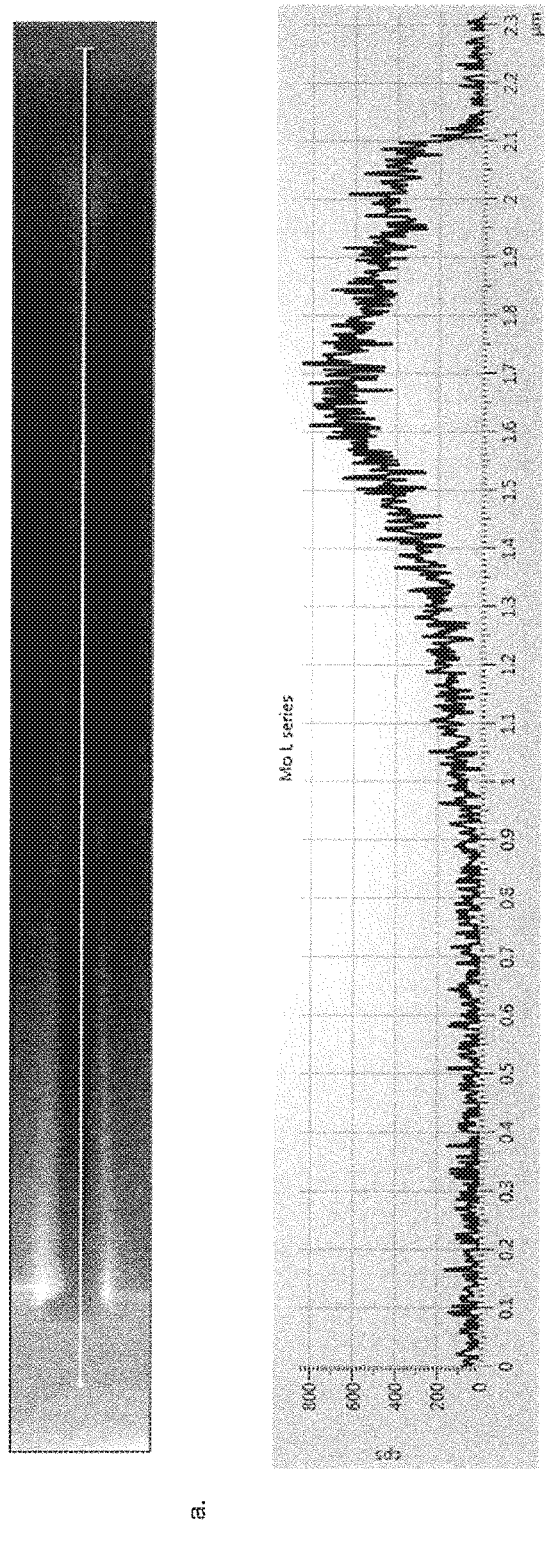
FIG. 29a is an SEM image showing the position of an EDS line scan in a feature D9.
FIG. 29b shows the EDS counts for the molybdenum intensity along the length of feature D9. The right side of the EDS intensity count in FIG. 29b corresponds to the bottom of feature D9, and the left side of the EDS intensity count corresponds to the top of feature D9.

FIGS. 29a and 29b show the quantification of molybdenum (measured by EDS) as a function of the position within a feature, which illustrates how the amount of molybdenum increased with increased depth within the feature. In particular, FIG. 29a is an SEM image showing the position of an EDS line scan in a feature D9, and FIG. 29b shows the EDS counts for the molybdenum intensity along the length of feature D9. The right side of the EDS intensity count in FIG. 29b corresponds to the bottom of feature D9, and the left side of the EDS intensity count corresponds to the top of feature D9. For this specific feature, the molybdenum film was un-broken in a lower portion of the feature D9, and the EDS showed high Mo concentration for the lower 30% of the feature D9. The film may have been partially sheared off in an middle and/or upper portion of the feature D9.

Figure 30:
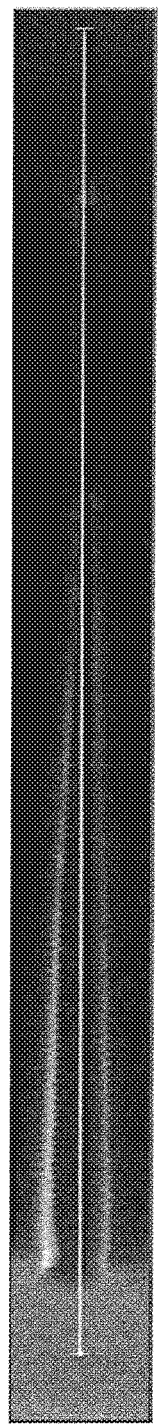
FIG. 30a is an SEM image showing the position of an EDS line scan in a feature D10.
FIG. 30b shows the EDS counts for the molybdenum intensity along the length of feature D10. The right side of the EDS intensity count in FIG. 30b corresponds to the bottom of feature D10, and the left side of the EDS intensity count corresponds to the top of feature D10.
Figure 30:
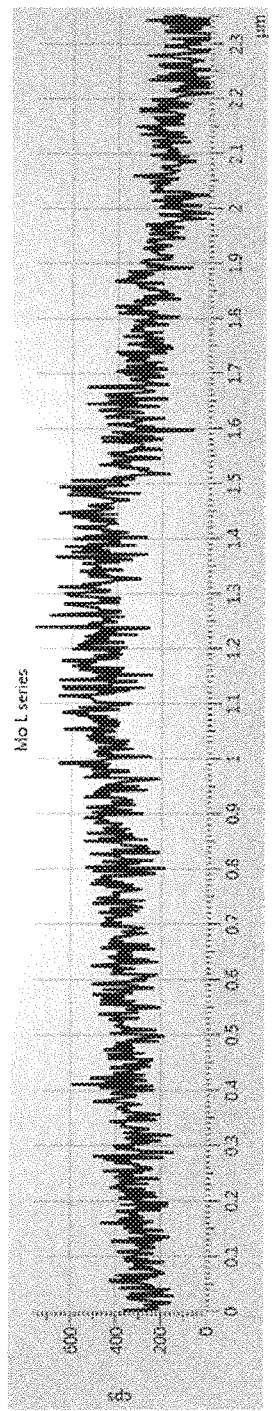
Figure 31:
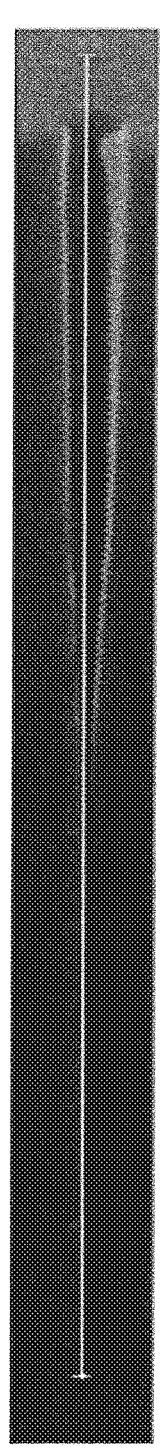
FIG. 31a is an SEM image showing the position of an EDS line scan in a feature D1.
FIG. 31b shows the EDS counts for the molybdenum intensity along the length of feature D11. The right side of the EDS intensity count in FIG. 31b corresponds to the top of feature D11, and the left side of the EDS intensity count corresponds to the bottom of feature D11.
Figure 31:
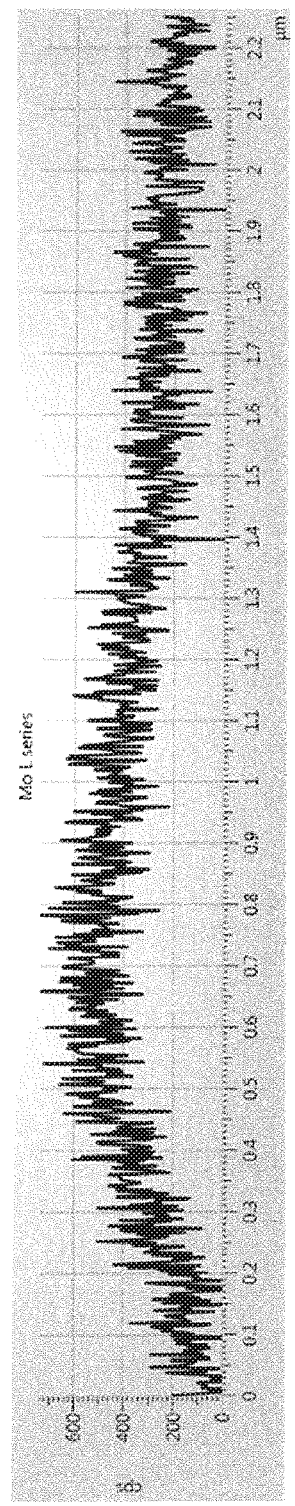
Figure 32:
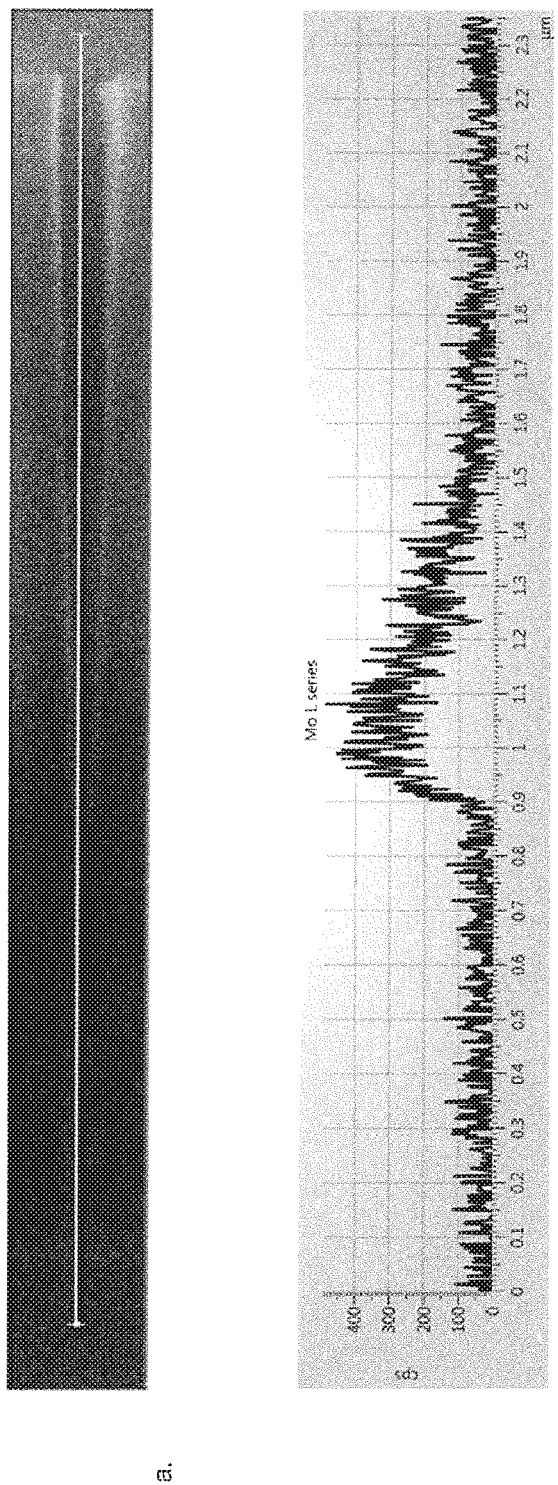
FIG. 32a is an SEM image showing the position of an EDS line scan in a feature D12.
FIG. 32b shows the EDS counts for the molybdenum intensity along the length of feature D12. The right side of the EDS intensity count in FIG. 32b corresponds to the top of feature D12, and the left side of the EDS intensity count corresponds to the bottom of feature D12.

FIGS. 30a, 30b, 31a, 31b, 32a, and 32b show the quantification of molybdenum (measured by EDS) as a function of the position within a feature, which illustrates how the amount of molybdenum increased with increased depth within the feature. In particular, FIGS. 30a, 31a, and 32a are SEM images showing the position of an EDS line scan in a feature D10, D11, and D12, respectively. FIGS. 30b, 31b, and 32b show the EDS counts for the molybdenum intensity along the length of features D10, D11, and D12, respectively. For each of these respective features, the molybdenum film was broken-off in the lowest section of the features (at different heights), and the EDS showed higher Mo concentration for the bottom 50-60% of the feature.

Figure 33:
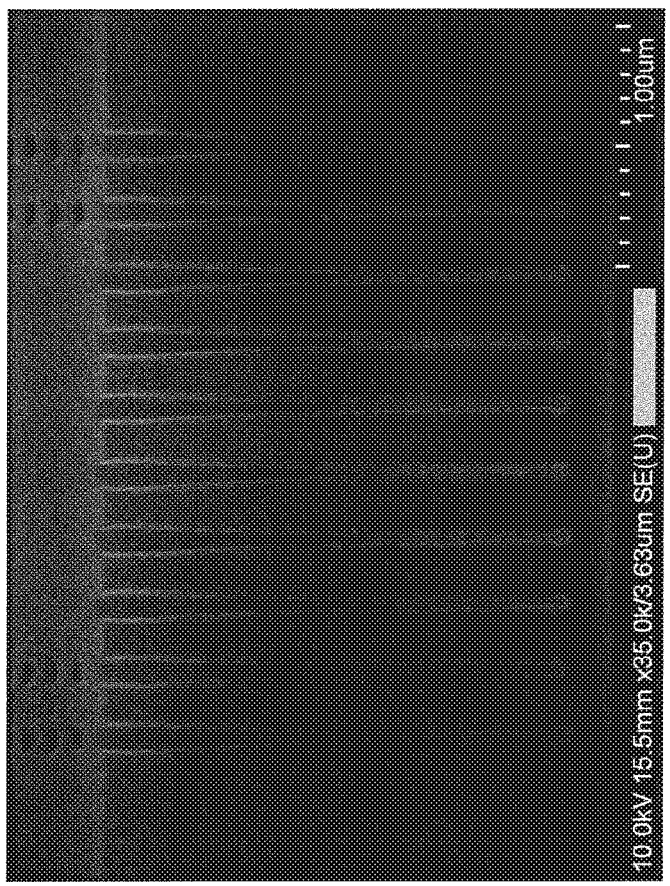
FIG. 33a provides an SEM image of entire lengths of respective features D13, D14, D15, D16, D17, D18, D19, D20, D21 and D22 (from left to right), at 35 K magnification, tilted view, showing that a molybdenum film was deposited in a lower portion of the features.
FIGS. 33b, 33c, and 33d show the quantification of molybdenum (measured by EDS, data collected at 15 keV) as a function of the position within representative features, respectively, which illustrates how the molybdenum was only present in the lower section of the features.
Figure 33:
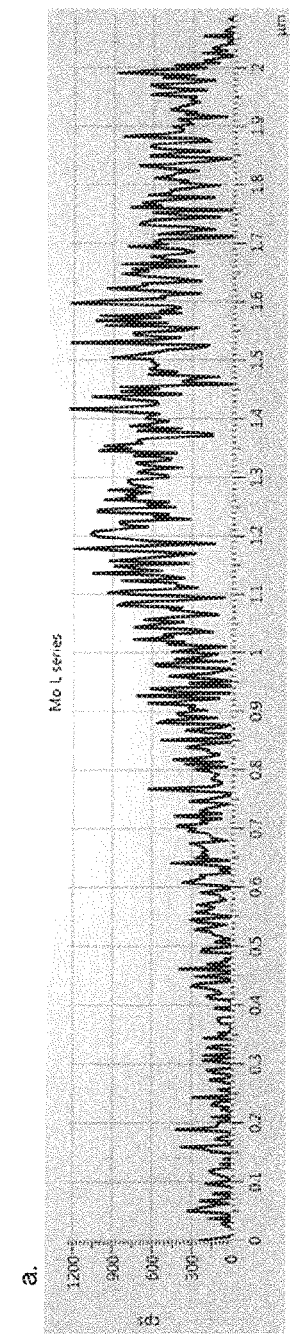
Figure 33:
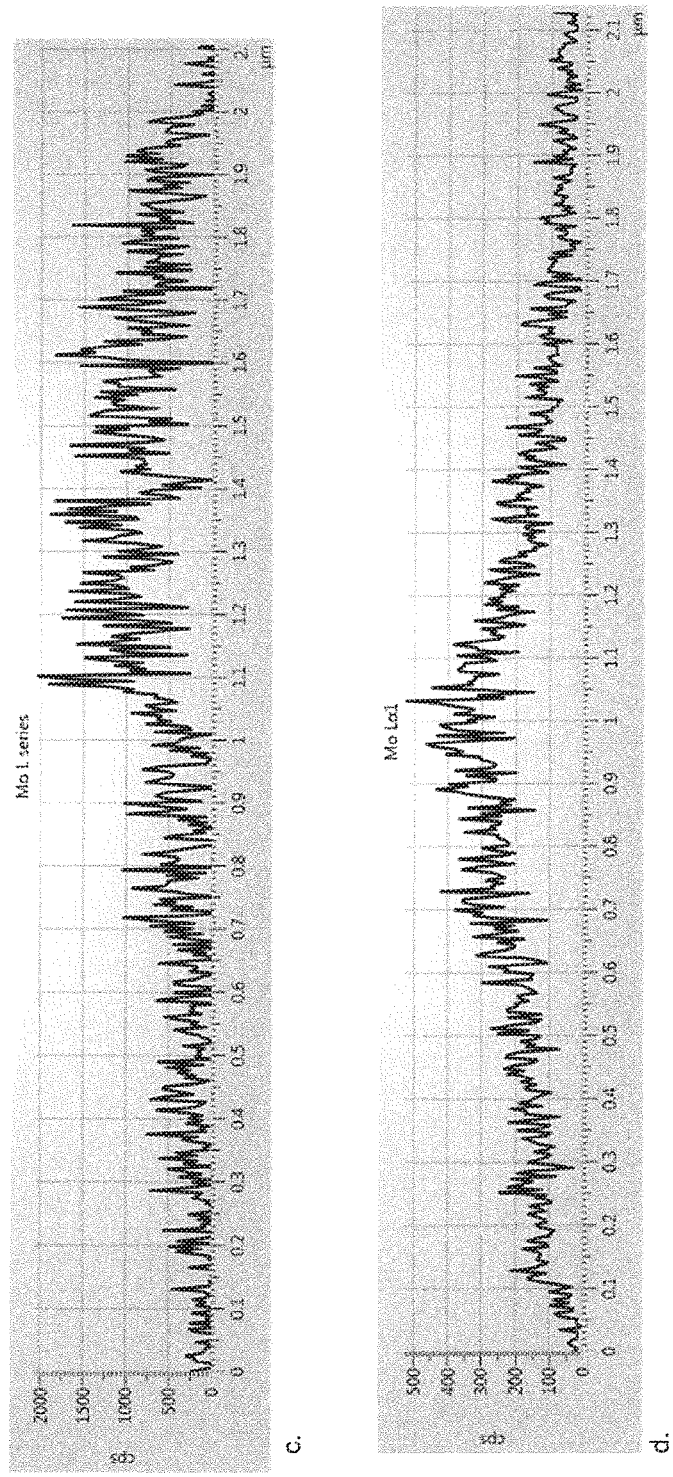

FIG. 33a illustrates how the amount of molybdenum within a feature varies from an upper portion to a lower portion of the feature and shows a molybdenum film was deposited in approximately 50-65% of the feature, as measured starting from the bottom of the feature, (i.e., in lower portion of feature). In particular, FIG. 33a is an SEM image showing a molybdenum film deposited in ten features, features D13, D14, D15, D16, D17, D18, D19, D20, D21 and D22 (from left to right). Additionally, FIG. 33a shows that the depth at which molybdenum begins to be deposited within features is comparable from feature to feature. FIGS. 33b, 33c, and 33d show the quantification of molybdenum (measured by EDS, data collected at 15 keV) as a function of the position within representative features. This illustrates how the depth at which molybdenum begins to be deposited within features is comparable from feature to feature.

Figure 34:
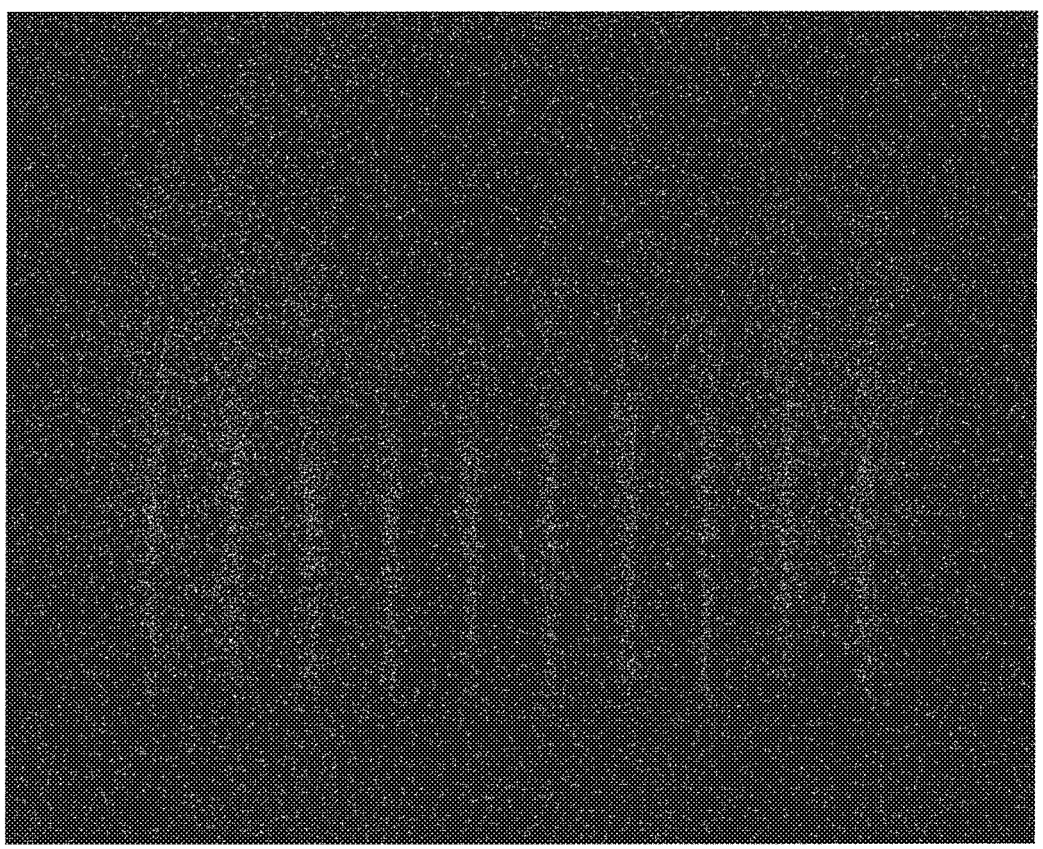

FIG. 34 shows the quantification of molybdenum (measured by EDS, data collected at 15 keV) as a function of the position over a map covering the same ten features in FIG. 33a. This illustrates how the depth at which molybdenum begins to be deposited within features is comparable from feature to feature.

Example 1E: ALD Under Conformal Growth Conditions V: Conformal ALD Growth of Molybdenum Film ALD was performed over the course of 400 cycles at 275° C. under conformal growth conditions as provided herein (referred to herein as "conformal growth conditions V"). Each cycle consisted of:
1. a 1-second exposure of MoCl$_5$ (delivered by vapor-draw, while held at 117° C. (un-corrected temperature), which resulted in a pressure spike of 0.006-0.008 Torr),
2. followed by a 10-second purge with 20 sccm of nitrogen,
3. a 3-second exposure of CHD (delivered by bubbling nitrogen in the CHD cylinder, which was heated to 50° C.), 4. followed by a 10-second purge by 20 sccm of nitrogen.

Two zones were seen in the deposition reactor: one where no growth was observed on the coupons serving as the substrate (etch/desorption was greater than deposition), and one where growth was observed on the coupons (deposition was greater than etch/desorption). The film thickness was homogenous within the area where growth was observed, and the film was 25-26.7 nm thick (growth rate 0.63-0.67 Å/cycle) with a resistivity of 175-177 Ω·cm. Conformal growth with some variations in film thickness was observed for the substrate with features placed in the area where growth was observed. The roughness of the sample was analyzed by AFM on five different locations. An average of these five measurements gave an average RMS roughness of 1.783 nm (standard deviation=0.061), which is 6.9% of the film's thickness. SEM images were taken of various features after deposition as shown in FIGS. 35-37.

Figure 35:
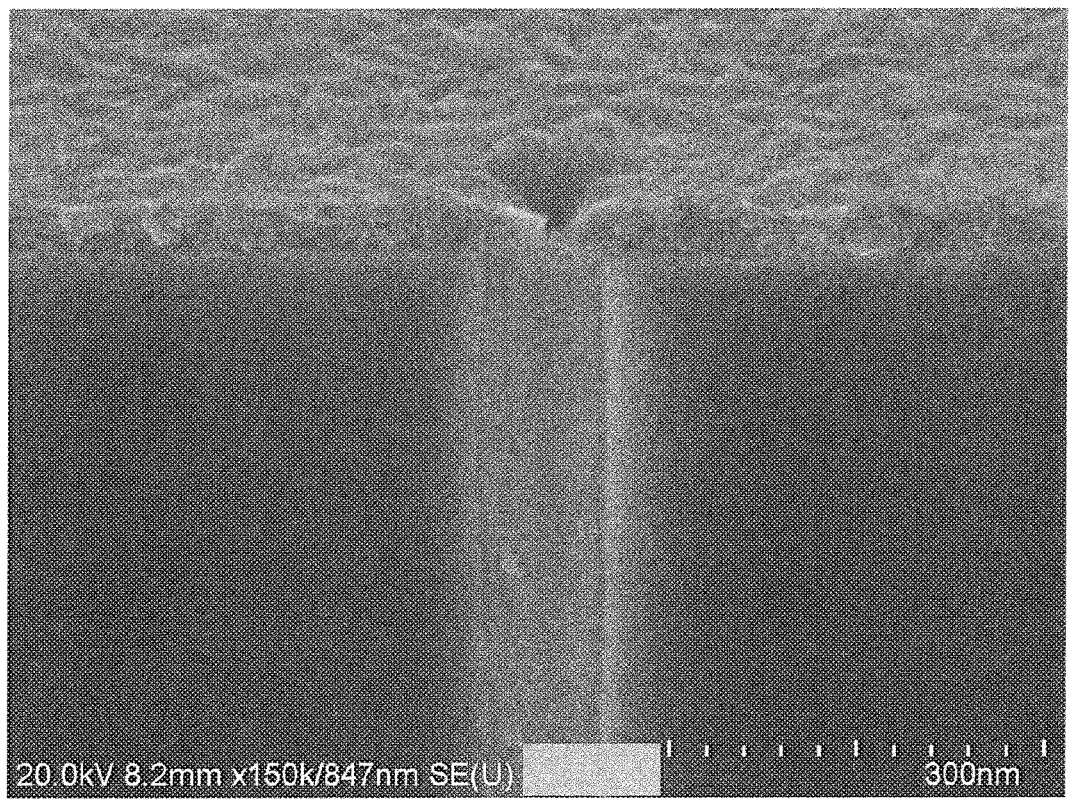
FIG. 35 provides an SEM image of a top portion of feature E1, at 150 K magnification, tilted view, showing that a thick molybdenum film was deposited at an upper portion of feature E1 and outside the feature E1.

FIG. 35 shows that a thick molybdenum film was deposited at an upper portion of a feature E1 and outside the feature E1, where deposition was greater than etch/desorption.

Figure 36:
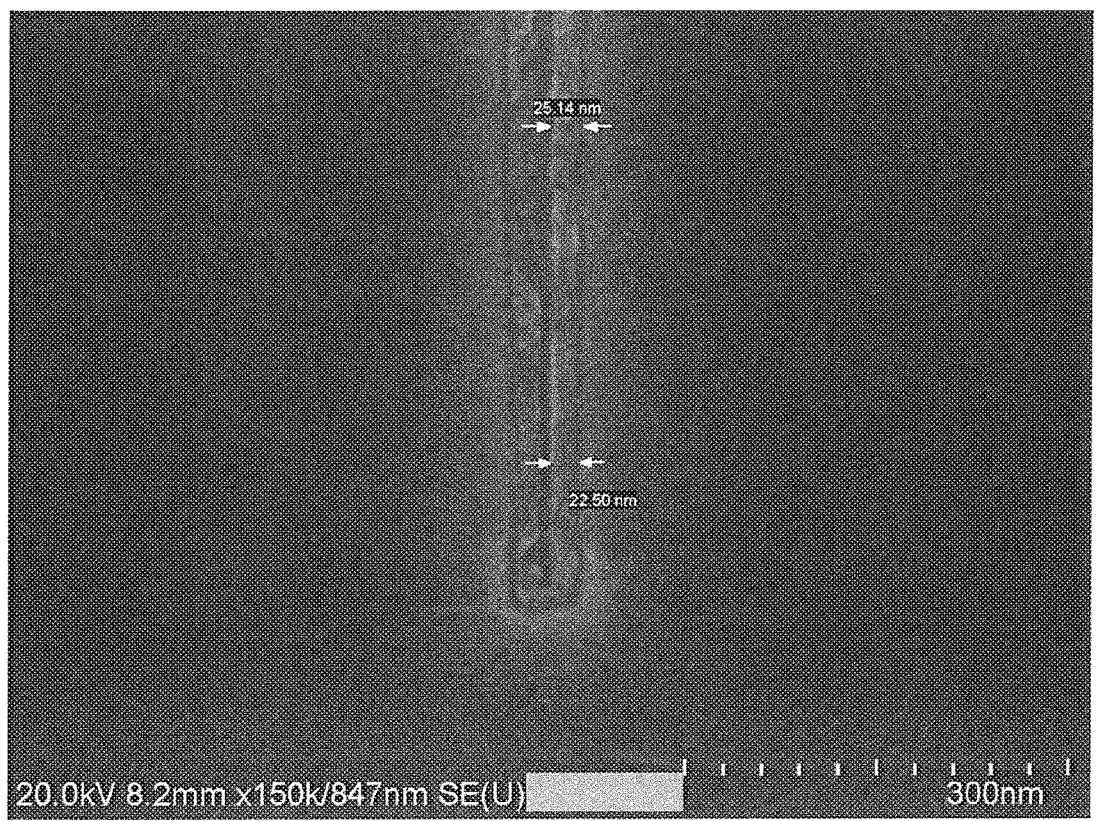
FIG. 36 provides an SEM image of a bottom portion of feature E2, at 150 K magnification, perpendicular view, showing that a thick molybdenum film was deposited at a lower portion of feature E2.

FIG. 36 shows that a thick molybdenum film was deposited at a lower portion of a feature E2, where deposition was greater than etch/desorption.

Figure 37:
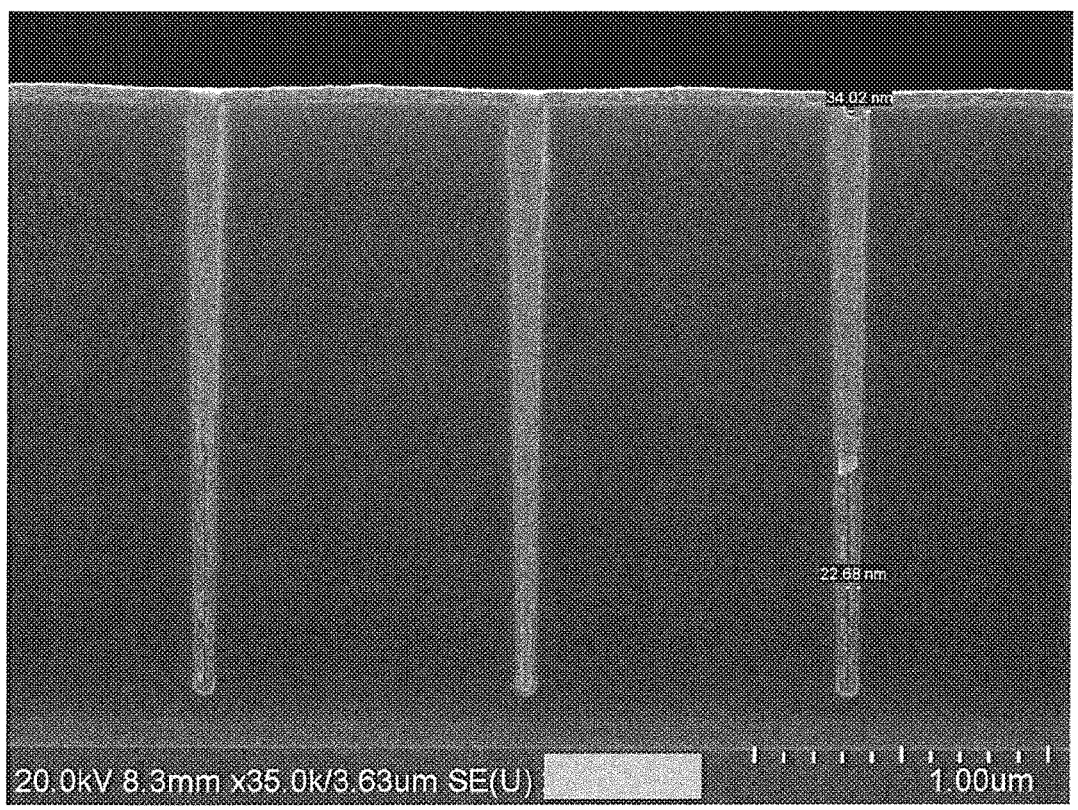
FIG. 37 provides an SEM image of entire lengths of respective features E3, E4, and E5 (from left to right), at 35 K magnification, perpendicular view, showing how the amount of molybdenum within a feature varies from an upper portion to a lower portion of the feature, showing that a thick film of molybdenum was deposited throughout the features' lengths.

FIG. 37 shows that a molybdenum film was deposited in features E3, E4, and E5 (from left to right). FIG. 37 illustrates how the amount of molybdenum within a feature varies from top to bottom, showing that a thick film of molybdenum was deposited throughout the feature's length. Additionally, the middle feature E4 was not broken during cleave while the left side feature E3 and right side feature E5 were partially broken off during cleave. The measured thicknesses at the feature E5 upper portion was 34 nm and 23 nm at feature lower portion, consistent with conformal ALD process with some variations in film thickness.

Figure 38:
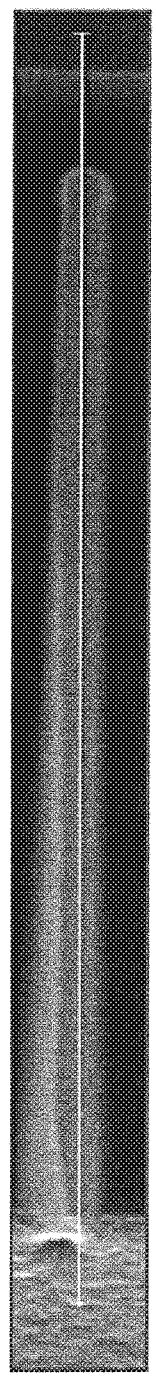
FIG. 38a is an SEM image showing the position of an EDS line scan in a feature E6.
FIG. 38b shows the EDS counts for the molybdenum intensity along the length of feature E6. The right side of the EDS intensity count in FIG. 29b corresponds to the bottom of feature E6, and the left side of the EDS intensity count corresponds to the top of feature E6.
Figure 38:
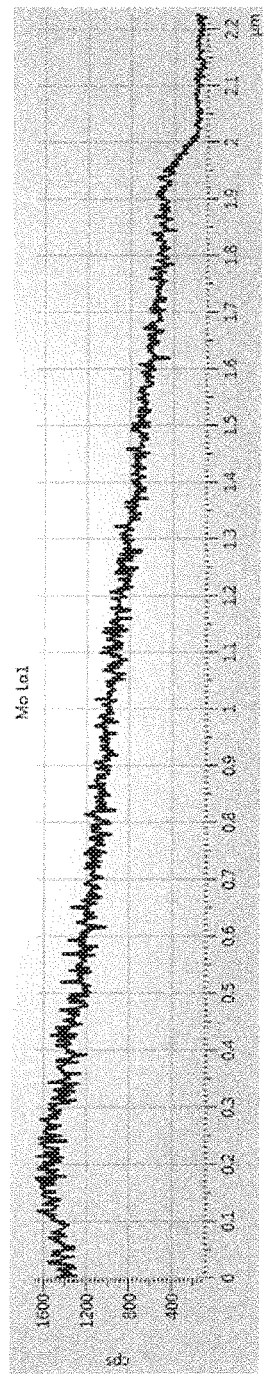

FIGS. 38a and 38b show the quantification of molybdenum (measured by EDS) as a function of position within a feature, which illustrates how the amount of molybdenum gradually decreased with increased depth within the feature. In particular, FIG. 38a is an SEM image showing the position of an EDS line scan in a feature E6, and FIG. 38b shows the EDS counts for the molybdenum intensity along the length of feature E6. The right side of the EDS intensity count in FIG. 29b corresponds to the bottom of feature E6, and the left side of the EDS intensity count corresponds to the top of feature E6. This gradual decrease of the strength of the molybdenum signal can be an indication of a molybdenum thickness decrease (along feature depth), but also reflects decreasing diameter of the feature E6, which decreases the space available for the molybdenum film to grow. Additionally, the way the sample was cleaved can impact the amount of molybdenum present on either side, and thus the strength of the molybdenum EDS signal. This pattern of molybdenum thickness across the feature with a 20:1 aspect ratio was consistent with a conformal ALD process with some variations in film thickness.

Figure 39:
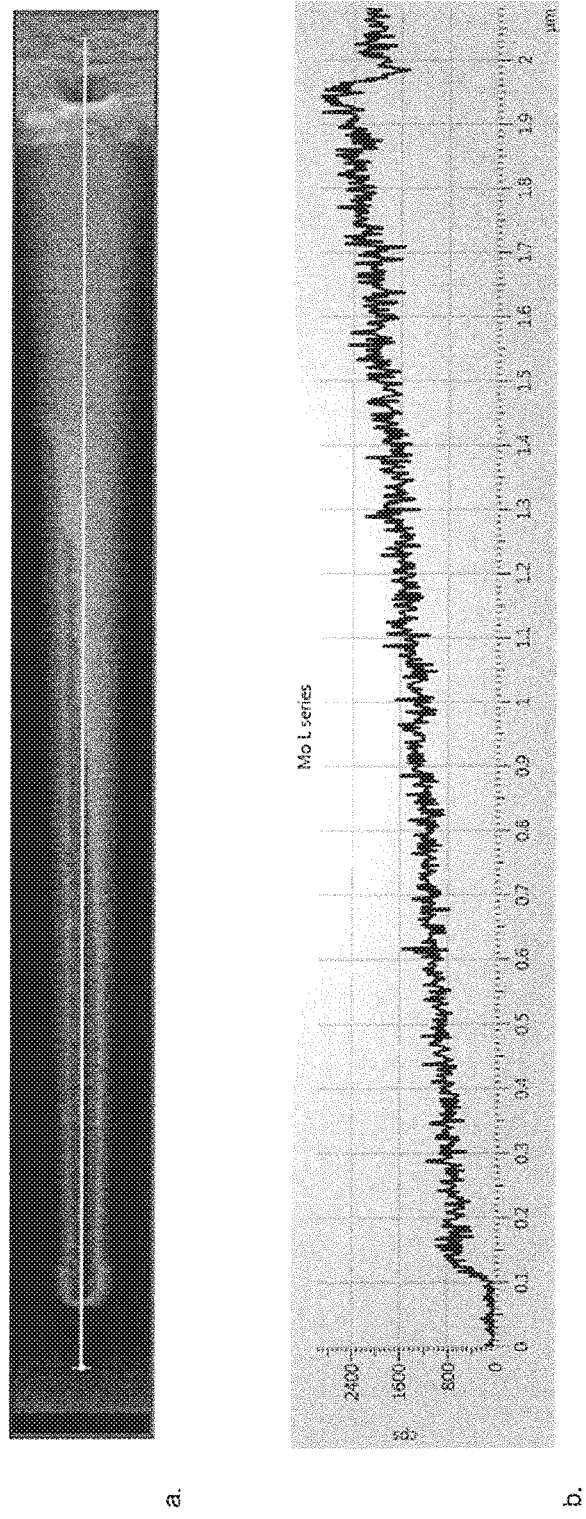
FIG. 39a is an SEM image showing the position of an EDS line scan in a feature E7.
FIG. 39b shows the EDS counts for the molybdenum intensity along the length of feature E7. The right side of the EDS intensity count in FIG. 39b corresponds to the top of feature E7, and the left side of the EDS intensity count corresponds to the bottom of feature E7.

FIGS. 39a and 39b show the quantification of molybdenum (measured by EDS) as a function of the position within another feature, which illustrates how the amount of molybdenum gradually decreased with increased depth within the feature. In particular, FIG. 39a is an SEM image showing the position of an EDS line scan in a feature E7, and FIG. 39b shows the EDS counts for the molybdenum intensity along the length of feature E7. The right side of the EDS intensity count in FIG. 39b corresponds to the top of feature E7, and the left side of the EDS intensity count corresponds to the bottom of feature E7. This gradual decrease (along feature depth) of the strength of the molybdenum signal can be an indication of a molybdenum thickness decrease (along feature depth), but also reflects decreasing diameter of the feature E7, which decreases the space available for the molybdenum film to grow. Additionally, the way the sample was cleaved can impact the amount of molybdenum present on either side, and thus the strength of the molybdenum EDS signal. This pattern of thickness across the feature E7 with a 20:1 aspect ratio is consistent with a conformal ALD process with some variations in film thickness.

Figure 40:
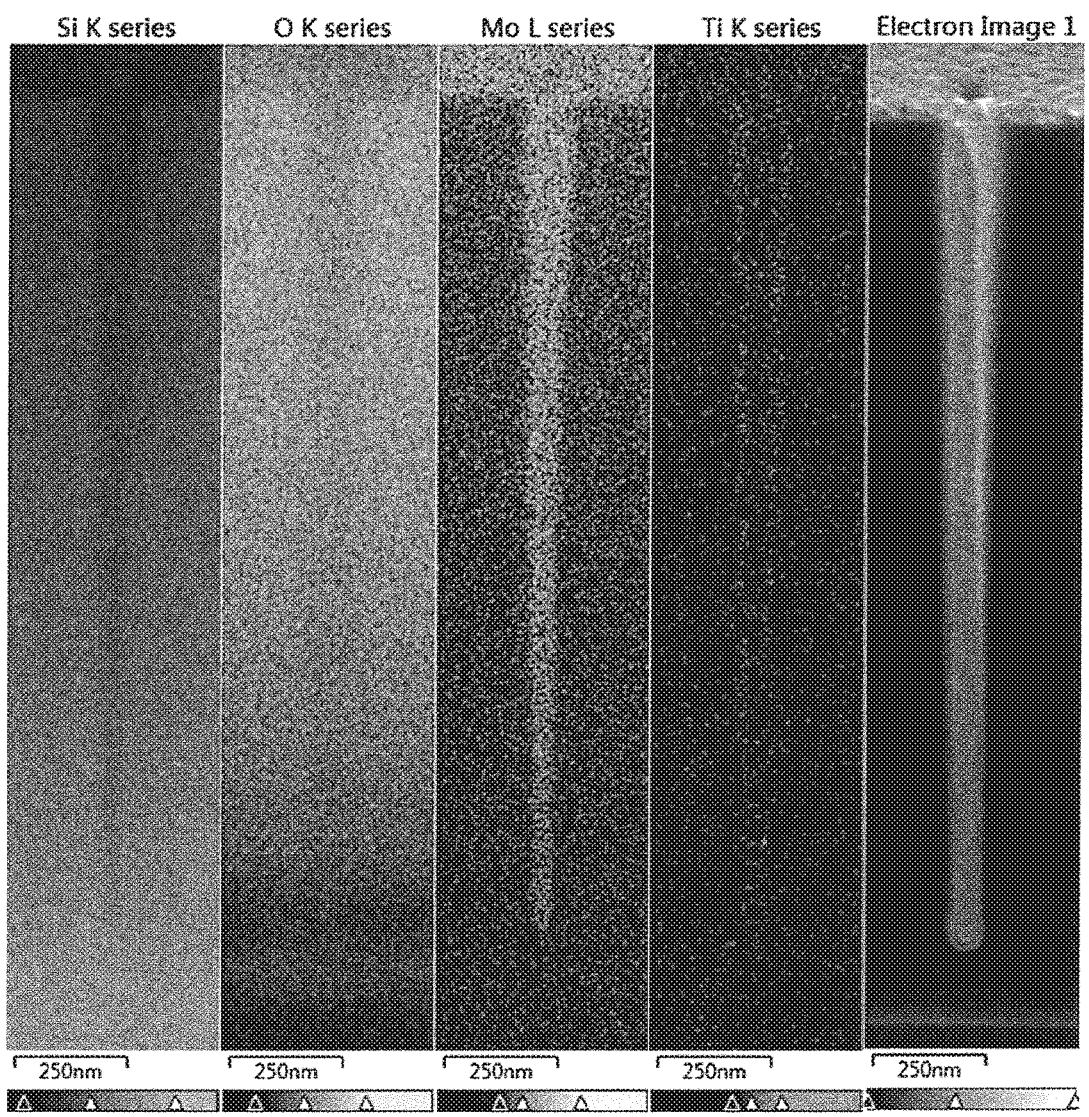
FIG. 40 illustrates the quantification of molybdenum, silicon, oxygen, and titanium (measured by EDS) within a rectangle covering a whole feature E8 (SEM image provided on the far right).
Figure 41:
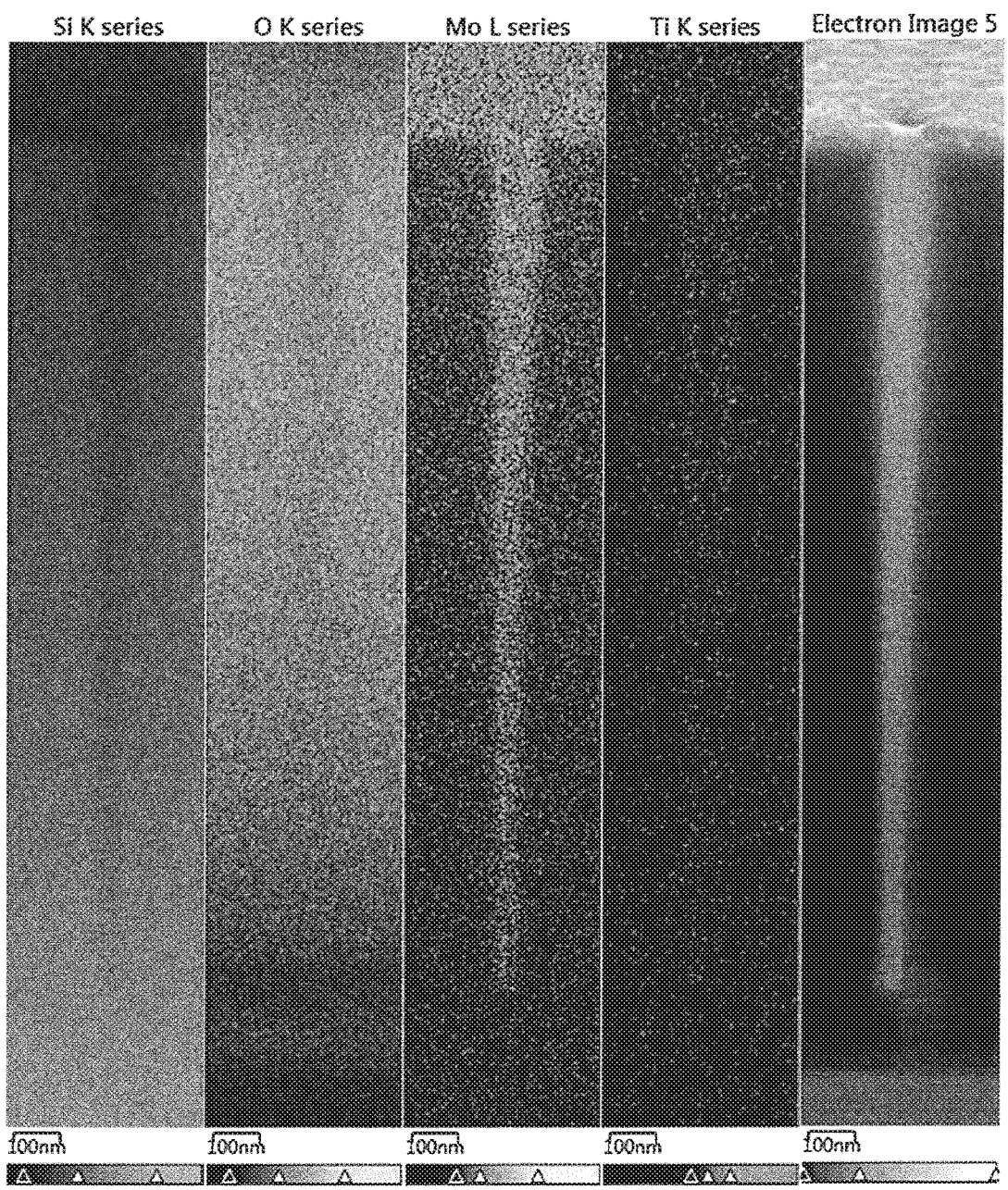
FIG. 41 illustrates the quantification of molybdenum, silicon, oxygen, and titanium (measured by EDS) within a rectangle covering a whole feature E9 (SEM image provided on the far right).
Figure 42:
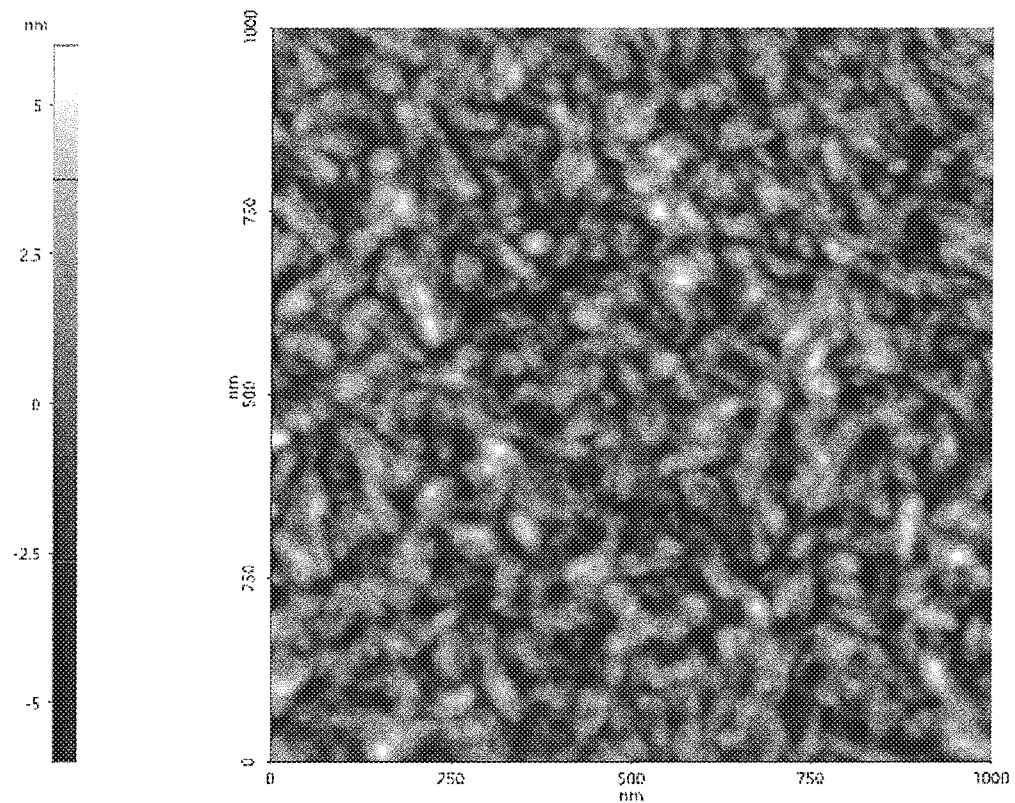
FIG. 42a (right side) provides an AFM map of a 1 µm square area of a deposited Mo film, showing that the deposited film is rough.
FIG. 42b is a histogram showing the distribution of pixels by height.
Figure 42:
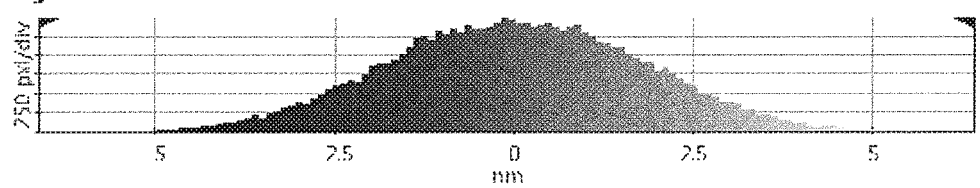

FIGS. 40 and 41 show the respective quantification of molybdenum, silicon, oxygen, and titanium (measured by EDS) within a rectangle covering a whole feature E8 (SEM image provided on far right of FIG. 40) and within a rectangle covering a whole feature E9 (SEM image provided on far right of FIG. 41), respectively, which illustrates how a strong signal of molybdenum was somewhat constant within the whole feature E8 and E9. This strong molybdenum "shadows" the silicon and oxygen signals, which come from the silica substrate. The silica substrate was coated with a 50 Å TiN liner, and the titanium was analyzed to provide confirmation that the analysis was as sensitive as desired. This pattern of thickness across the features E8 and E9 with a 20:1 aspect ratio is consistent with a conformal ALD process with some variations in film thickness.

FIG. 42a (right side) provides an AFM map of a 1 μm square area of a deposited Mo film on a top surface of a sample, showing that the deposited film is rough. FIG. 42a (left side) shows the palette of colors used to illustrate the height of each pixel of the AFM map. FIG. 42b is a histogram showing the distribution of pixels by height. The RMS roughness on that sample was 1.775 nm, which means the RMS roughness was 6.9% of the film thickness. Four additional 1 μm square areas were similarly analyzed (data not shown) and each provided RMS roughness roughnesses of 1.878 nm (7.3%), 1.783 nm (6.9%), 1.769 nm (6.9%) and 1.708 nm (6.6%), respectively.

Example 1F: ALD Under Conformal Growth Conditions VI: Conformal ALD Growth of Molybdenum Film ALD was performed over the course of 600 cycles at 295° C. under conformal growth conditions as provided herein (referred to herein as "conformal growth conditions VI"). Each cycle consisted of:
1. a 1-second exposure of $MoCl_5$ (delivered by vapor-draw, while held at 117° C. (un-corrected temperature), which resulted in a pressure spike of 0.012-0.015 Torr),
2. followed by a 10-second purge with 20 sccm of nitrogen,
3. a 3-second exposure of CHD (delivered by bubbling nitrogen in the CHD cylinder, which was heated to 50° C.),
4. followed by a 10-second purge with 20 sccm of nitrogen.

Two zones were seen in the deposition reactor: one where no growth was observed on the coupons serving as the substrate (etch/desorption was greater than deposition), and one where growth was observed on the coupons (deposition was greater than etch/desorption). The film thickness was homogenous within the area where growth was observed, and the film was 20-21 nm thick (growth rate 0.34-0.35 Å/cycle) with a resistivity of 140-148 μΩ·cm. Conformal growth was observed for the substrate with features placed in the area where growth was observed. The roughness of the sample was analyzed by AFM on five different locations. An average of these five measurements gave an average RMS roughness of 5.67 nm (standard deviation=1.79), which is 27.6% of the film's thickness indicating a rough molybdenum film, which also has irregular roughness. SEM images were taken of various features after deposition as shown in FIGS. 43-46.

Figure 43:
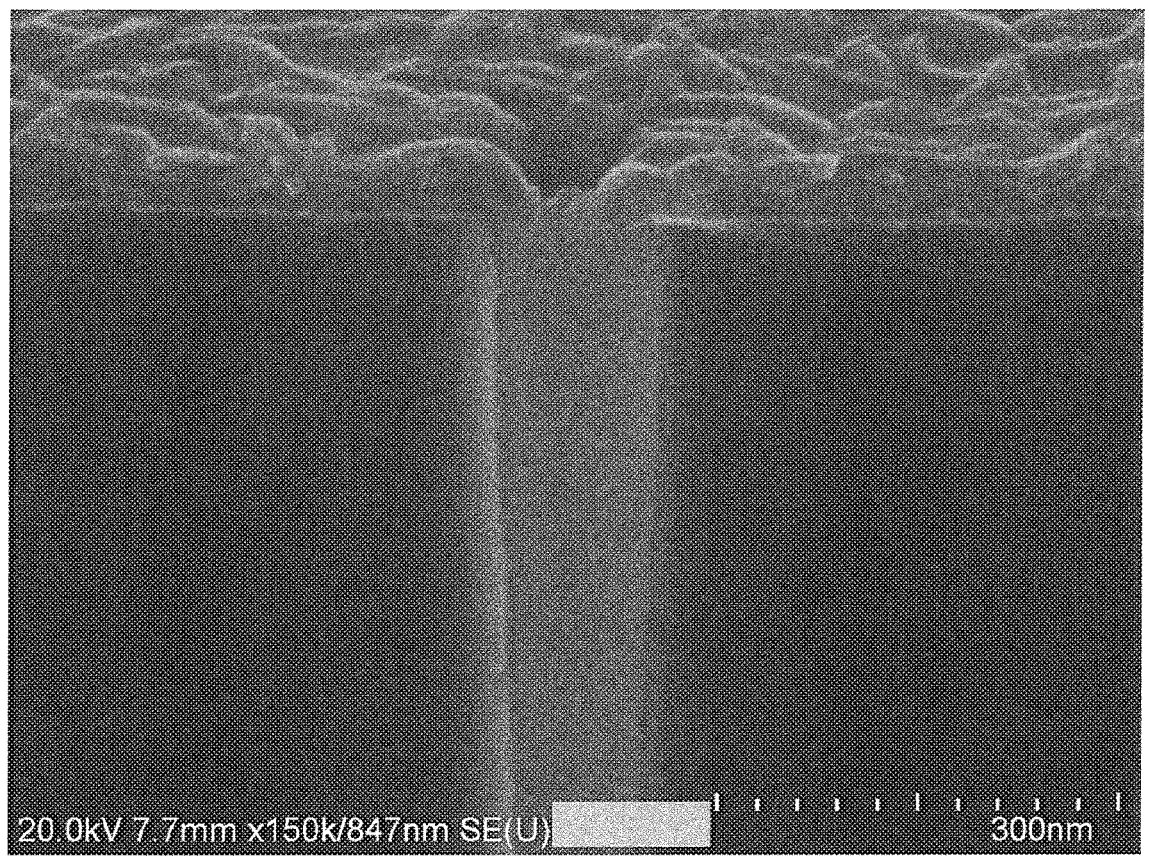
FIG. 43 provides an SEM image of a top portion of feature F1, at 150 K magnification, tilted view, showing that a thick molybdenum film was deposited at an upper portion of feature F1 and outside the feature F1.

FIG. 43 shows that a thick molybdenum film was deposited at an upper portion of a feature F1 and outside the feature F1, where deposition was greater than etch/desorption.

Figure 44:
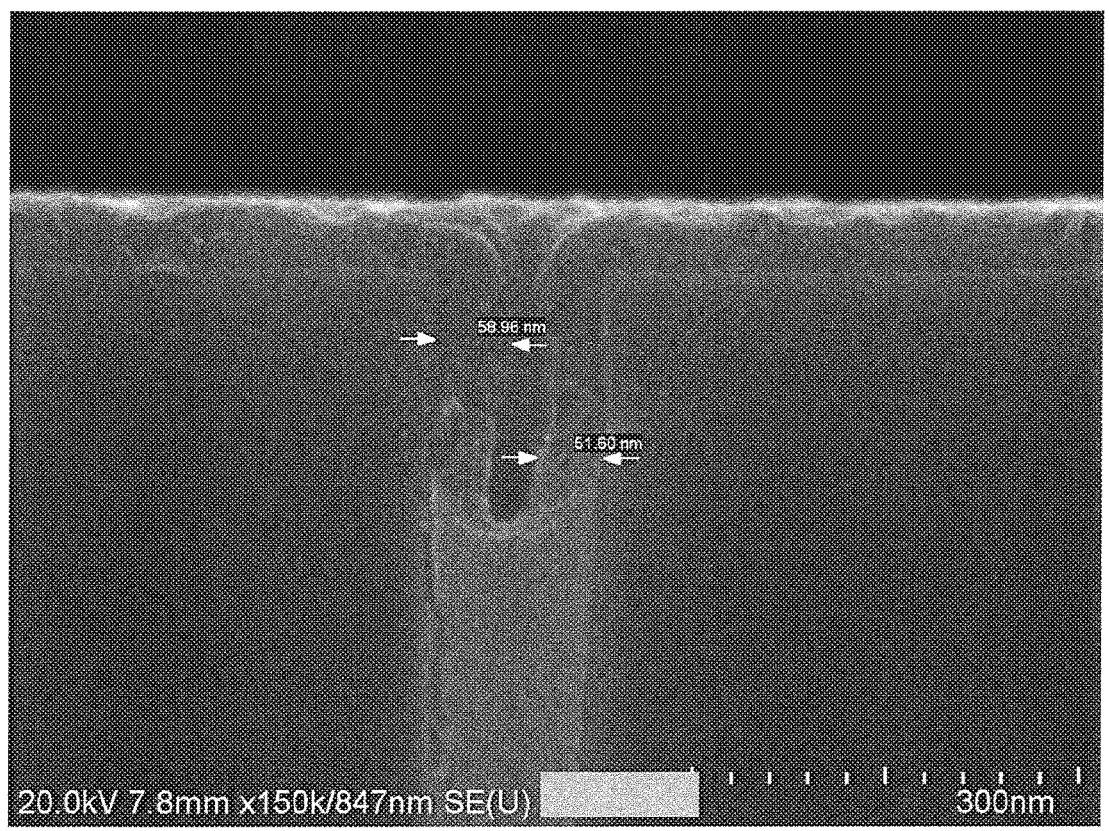
FIG. 44 provides an SEM image of a top portion of feature F2, at 150 K magnification, perpendicular view, showing that a thick molybdenum film was deposited at an upper portion of feature F2 and outside the feature F2.

FIG. 44 shows that a thick molybdenum film was deposited at an upper portion of a feature F2 and outside the feature F2, where deposition was greater than etch/desorption.

Figure 45:
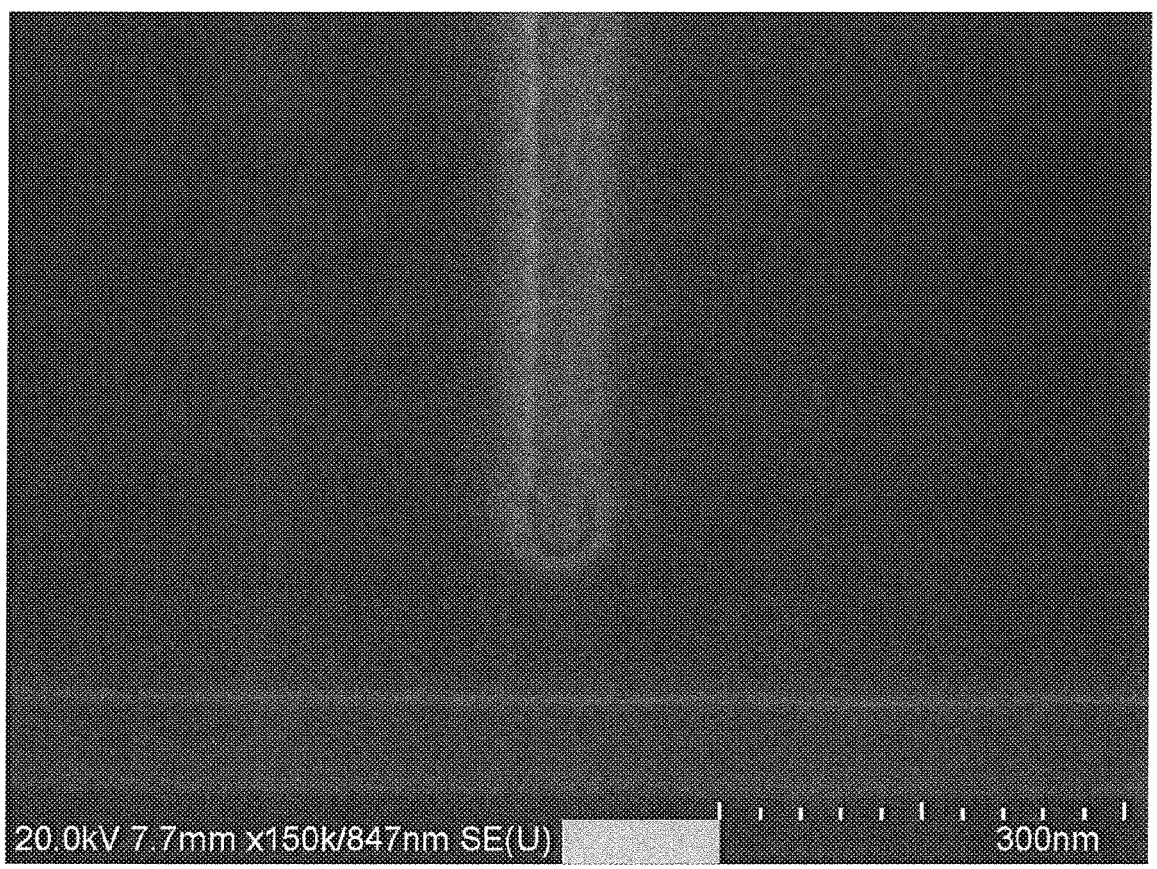
FIG. 45 provides an SEM image of a bottom portion of feature F3, at 150 K magnification, tilted view, showing that a thick molybdenum film was deposited at a lower portion of feature F3.

FIG. 45 shows that a thick molybdenum film was deposited at a lower portion of a feature F3, where deposition was greater than etch/desorption.

Figure 46:
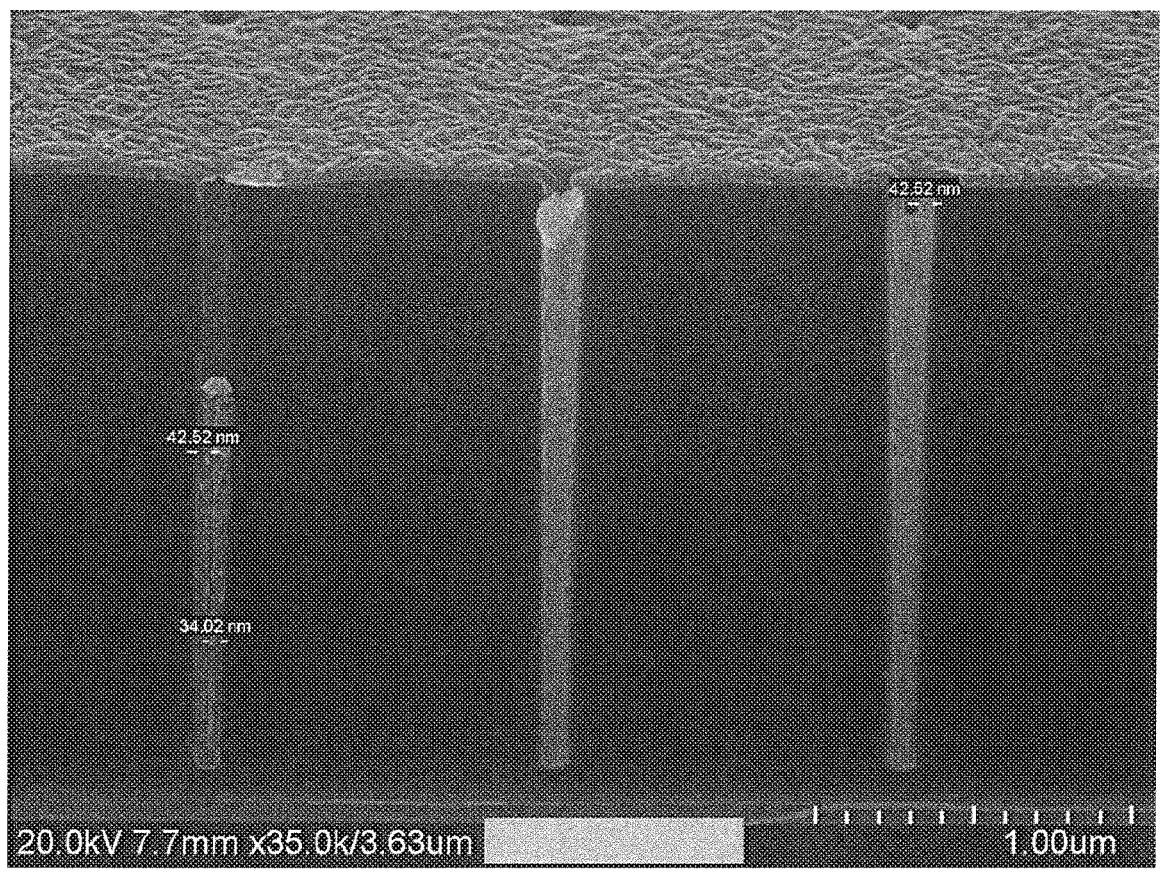
FIG. 46 provides an SEM image of entire lengths of respective features F4, F5, and F6 (from left to right), at 35 K magnification, tilted view, showing how the amount of molybdenum within a feature varies from an upper portion to a lower portion of the feature, showing that a thick film of molybdenum was deposited throughout the feature's length.

FIG. 46 shows that a molybdenum film was deposited in features F4, F5, and F6 (from left to right). FIG. 46 illustrates how the amount of molybdenum within a feature varies from top to bottom, showing that a thick film of molybdenum was deposited throughout the feature's length. Additionally, the middle feature F5 and right side feature F6 were not broken during cleave while the left side feature F4 was partially broken off during cleave. The measured thicknesses at the feature F4 upper portion was 42 nm, and 34 nm at the feature lower portion, consistent with a conformal ALD process with some variations in film thickness.

Figure 47:
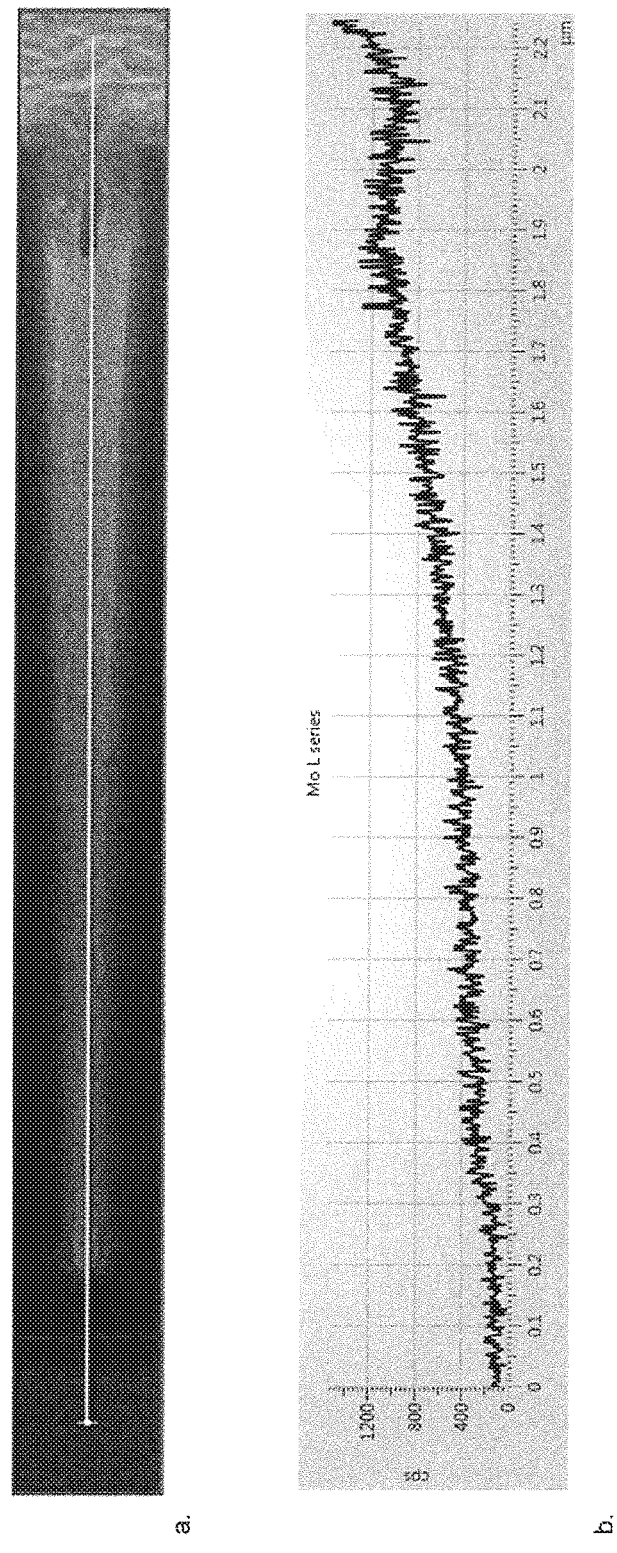
FIG. 47a is an SEM image showing the position of an EDS line scan in a feature F7.
FIG. 47b shows the EDS counts for the molybdenum intensity along the length of feature F7. The right side of the EDS intensity count in FIG. 47b corresponds to the top of feature F7, and the left side of the EDS intensity count corresponds to the bottom of feature F7.

FIGS. 47a and 47b show the quantification of molybdenum (measured by EDS) as a function of the position within a feature, which illustrates how the amount of molybdenum gradually decreased with increased depth within the feature. In particular, FIG. 47a is an SEM image showing the position of an EDS line scan in a feature F7, and FIG. 47b shows the EDS counts for the molybdenum intensity along the length of feature F7. The right side of the EDS intensity count in FIG. 47b corresponds to the top of feature F7, and the left side of the EDS intensity count corresponds to the bottom of feature F7. This gradual decrease (along feature depth) of the strength of the molybdenum signal can be an indication of a molybdenum thickness decrease (along feature depth), but also reflects decreasing diameter of the feature F7, which decreases the space available for the molybdenum film to grow. Additionally, the way the sample was cleaved can impact the amount of molybdenum present on either side, and thus the strength of the molybdenum EDS signal. This pattern of thickness across the feature with a 20:1 aspect ratio was consistent with a conformal ALD process with some variations in film thickness. The molybdenum film was un-broken during cleave.

Figure 48:
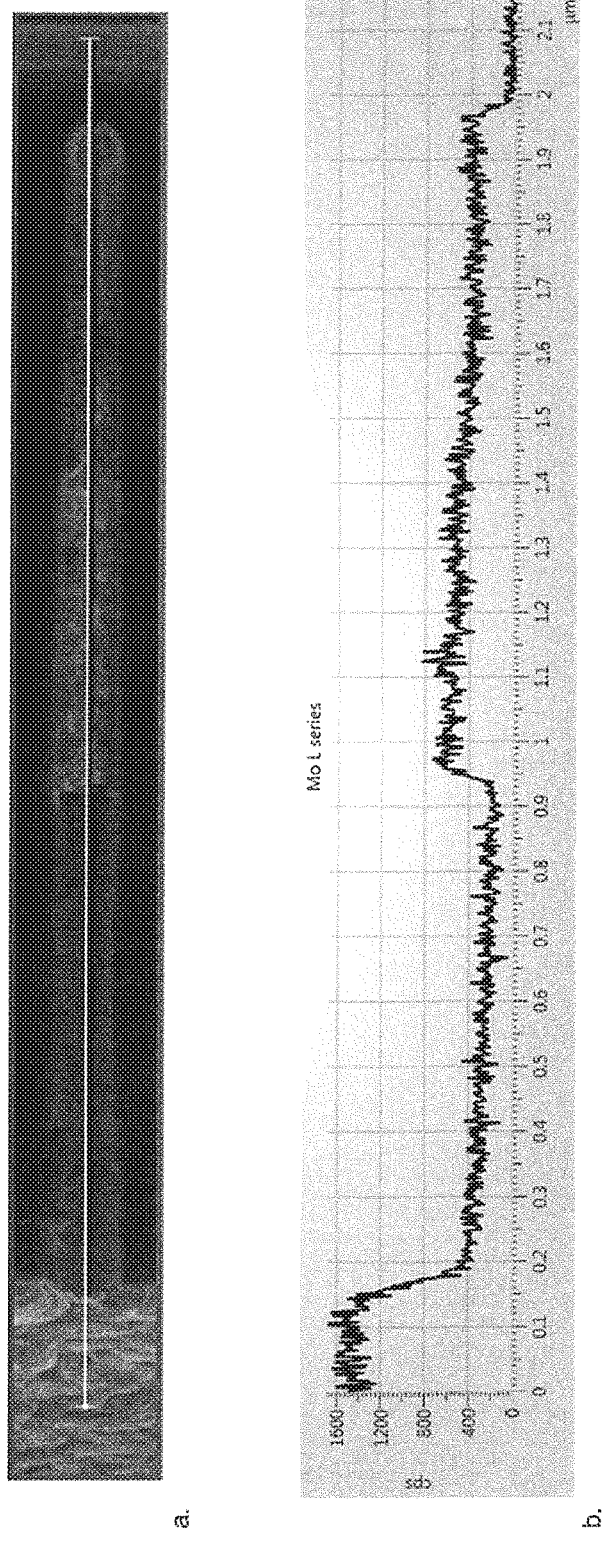
FIG. 48a is an SEM image showing the position of an EDS line scan in a feature F8.
FIG. 48b shows the EDS counts for the molybdenum intensity along the length of feature F8. The right side of the EDS intensity count in FIG. 48b corresponds to the bottom of feature F8, and the left side of the EDS intensity count corresponds to the top of feature F8.

FIGS. 48a and 48b show the quantification of molybdenum (measured by EDS) as a function of the position within a feature, which illustrates how the amount of molybdenum gradually decreased with increased depth within the feature. In particular, FIG. 48a is an SEM image showing the position of an EDS line scan in a feature F8, and FIG. 48b shows the EDS counts for the molybdenum intensity along the length of feature F8. The right side of the EDS intensity count in FIG. 48b corresponds to the bottom of feature F8, and the left side of the EDS intensity count corresponds to the top of feature F8. This gradual decrease (along feature depth) of the strength of the molybdenum signal can be an indication of a molybdenum thickness decrease (along feature depth), but also reflects decreasing diameter of the feature F8, which decreases the space available for the molybdenum film to grow. Additionally, the way the sample was cleaved can impact the amount of molybdenum present on either side, and thus the strength of the molybdenum EDS signal. This pattern of thickness across the feature with a 20:1 aspect ratio was consistent with a conformal ALD process with some variations in film thickness. The molybdenum film was broken during cleave.

Figure 49:
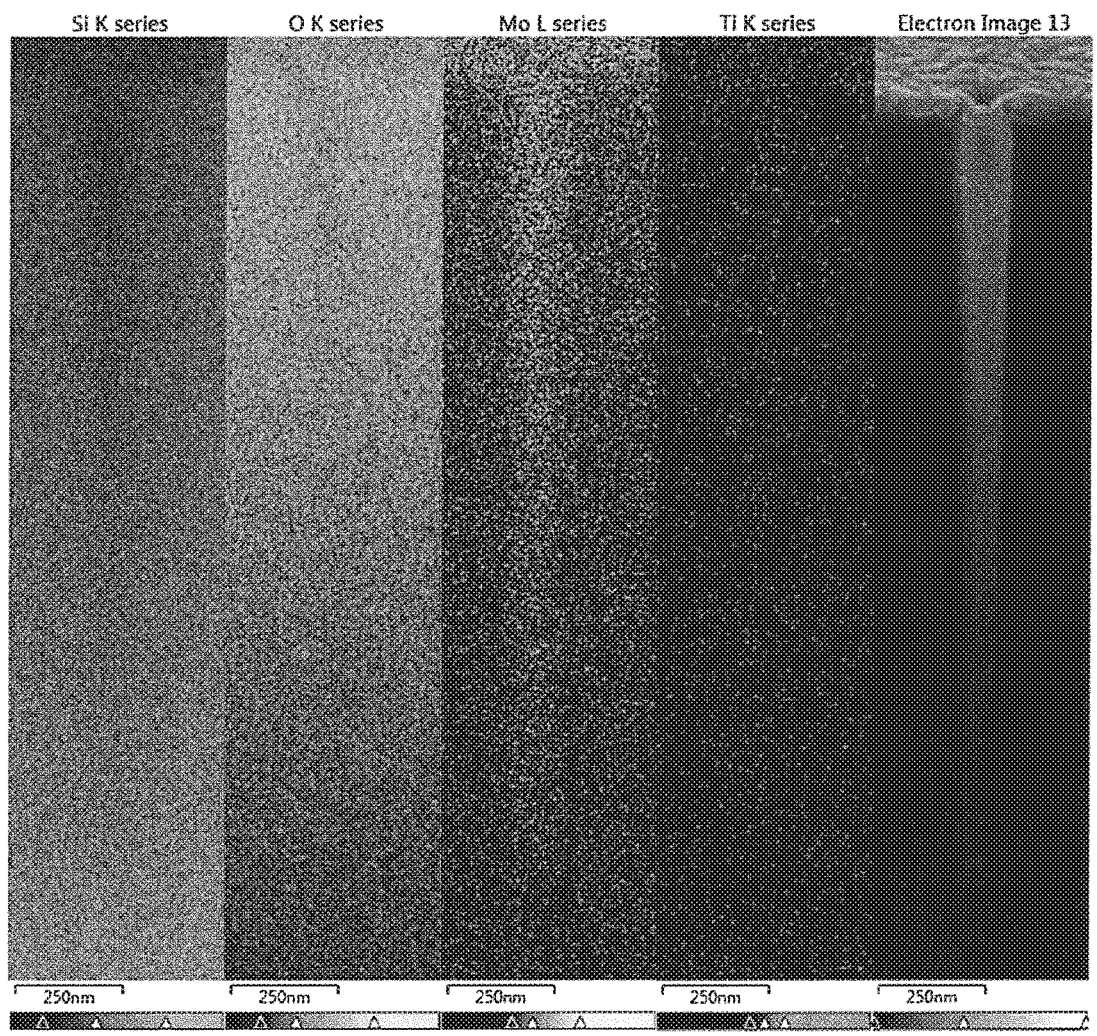
FIG. 49 illustrates the quantification of molybdenum, silicon, oxygen, and titanium (measured by EDS) within a rectangle covering a whole feature F9 (SEM image provided on far right of FIG. 49).
Figure 50:
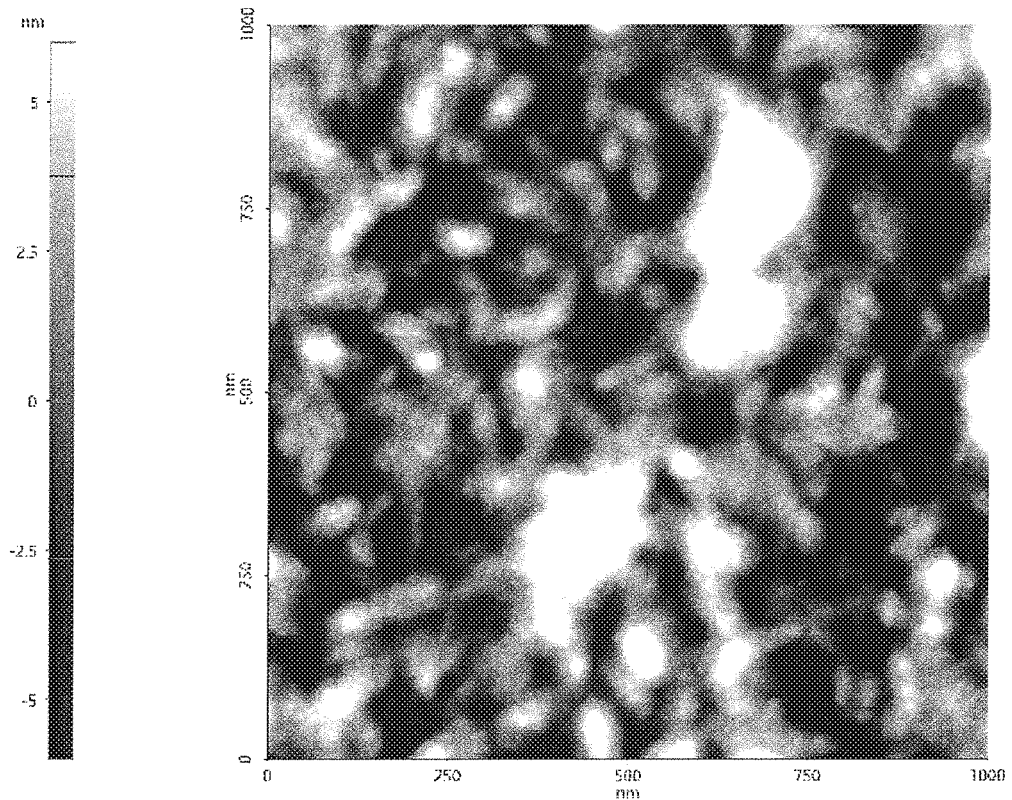
FIG. 50a (right side) provides the AFM map of a 1 m square area of a deposited Mo film, showing that the deposited film was rough.
FIG. 50b is a histogram showing the distribution of pixels by height.
Figure 50:
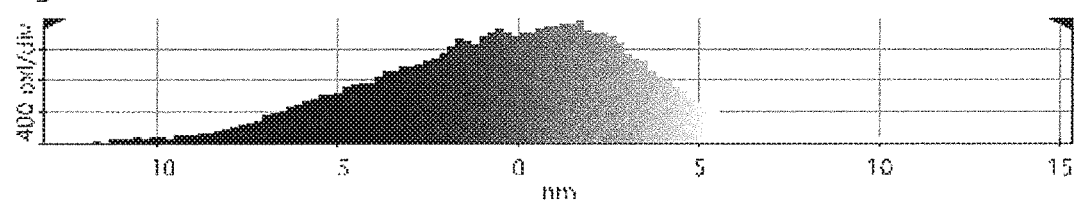

FIG. 49 shows the quantification of molybdenum, silicon, oxygen, and titanium (measured by EDS) within a rectangle covering a whole feature F9 (SEM image provided on far right of FIG. 49), which illustrates how the strong signal of molybdenum was somewhat constant within the whole feature F9. This strong molybdenum "shadows" the silicon and oxygen signals, which come from the silica substrate. The silica substrate was coated with a 50 Å TiN liner, and the titanium was analyzed to provide confirmation that the analysis was as sensitive as desired. This pattern of thickness across the feature F9 with a 20:1 aspect ratio was consistent with a conformal ALD process with some variations in film thickness.

FIG. 50a (right side) provides the AFM map of a 1 m square area of a deposited Mo film on a top surface of a sample, showing that the deposited film was rough. FIG. 50a (left side) shows the palette of colors used to illustrate the height of each pixel of the AFM map. FIG. 50b is a histogram showing the distribution of pixels by height. The RMS roughness on that sample was 4.191 nm, which means the RMS roughness was 20.4% of the film thickness. Four additional 1 m square areas were similarly analyzed (data not shown) and each provided an RMS roughness of 6.137 nm (30.0%), 4.039 nm (19.7%), 5.506 nm (26.9%) and 8.46 nm (41.3%), respectively.

Example 1G: ALD Under Conformal and Super-Conformal Growth Conditions VII: Conformal ALD Growth Capable of Depositing an Extremely Smooth Film ALD was performed over the course of 250 super-cycles at 275° C. combining conformal growth cycles and super-conformal growth cycles as provided herein (referred to herein as "growth conditions VII"). Each super-cycle consisted of three consecutive conformal cycles followed by one super-conformal cycle.

Each conformal cycle consisted of:
1. a 1-second exposure of $MoCl_5$ (delivered by vapor-draw, while held at 120° C. (corrected temperature), which resulted in a pressure spike of 0.018-0.022 Torr),
2. followed by a 10-second purge with 20 sccm of nitrogen,
3. a 3-second exposure of CHD (delivered by bubbling nitrogen in a CHD cylinder, which was heated to 50° C.),
4. followed by a 10-second purge with 20 sccm of nitrogen.

Each super-conformal cycle consisted of:
1. a 1-second exposure of $MoCl_5$ (delivered by vapor-draw, while held at 120° C. (corrected temperature), which resulted in a pressure spike of 0.018-0.022 Torr),
2. followed by a 30-second purge with 20 sccm of nitrogen,
3. a 3-second exposure of CHD (delivered by bubbling nitrogen in a CHD cylinder, which was heated to 50° C.),
4. followed by a 30-second purge with 20 sccm of nitrogen.

Two zones were seen in the deposition reactor: one where no growth was observed on the coupons serving as the substrate (etch/desorption was greater than deposition), and one where growth was observed on the coupons (deposition was greater than etch/desorption). The film thickness was homogenous within the area where growth was observed, except in the very-near vicinity of the zone of no growth, where the molybdenum film gradually became thinner as the film's location became closer to the zone of no growth. Within the zone of homogenous film thickness, the film was 26-35 nm thick (growth rate 1.05-1.40 Å/super-cycle) with a resistivity of 244-280 μΩ·cm. Conformal growth was observed for the substrate with features placed in the zone where growth was observed. The roughness of the sample was analyzed by AFM on five different locations. An average of these five measurements gave an average RMS roughness of 0.704 nm (standard deviation=0.0132), which is 2.30% of the film's thickness indicating a smooth molybdenum film. SEM images were taken of various features after deposition as shown in FIGS. 51-55.

Figure 51:
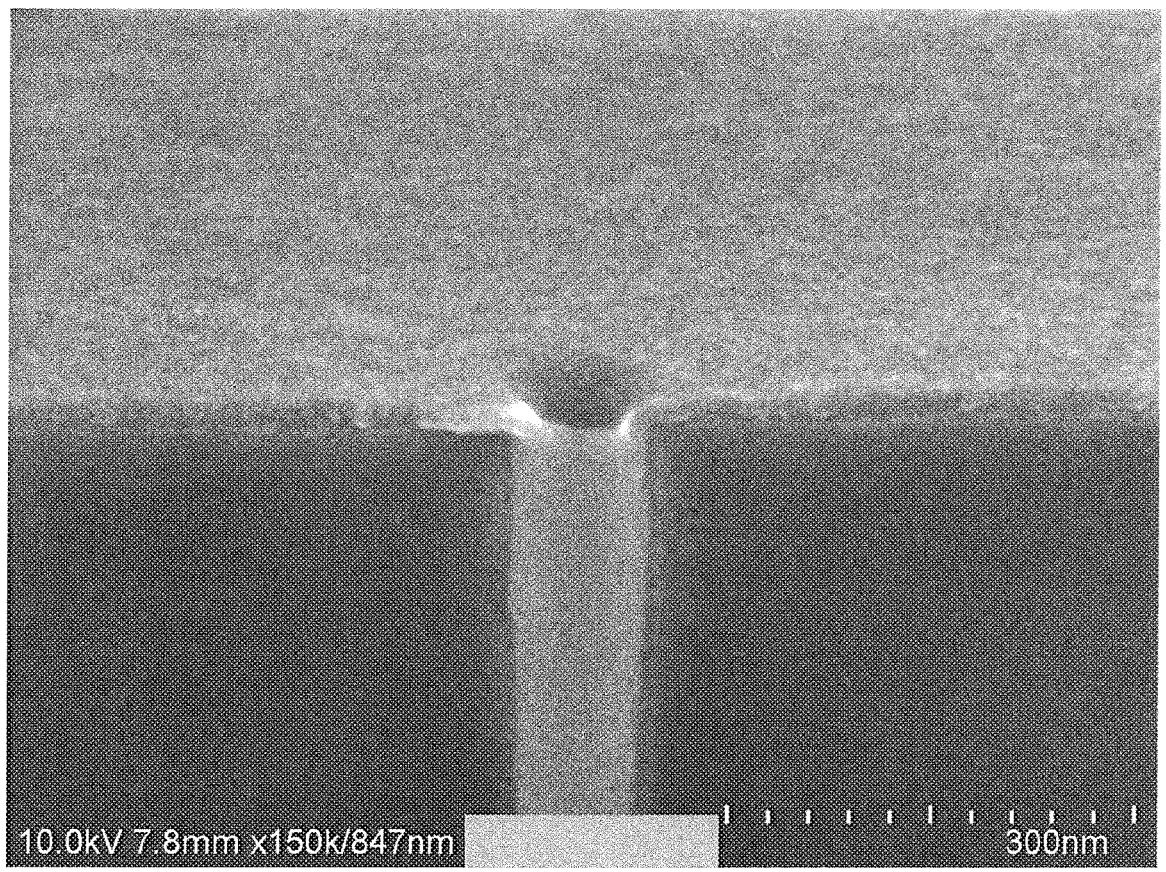
FIG. 51 provides an SEM image of a top portion of feature G1, at 150 K magnification, tilted view, showing that a thick molybdenum film was deposited in an upper portion of feature G1, and outside the feature G1. This molybdenum film was not broken during sample cleave.
Figure 52:
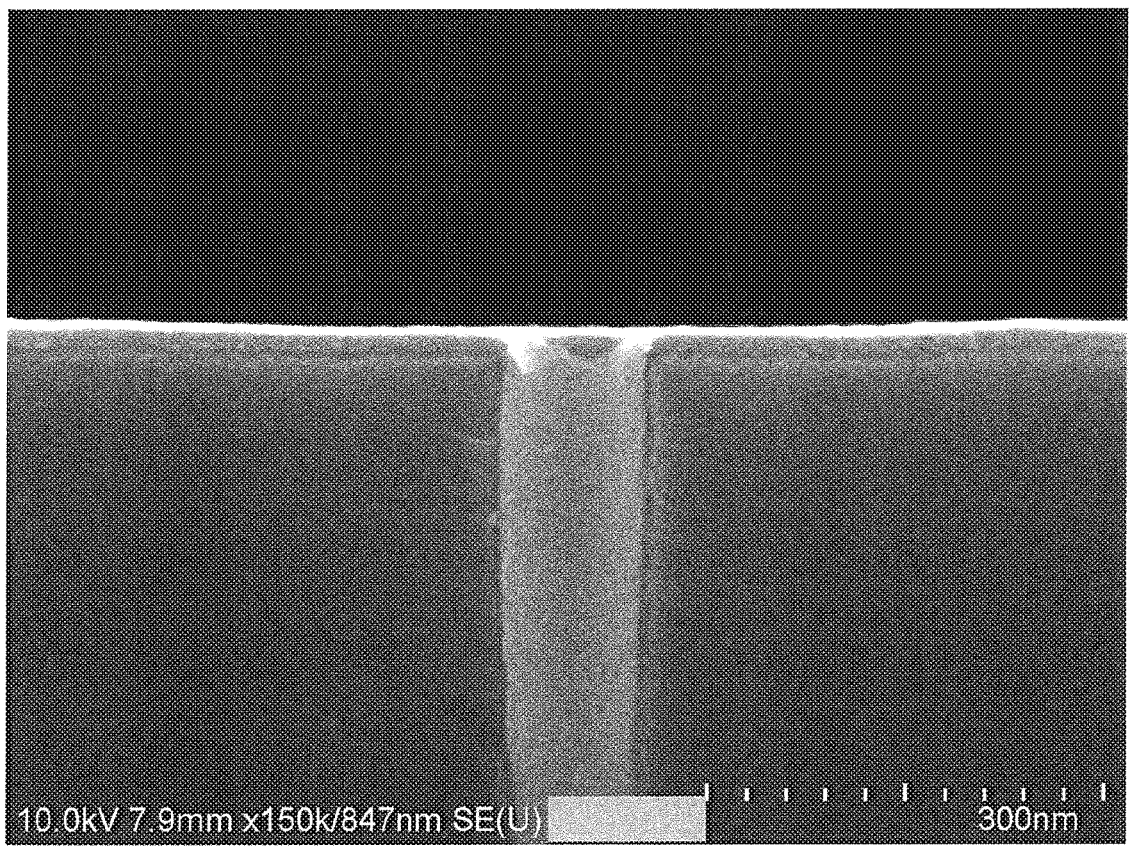
FIG. 52 provides an SEM image of a top portion of feature G2, at 150 K magnification, perpendicular view, showing that a thick molybdenum film was deposited in an upper portion of feature G2, and outside the feature G2. This molybdenum film was not broken during sample cleave.

FIGS. 51 and 52 show that a thick molybdenum film was deposited at an upper portion of features G1 and G2, respectively, and outside the features G1 and G2, respectively, where deposition was greater than etch/desorption.

Figure 53:
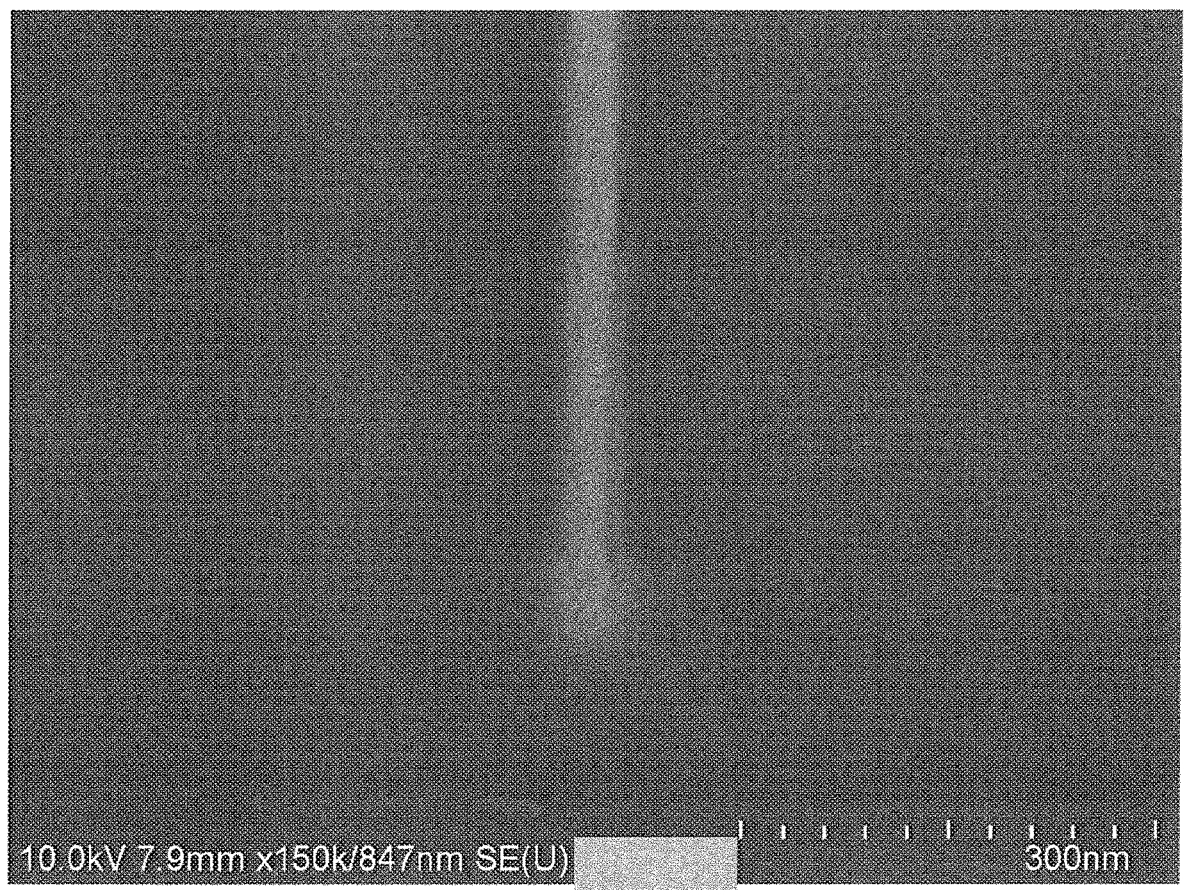
FIG. 53 provides an SEM image of a bottom portion of feature G3, at 150 K magnification, perpendicular view, showing that a thick molybdenum film was deposited in a lower portion of feature G3. This molybdenum film was not broken during sample cleave.

FIG. 53 shows that a thick molybdenum film was deposited at a lower portion of a feature G3, where deposition was greater than etch/desorption.

Figure 54:
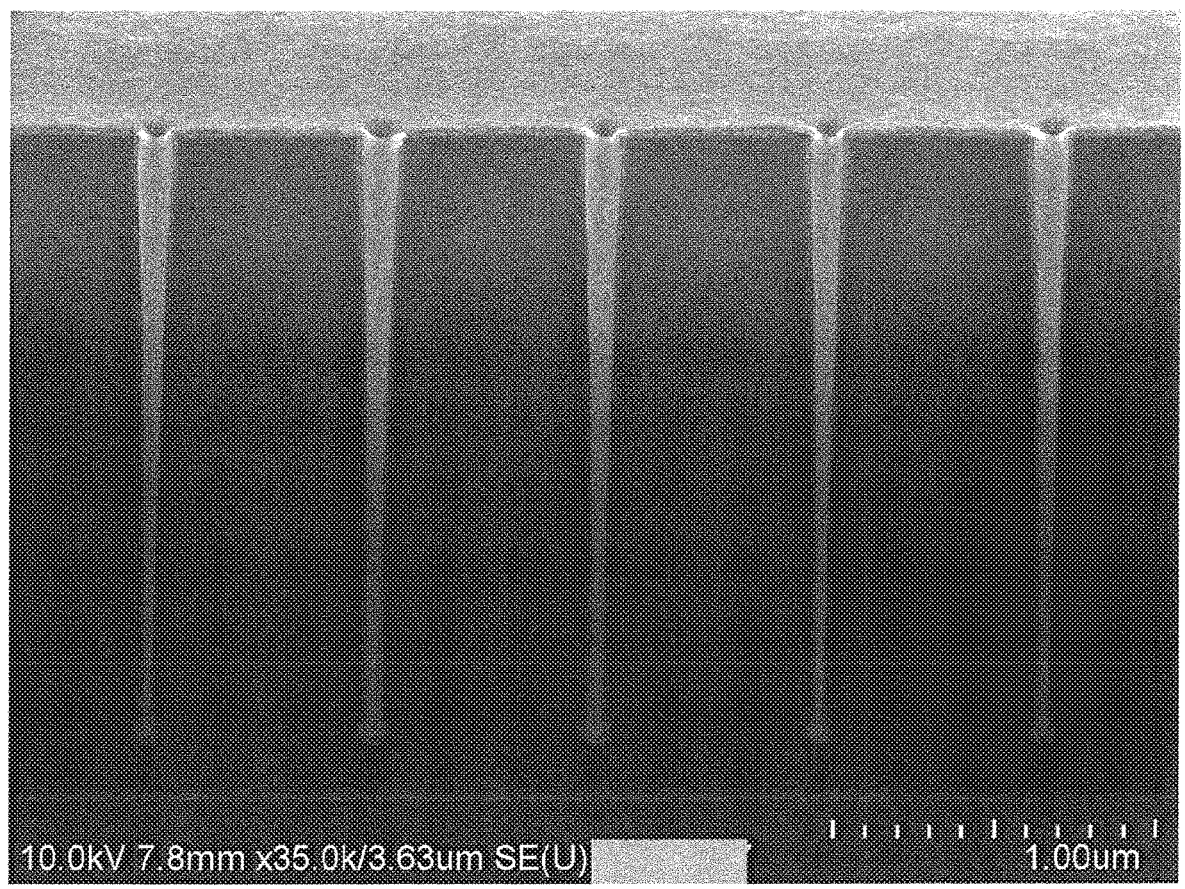
FIG. 54 provides an SEM image of entire lengths of respective features G4, G5, G6, G7, and G8 (from left to right), at 35 K magnification, tilted view, showing that a thick molybdenum film was deposited throughout the features' lengths. No molybdenum film from the features was broken during sample cleave.
Figure 55:
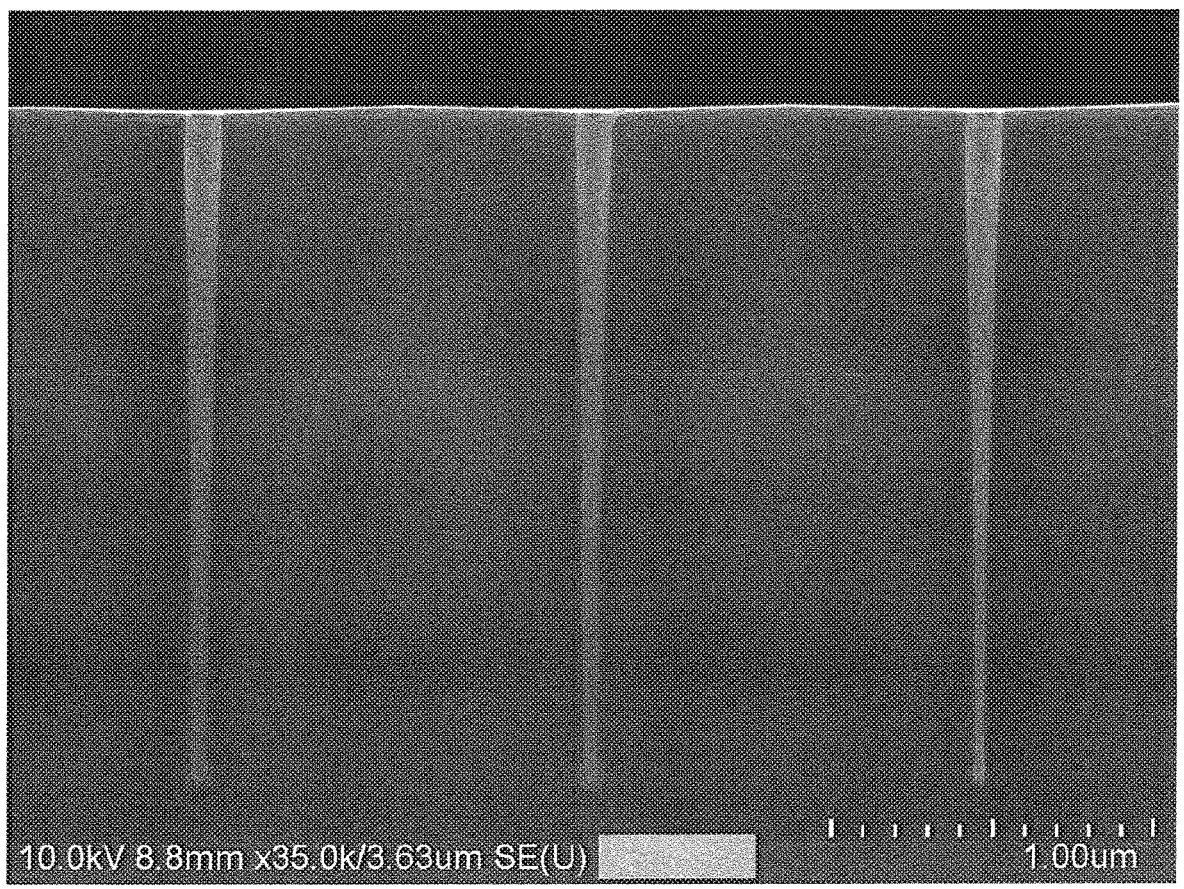
FIG. 55 provides an SEM image of entire lengths of respective features G9, G10, and G11 (from left to right), at 35 K magnification, perpendicular view, showing that a thick molybdenum film was deposited throughout the features' lengths. No molybdenum film from the features was broken during sample cleave.

FIG. 54 shows that a molybdenum film was deposited in features G4, G5, G6, G7, and G8 (from left to right). FIG. 55 shows that a molybdenum film was deposited in features G9, G10, and G11 (from left to right). FIGS. 54 and 55 illustrate how the amount of molybdenum within a feature varies from top to bottom, showing that a thick film of molybdenum was deposited throughout the feature's length.

Figure 56:
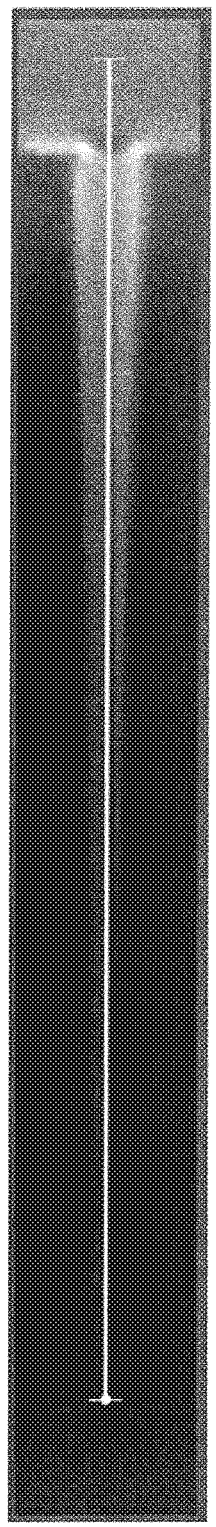
FIG. 56a is an SEM image showing the position of an EDS line scan in a feature G12.
FIG. 56b shows the EDS counts for the molybdenum intensity along the length of feature G12. The right side of the EDS intensity count in FIG. 56b corresponds to the top of feature G12 and the left side of the EDS intensity count corresponds to the bottom of feature G12.
Figure 56:
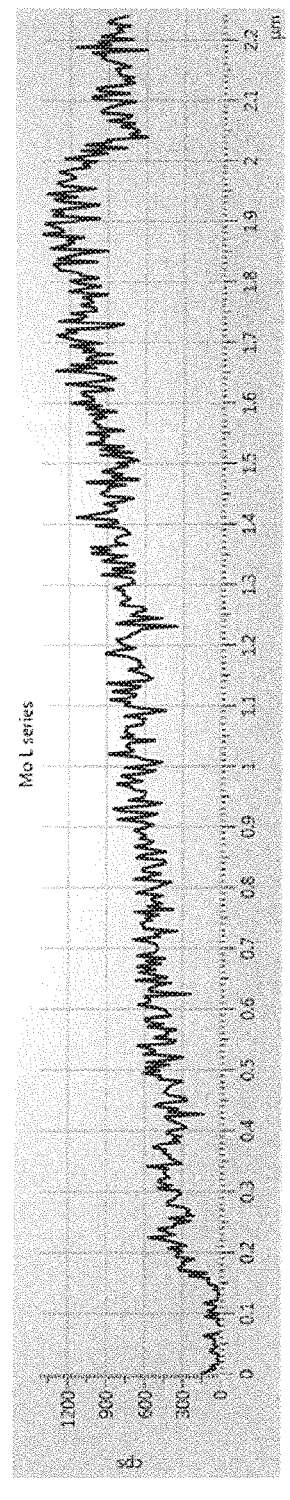

FIGS. 56*a* and 56*b* show the quantification of molybdenum (measured by EDS, data collected at 5 keV) as a function of the position within a feature. In particular, FIG. 56*a* is an SEM image showing the position of an EDS line scan in a feature G12, and FIG. 56*b* shows the EDS counts for the molybdenum intensity along the length of feature G12. The data illustrate the amount of molybdenum present along the length of the feature. The right side of the EDS intensity count in FIG. 56*b* corresponds to the top of feature G12 and the left side of the EDS intensity count corresponds to the bottom of feature G12. This molybdenum film was not broken during sample cleave.

Figure 57:
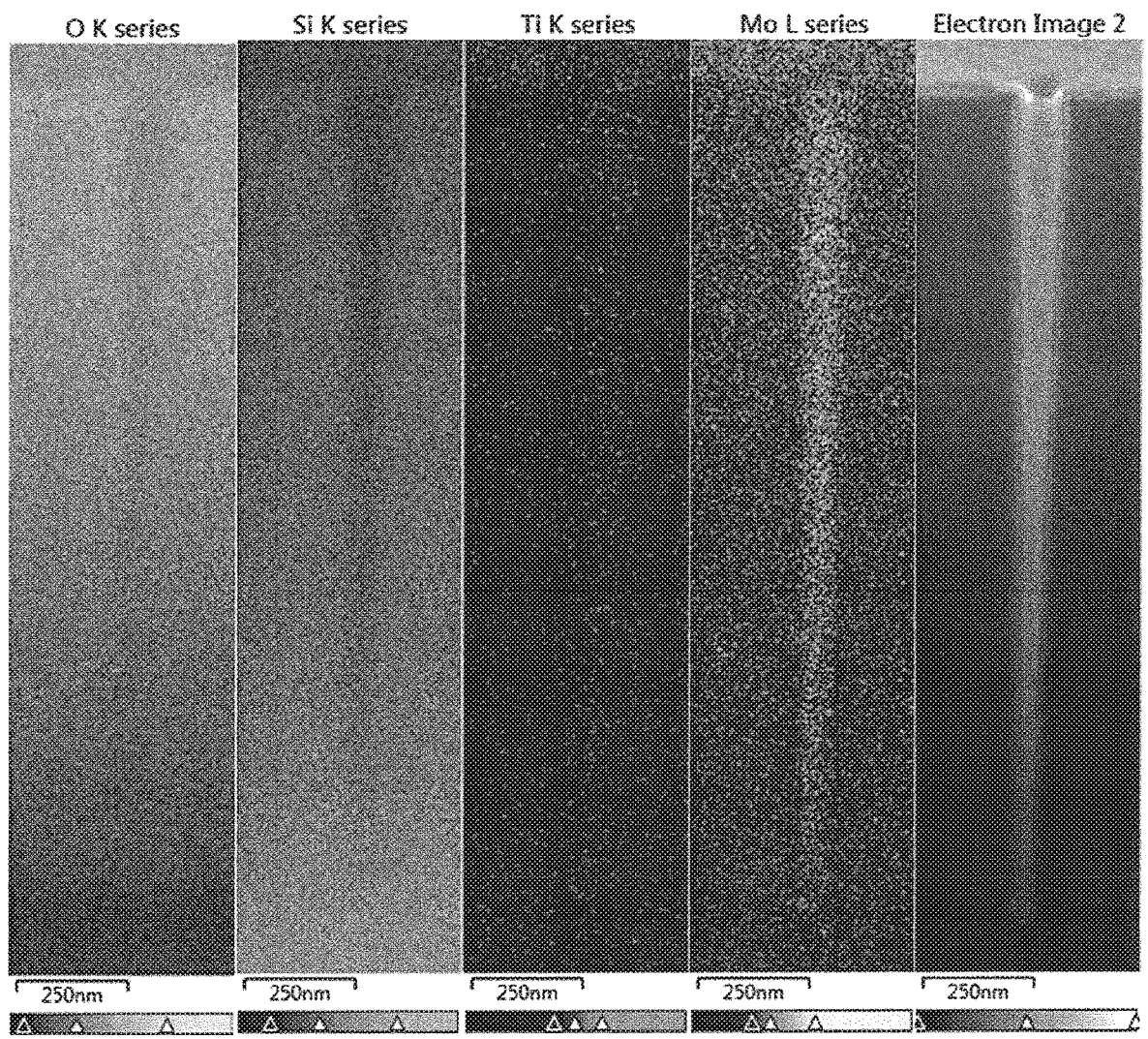
FIG. 57 illustrates the quantification of oxygen, silicon, titanium, and molybdenum (measured by EDS, data collected at 15 keV) within a rectangle covering a whole feature G13 (SEM image provided on far right of FIG. 57).
Figure 58:
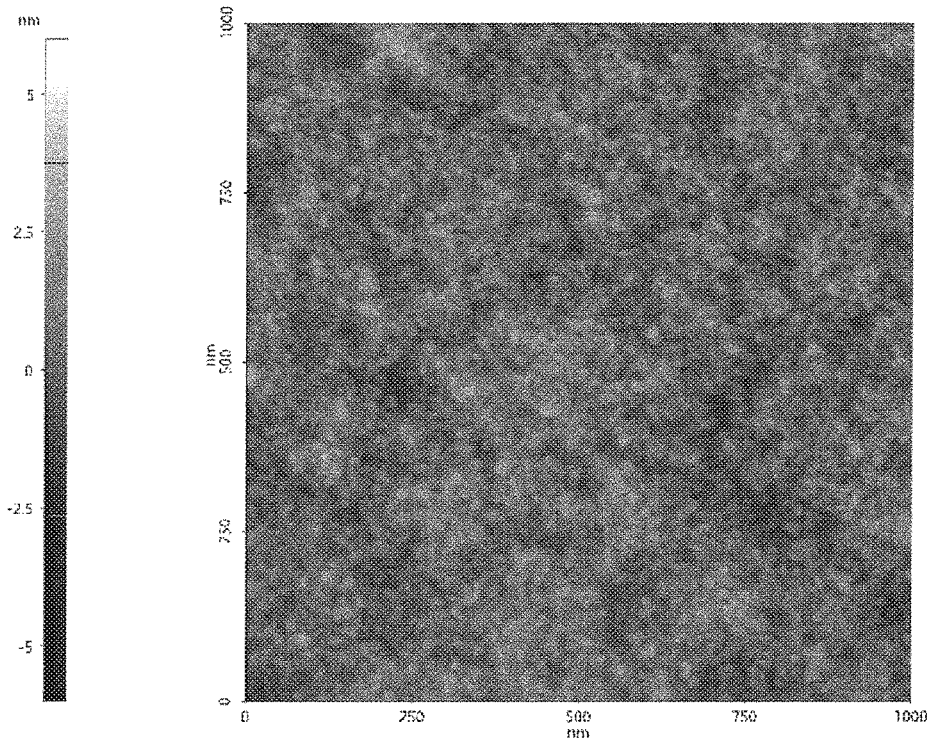
FIG. 58a (right side) provides the AFM map of a 1 m square area of a deposited Mo film, showing that the deposited film was very smooth.
FIG. 58b is a histogram showing the distribution of pixels by height.
Figure 58:
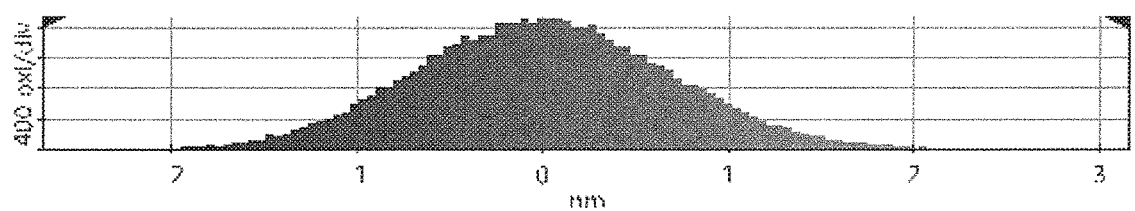

FIG. 57 shows the quantification of oxygen, silicon, titanium, and molybdenum (measured by EDS, data collected at 15 keV) within a rectangle covering a whole feature G13 (SEM image provided on far right of FIG. 57), which illustrates how the strong signal of molybdenum was somewhat constant within the whole feature G13. The strong molybdenum signal "shadows" the silicon and oxygen signals, which come from the silica substrate. The silica substrate had been coated with a 50 Å TiN liner, and the titanium was analyzed to provide confirmation that the analysis was as sensitive as desired. This pattern of thickness across the feature G13 with a 20:1 aspect ratio was consistent with a ALD process with some variations in film thickness.

FIG. 58*a* (right side) provides the AFM map of a 1 μm square area of a deposited Mo film on a top surface of a sample, showing that the deposited film was very smooth. FIG. 58*a* (left side) shows the palette of colors used to illustrate the height of each pixel of the AFM map. FIG. 58*b* is a histogram showing the distribution of pixels by height. The RMS roughness on that sample was 0.703 nm, which means the RMS roughness was 2.30% of the film thickness. Four additional 1 m square areas were similarly analyzed (data not shown) and each provided an RMS roughness of 0.721 nm (2.36%), 0.698 nm (2.29%), 0.687 nm (2.25%) and 0.713 nm (2.34%), respectively.

Example 1H: ALD Under Conformal and Super-Conformal Growth Conditions VII: Conformal ALD Growth Capable of Depositing an Extremely Smooth Film and Filling a Feature with an Un-Detectable Seam ALD was performed over the course of 375 super-cycles at 275° C. combining conformal growth cycles and super-conformal growth cycles as provided herein (referred to herein as "growth conditions VII"). Each super-cycle consisted of three consecutive conformal cycles followed by one super-conformal cycle.

Each conformal cycle consisted of:
1. a 1-second exposure of $MoCl_5$ (delivered by vapor-draw, while held at 120° C. (corrected temperature), which resulted in a pressure spike of 0.018-0.022 Torr),
2. followed by a 10-second purge with 20 sccm (standard cubic centimeter per minute) of nitrogen,
3. a 3-second exposure CHD (delivered by bubbling nitrogen in a CHD cylinder, which was heated to 50° C.),
4. followed by a 10-second purge with 20 sccm of nitrogen.

Each super-conformal cycle consisted of:
1. a 1-second exposure of $MoCl_5$ (delivered by vapor-draw, while held at 120° C. (corrected temperature), which resulted in a pressure spike of 0.018-0.022 Torr),
2. followed by a 30-second purge with 20 sccm of nitrogen,
3. a 3-second exposure of CHD (delivered by bubbling nitrogen in a CHD cylinder, which was heated to 50° C.),
4. followed by a 30-second purge with 20 sccm of nitrogen.

Two zones were seen in the deposition reactor: one where no growth was observed on the coupons serving as the substrate (etch/desorption was greater than deposition), and one where growth was observed on the coupons (deposition was greater than etch/desorption). The film thickness was homogenous within the area where growth was observed, and the film was 35-43 nm thick (growth rate 0.93-1.15 Å/super-cycle) with a resistivity of 330-430 μΩ·cm. Conformal growth was observed for the substrate with features placed in the zone where growth was observed. SEM images were taken of various features after deposition as shown in FIGS. 59-63.

Figure 59:
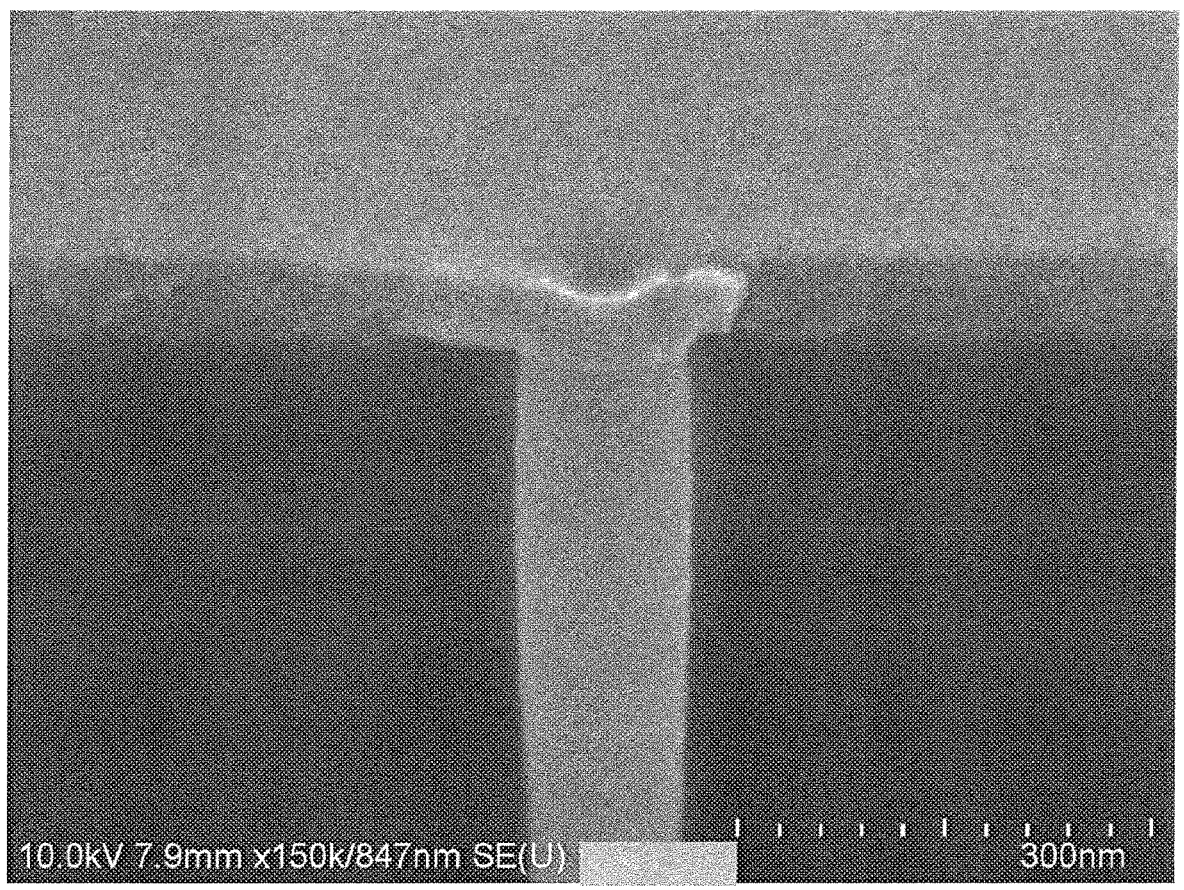
FIG. 59 provides an SEM image of a top portion of feature H1, at 150 K magnification, tilted view, showing that a thick molybdenum film was deposited in an upper portion of feature H1, and outside the feature H1. This molybdenum film was not broken during sample cleave.
Figure 60:
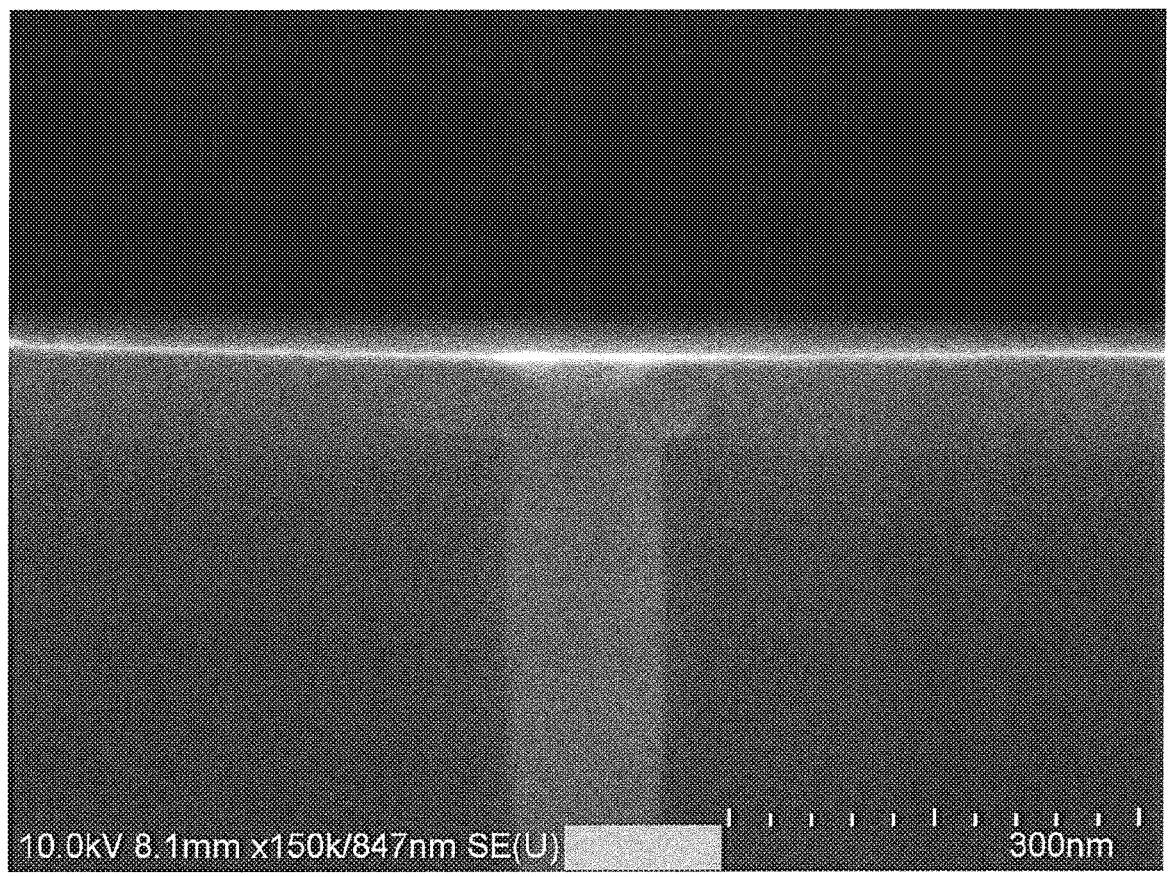
FIG. 60 provides an SEM image of a top portion of feature H2, at 150 K magnification, perpendicular view, showing that a thick molybdenum film was deposited in an upper portion of feature H2, and outside the feature H2. This molybdenum film was not broken during sample cleave.

FIGS. 59 and 60 show that a thick molybdenum film was deposited at an upper portion of features H1 and H2, respectively, and outside the features H1 and H2, respectively, where deposition was greater than etch/desorption.

Figure 61:
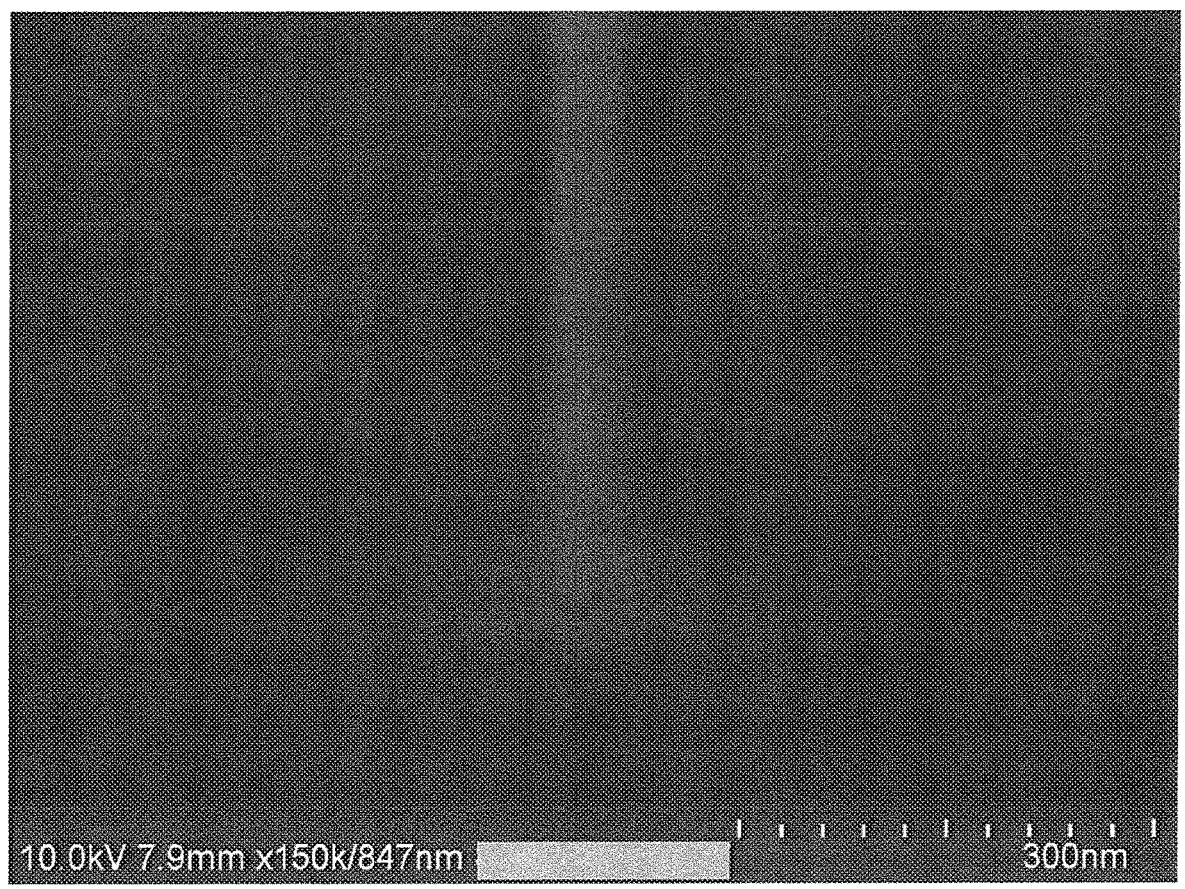
FIG. 61 provides an SEM image of a bottom portion of feature H3, at 150 K magnification, tilted view, showing that a thick molybdenum film was deposited in a lower portion of feature H3. This molybdenum film was not broken during sample cleave.
Figure 62:
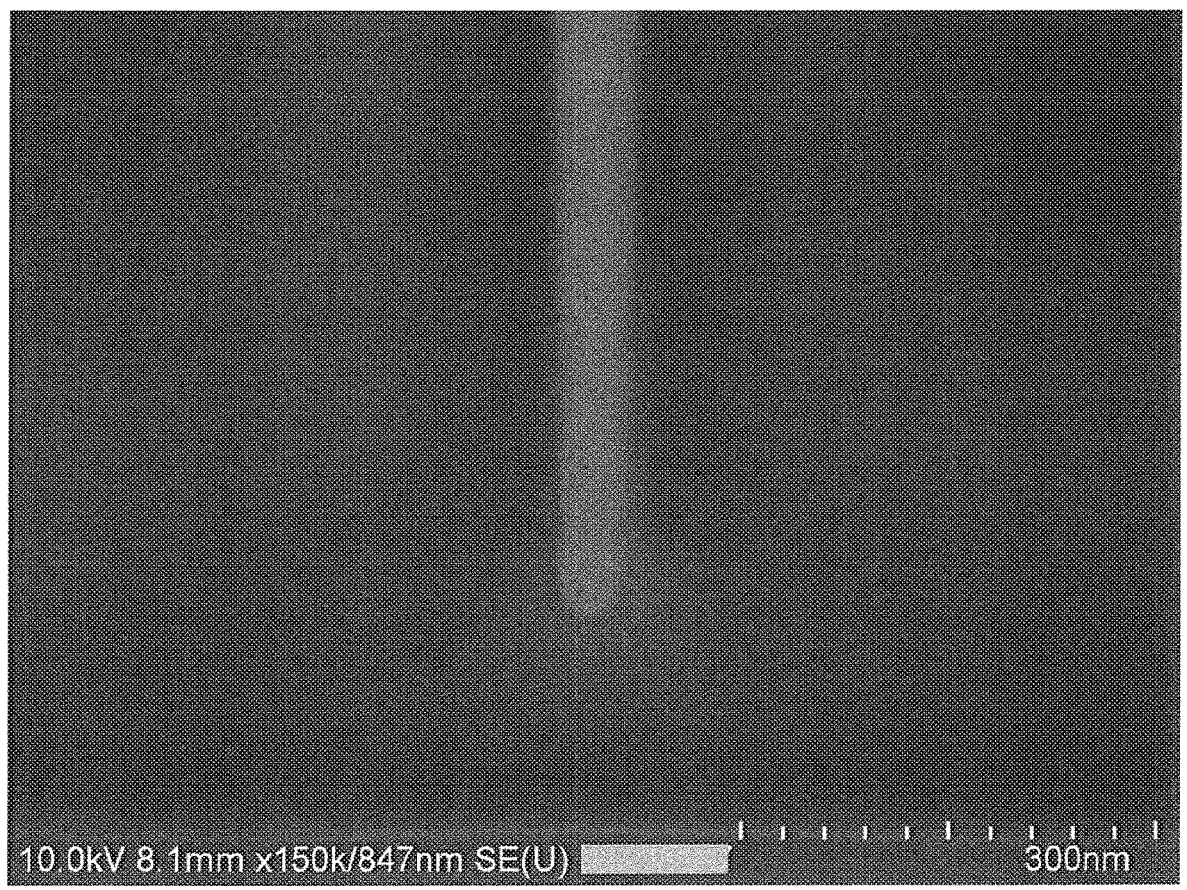
FIG. 62 provides an SEM image of a bottom portion of feature H4, at 150 K magnification, perpendicular view, showing that a thick molybdenum film was deposited in a lower portion of a feature. This molybdenum film was not broken during sample cleave.

FIGS. 61 and 62 show that a thick molybdenum film was deposited at a lower portion of features H3 and H4, respectively, where deposition was greater than etch/desorption.

Figure 63:
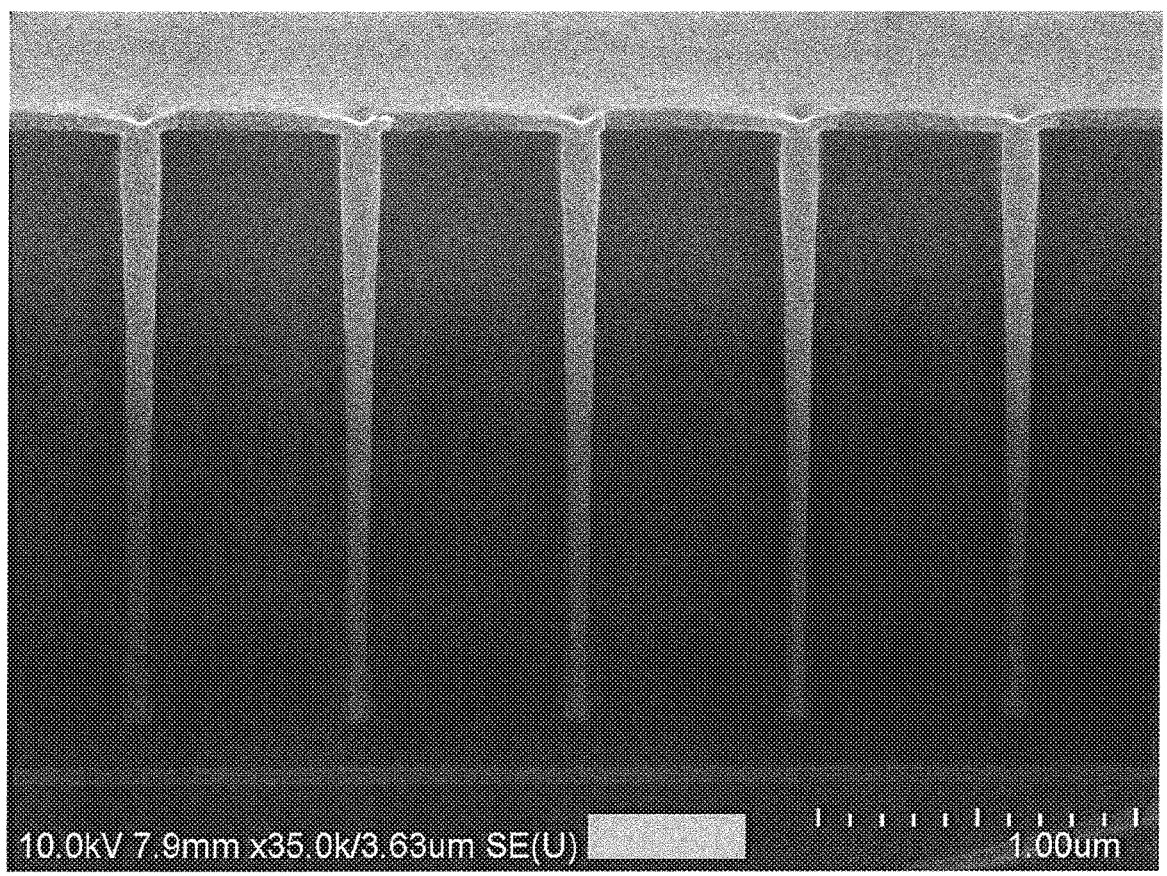
FIG. 63 provides an SEM image of entire lengths of respective features H5, H6, H7, H8, and H9 (from left to right), at 35 K magnification, tilted view, showing that a thick molybdenum film was deposited throughout the features' lengths. No molybdenum film from the features was broken during sample cleave.

FIG. 63 shows that a molybdenum film was deposited in features H5, H6, H7, H8, and H9 (from left to right). FIG. 63 illustrates how the amount of molybdenum within a feature varies from top to bottom, showing that a thick film of molybdenum was deposited throughout the feature's length. The fact that it was not possible to find a feature with a broken molybdenum film after the cleave indicates that the molybdenum deposits were solid, and may be be seam-free.

The "funnel-like" shape seen on the upper-part of the molybdenum deposits in FIGS. 59 and 63 does not mean that a seam extended all the way down the features. The "funnel-like" shape may be completely filled with molybdenum with more super-cycles (consisting of conformal growth cycles and super-conformal growth cycles) of molybdenum deposition, which can lead to a fill with a flat top surface.

Figure 64:
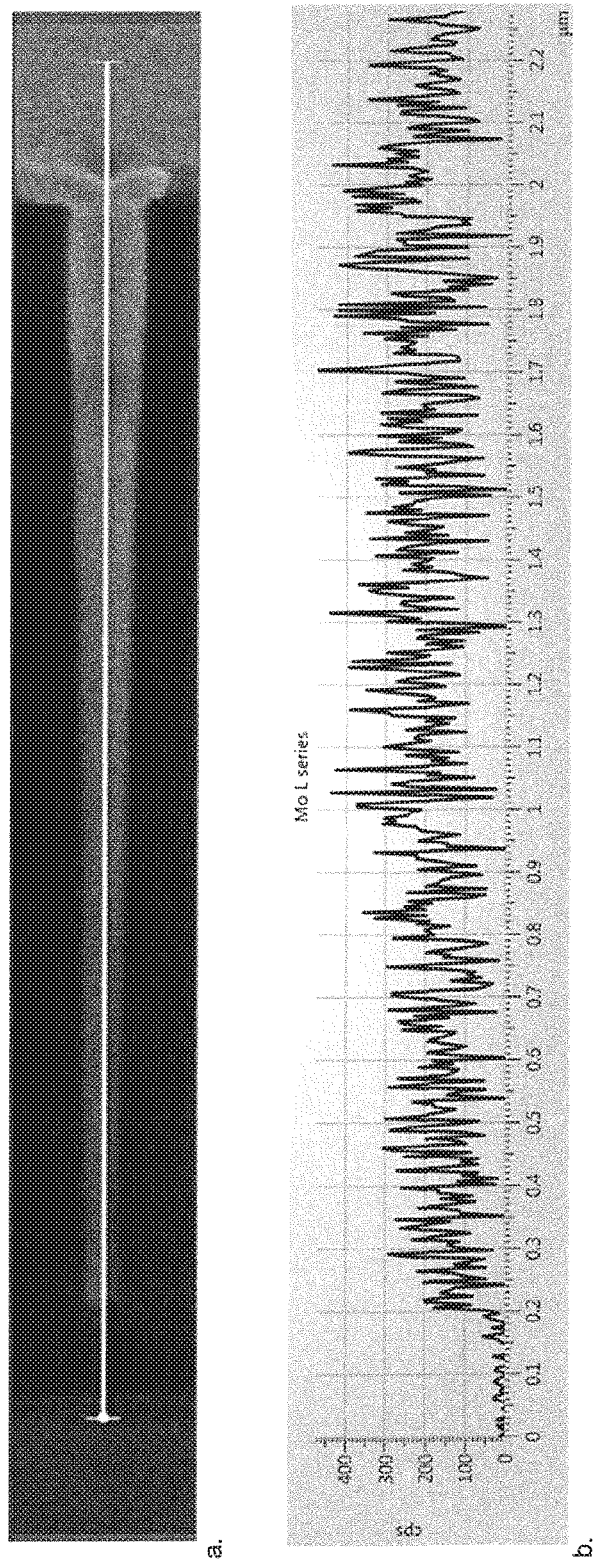
FIG. 64a is an SEM image showing the position of an EDS line scan in a feature H10.
FIG. 64b shows the EDS counts for the molybdenum intensity along the length of feature H10. The right side of the EDS intensity count in FIG. 64b corresponds to the top of feature H10 and the left side of the EDS intensity count in FIG. 65b corresponds to the bottom of feature H10. This molybdenum film was not broken during sample cleave.

FIGS. 64a and 64b show the quantification of molybdenum (measured by EDS, data collected at 5 keV) as a function of the position within a feature. In particular, FIG. 64a is an SEM image showing the position of an EDS line scan in a feature H10, and FIG. 64b shows the EDS counts for the molybdenum intensity along the length of feature H10. The data illustrates how the amount of molybdenum is almost constant at all depths within the feature.

Figure 65:
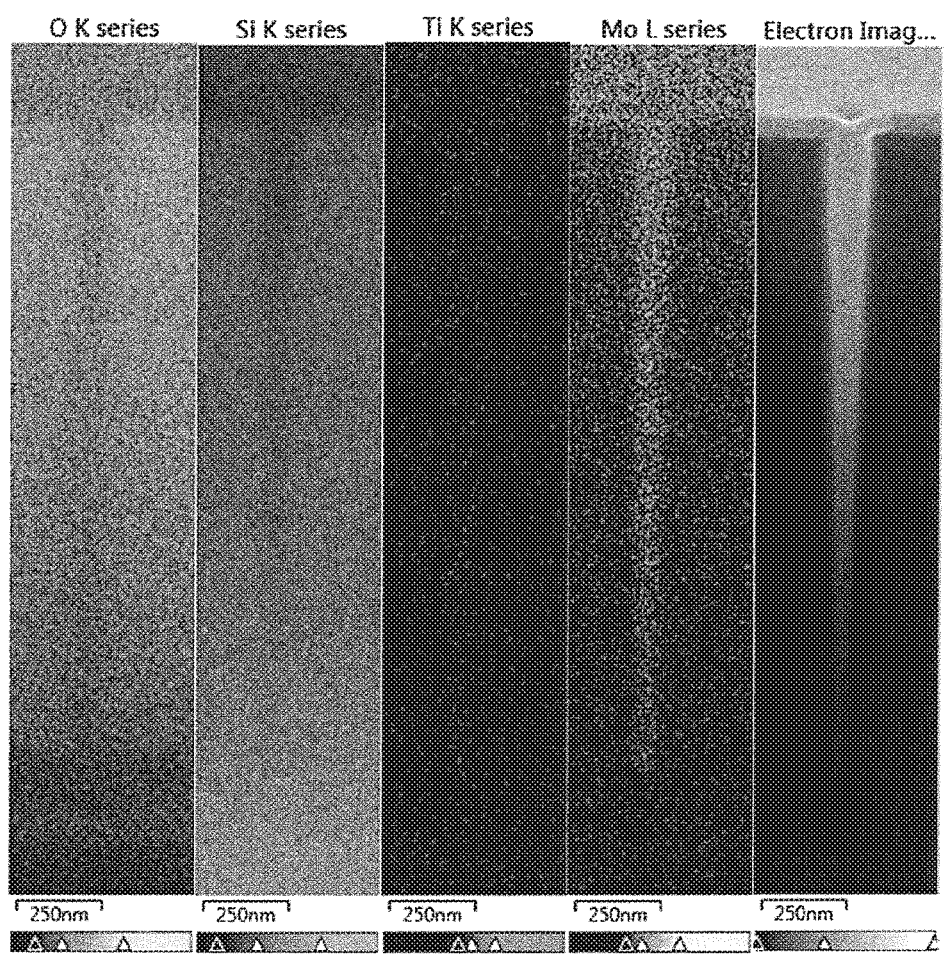
FIG. 65 illustrates the quantification of oxygen, silicon, titanium, and molybdenum (measured by EDS, data collected at 15 keV) within a rectangle covering a whole feature H11 (SEM image provided on far right of FIG. 65).
Figure 66:
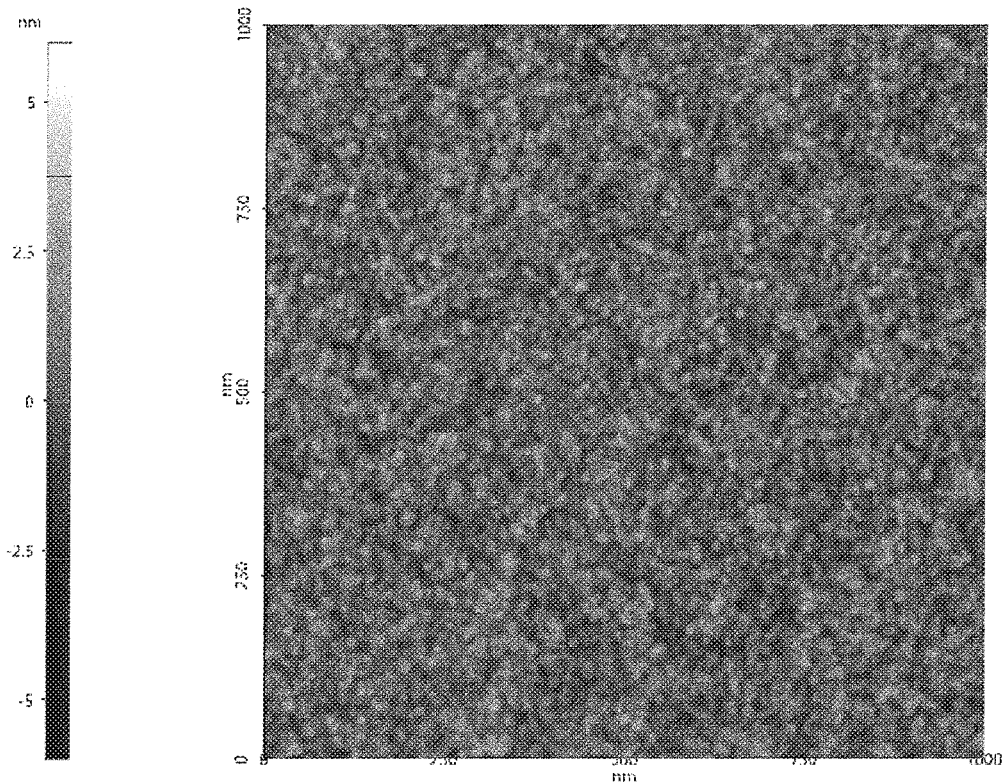
FIG. 66a (right side) provides the AFM map of a 1 μm square area of a deposited Mo film, showing that the deposited film was very smooth.
FIG. 66b is a histogram showing the distribution of pixels by height.
Figure 66:
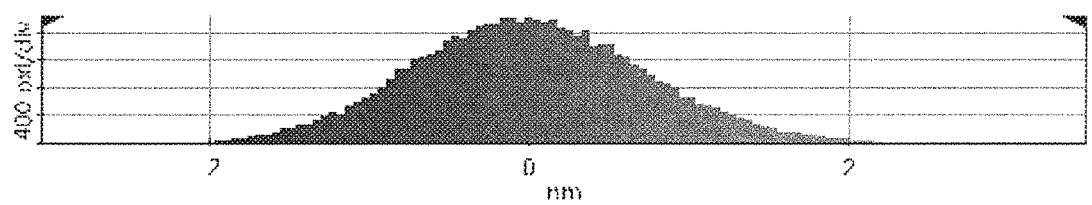

FIG. 65 shows the quantification of oxygen, silicon, titanium, and molybdenum (measured by EDS, data collected at 15 keV) within a rectangle covering a whole feature H11 (SEM image provided on far right of FIG. 65), which illustrates how the strong signal of molybdenum is somewhat constant within the whole feature H11. The strong molybdenum signal "shadows" the silicon and oxygen signals, which come from the silica substrate. The silica substrate had been coated with a 50 Å TiN liner, and the titanium was analyzed to provide confirmation that the analysis was as sensitive as desired. This pattern of thickness across the feature H11 with a 20:1 aspect ratio, and the absence of an area with weaker molybdenum signal at the middle of the filled feature H11 was consistent with a ALD process capable of filling a feature with an undetectable seam.

FIG. 66a (right side) provides the AFM map of a 1 μm square area of a deposited Mo film on a top surface of a sample, showing that the deposited film was very smooth. FIG. 66a (left side) shows the palette of colors used to illustrate the height of each pixel of the AFM map. FIG. 66b is a histogram showing the distribution of pixels by height. The RMS roughness on that sample was 0.745 nm, which means the RMS roughness was 1.91% of the film thickness. Four additional 1 m square areas were similarly analyzed (data not shown) and each provided an RMS roughness of 0.741 nm (1.90%), 0.744 nm (1.91%), 0.729 nm (1.87%) and 0.725 nm (1.86%), respectively.

Example 11: ALD Under Super-Conformal Growth Conditions VIII: Super-Conformal ALD Growth of Molybdenum Film within Substantially Entire Depth of Features, with Significantly Less Growth Outside Features ALD was performed over the course of 300 cycles at 280° C. under growth conditions as provided herein (referred to herein as "growth conditions VII"). Each cycle consisted of:
1. a 1-second exposure of $MoCl_5$ (delivered by vapor-draw, while held at 110° C. (corrected temperature), which resulted in a pressure spike of 0.002-0.003 Torr),
2. followed by a 2-second purge with 20 sccm of nitrogen,
3. a 3-second exposure of CHD (delivered by bubbling nitrogen in a CHD cylinder, which was heated to 50° C.),
4. followed by a 2-second purge with 20 sccm of nitrogen.

Two zones were seen in the deposition reactor: one where no growth was observed on the coupons serving as the substrate (etch/desorption was greater than deposition), and one where growth was observed on the coupons (deposition was greater than etch/desorption). The film had a maximum thickness of 10-11 nm close to the border separating the zone of film growth and the zone of no film growth (growth rate 0.34-0.37 Å/cycle) with a resistivity of 140-146 μΩ·cm. A molybdenum film with nearly constant thickness was deposited throughout a feature, with significantly less molybdenum deposition outside the features. SEM images were taken of various features after deposition as shown in FIGS. 67-69.

Figure 67:
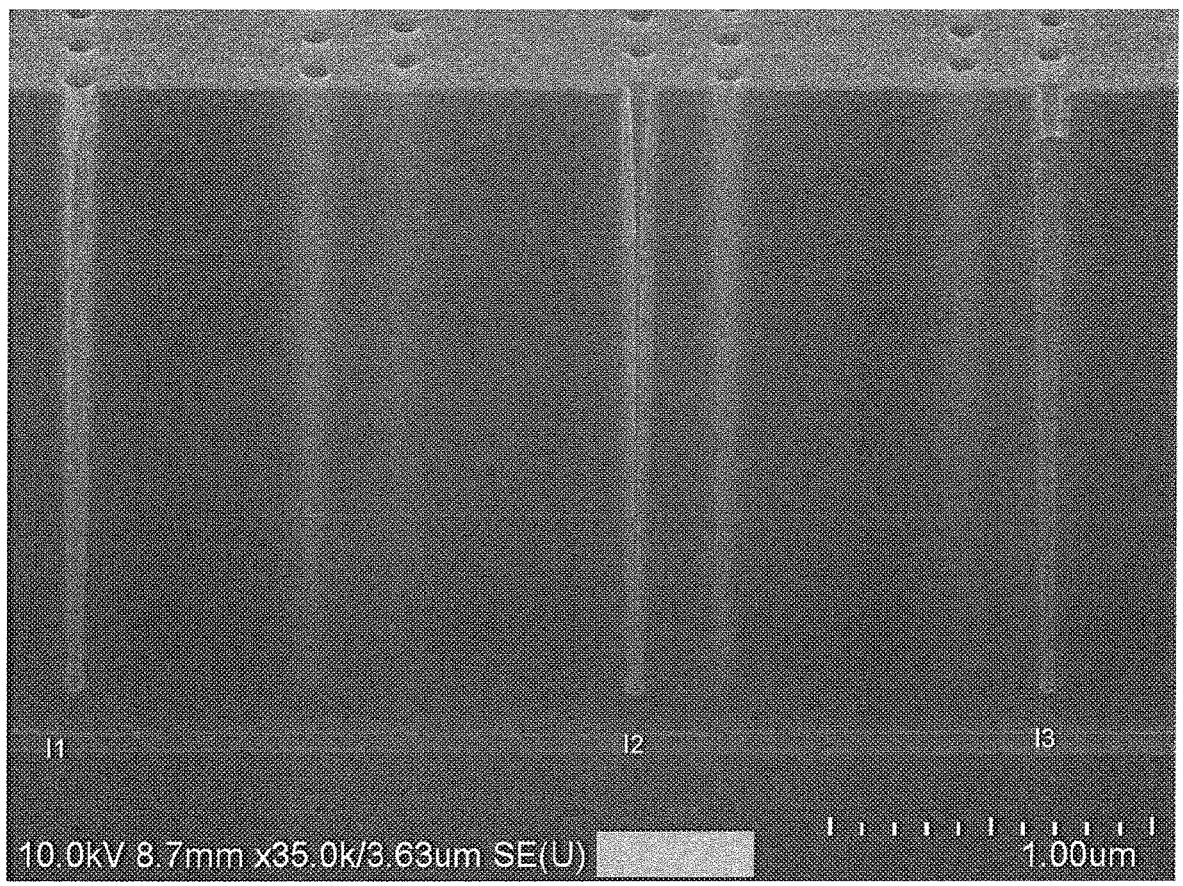
FIG. 67 provides an SEM image of entire lengths of respective features I1, I2, and I3 (left to right), at 35 K magnification, tilted view, showing that a thick molybdenum film was deposited throughout the feature's length, and that significantly less molybdenum was deposited outside the feature. The molybdenum film of the left feature I1 was not broken during sample cleave, and the molybdenum films of the right feature I3 and middle feature I2 were broken during sample cleave.

FIG. 67 shows that a thick molybdenum film was deposited throughout the length of features I1, I2, and I3 (left to right), where deposition was greater than etch/desorption. Additionally, these pictures show that the molybdenum film thickness outside the features I1, I2, and I3 was significantly thinner compared with the film thickness inside the features I1, I2, and I3. Finally, it is visible that the transition between thick film inside a feature and thin film outside the feature is abrupt.

Figure 68:
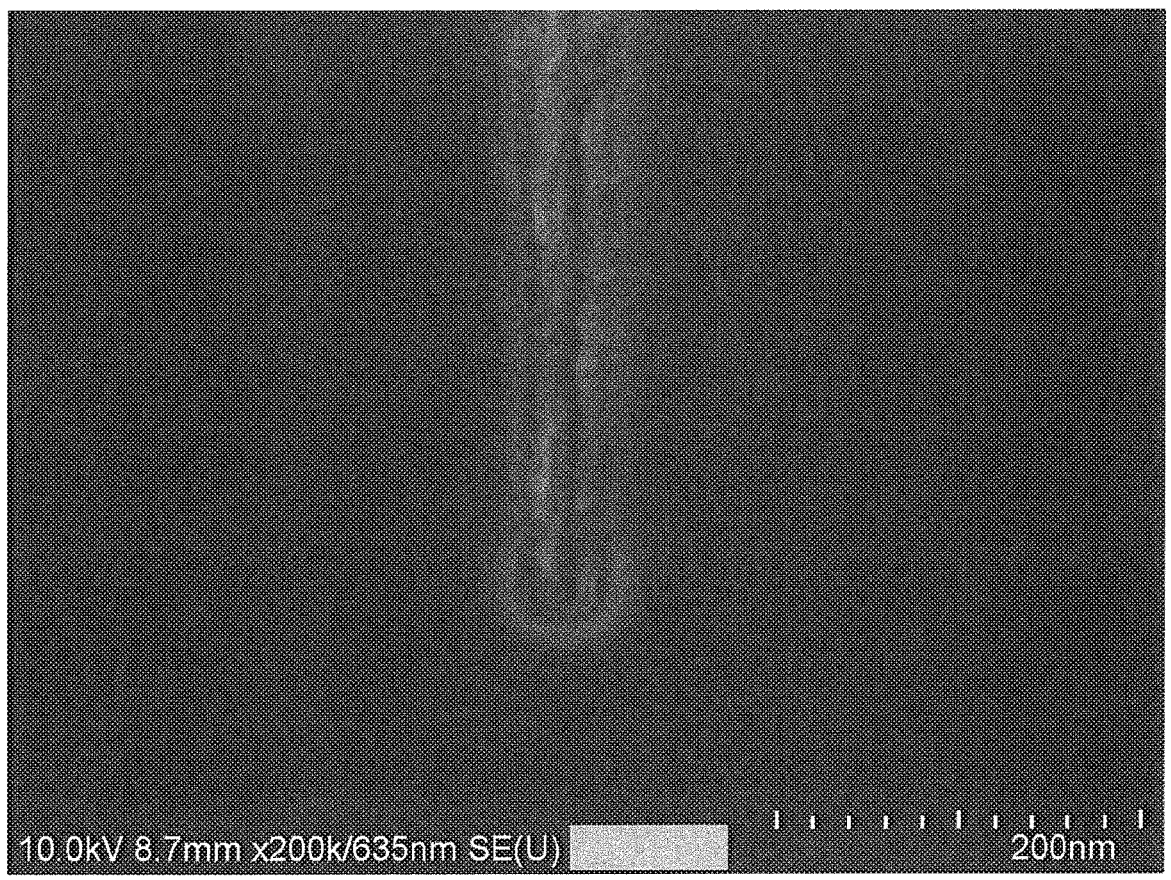
FIG. 68 provides an SEM image of a bottom portion of feature I4, at 200 K magnification, tilted view, showing that a thick molybdenum film was deposited in a lower portion of feature I4. This molybdenum film was not broken during sample cleave.

FIG. 68 shows that a thick molybdenum film was deposited at the bottom of a feature I4, where deposition was greater than etch/desorption.

Figure 69:
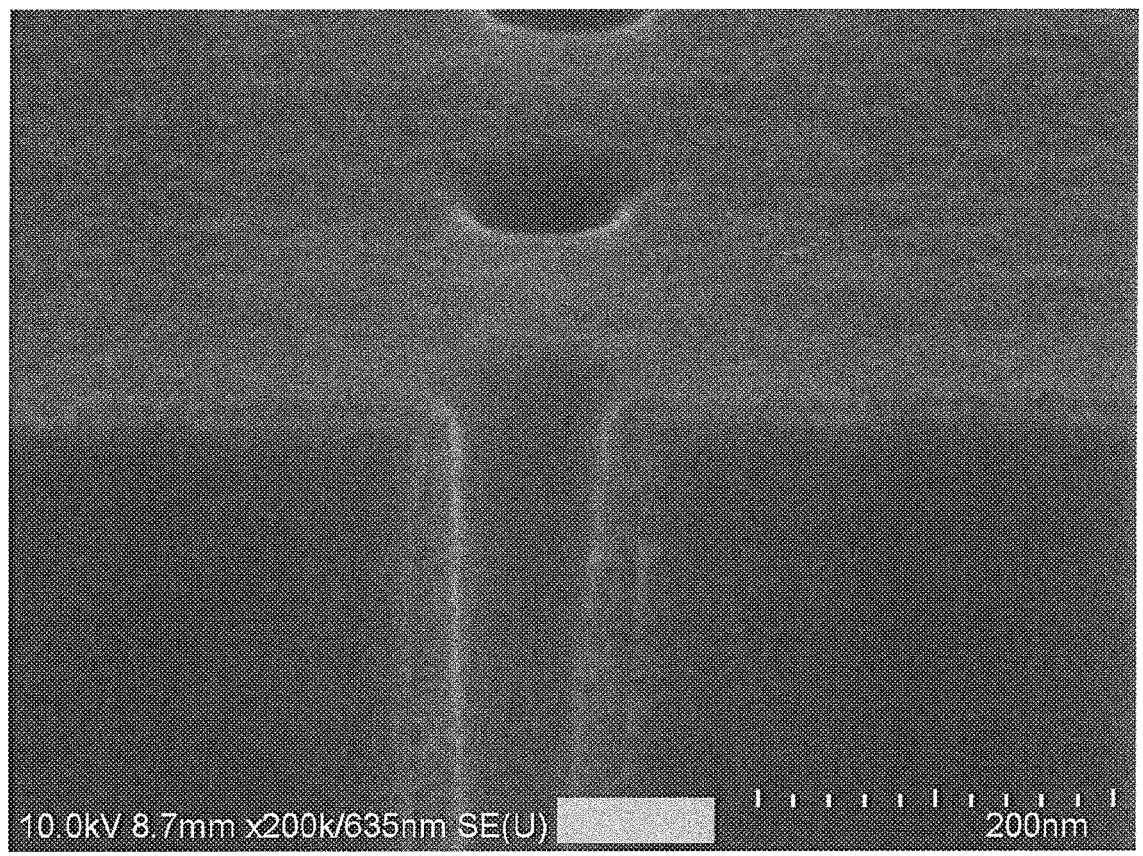
FIG. 69 provides an SEM image of a top portion of feature I5, at 200 K magnification, tilted view, showing that a thick molybdenum film was deposited in an upper portion of feature I5, with significantly less molybdenum deposition outside the feature I5. This molybdenum film was not broken during sample cleave.

FIG. 69 shows the abrupt transition between a thick film inside a feature I5 and the thin film outside the feature I5. The film thickness outside the feature I5 is less than 10-nm thick, while the films in the feature I5 is more than 30-nm thick, and the transition occurs over a distance shorter than 60 nm.

Figure 70:
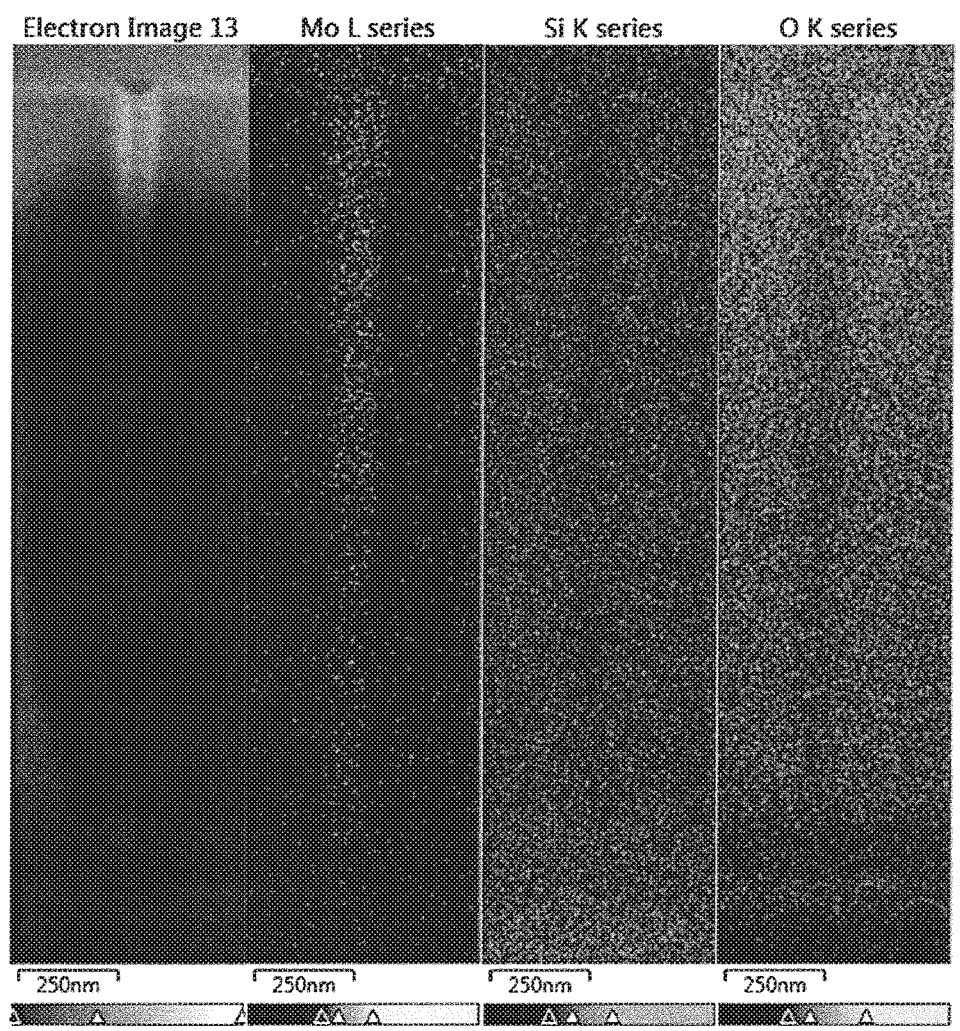
FIG. 70 illustrates the quantification of molybdenum, silicon, and oxygen (measured by EDS, data collected at 15 keV) within a rectangle covering a whole feature I6 (SEM image provided on far left of FIG. 70).

FIG. 70 shows the quantification of molybdenum, silicon, and oxygen (measured by EDS, data collected at 15 keV) within a rectangle covering a whole feature I6 (SEM image provided on far left of FIG. 70), which illustrates how the strong signal of molybdenum is somewhat constant within the whole feature, and is significantly weaker outside the feature. The strong molybdenum signal "shadows" the silicon and oxygen signals, which come from the silica substrate. The silica substrate had been coated with a 50 Å TiN liner, and the titanium was analyzed to provide confirmation that the analysis was as sensitive as desired. This pattern of thickness across the feature I6 with a 20:1 aspect ratio was consistent with a ALD process capable of depositing molybdenum homogenously within a feature, while depositing significantly molybdenum outside the features.

Example 1J: ALD Under Conformal Growth Conditions IX: Conformal ALD Growth of Molybdenum Film in Very Small Features ALD was performed over the course of 200 cycles at 290° C. under conformal growth conditions as provided herein (referred to herein as "conformal growth conditions IX"). In this example, tiny features with a depth of approx. 100 nm and a width of approx. 30 nm were used to demonstrate that conformal growth could be achieved in tiny features. Each cycle consisted of:
1. a 1-second exposure of $MoCl_5$ (delivered by vapor-draw, while held at 110° C. (corrected temperature), which resulted in a pressure spike of 0.001-0.002 Torr),
2. followed by a 1.5-second purge with 20 sccm of nitrogen,
3. a 3-second exposure of CHD (delivered by bubbling nitrogen in a CHD cylinder, which was heated to 50° C.),
4. followed by a 1.5-second purge with 20 sccm of nitrogen.

Two zones were seen in the deposition reactor: one where no growth was observed on the coupons serving as the substrate (etch/desorption was greater than deposition), and one where growth was observed on the coupons (deposition was greater than etch/desorption). The film was 4.1-8.4 nm thick within the area where growth was observed (growth rate 0.21-0.41 Å/cycle) with a resistivity of 145-160 μΩ·cm. Conformal growth with some variations in film thickness was observed for the substrate with features placed in the area where growth was observed. An SEM image was taken of various features after deposition as shown in FIG. 71a.

Figure 71:
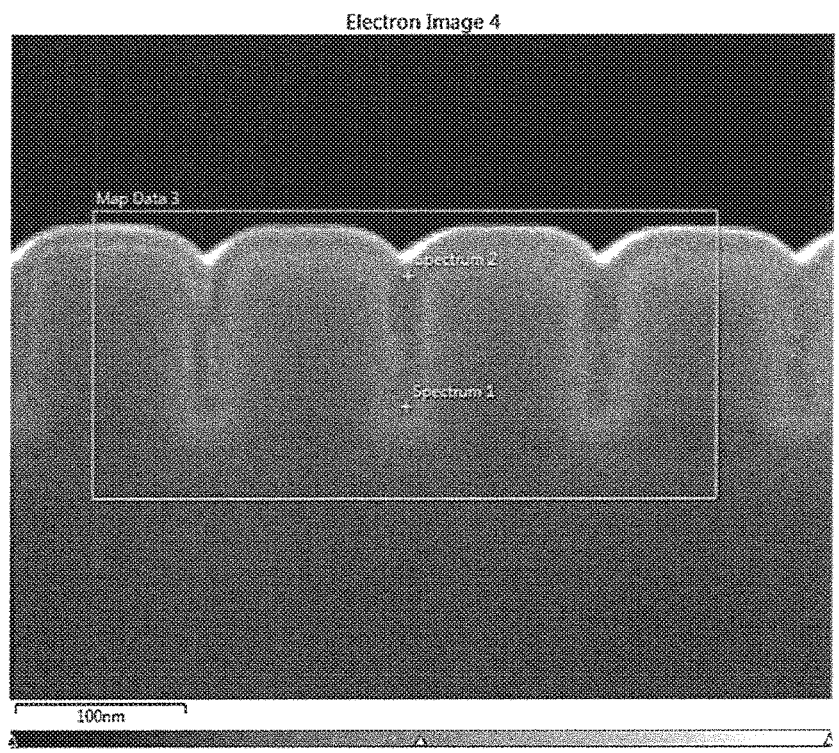
FIG. 71a provides an SEM image of three 100-nm deep features J1, J2, and J3 (from left to right inside white rectangle), at 350 K magnification, perpendicular view, showing that a molybdenum film was deposited throughout the features' lengths. This molybdenum film was not broken during sample cleave.
FIG. 71b illustrates the quantification of molybdenum (left), silicon (middle), and oxygen (right) measured by EDS (with an energy of 15 keV) within white rectangle covering whole features J1, J2, and J3.
Figure 71:
Figure 71:

FIG. 71a shows that a molybdenum film was deposited in features J1, J2, and J3 (from left to right inside white rectangel). FIG. 71a illustrates how the amount of molybdenum within features varies from top to bottom, showing that a film of molybdenum was deposited throughout the feature's length. The film profile within the features was consistent with conformal growth with some variations in film thickness.

FIG. 71b shows the quantifications of molybdenum (left), silicon (middle), and oxygen (right) measured by EDS (data collected at 15 keV) within white rectangle covering whole features J1, J2, and J3, which illustrates how the signal of molybdenum is constant within the features and outside the features. The strong molybdenum signal "shadows" the silicon and oxygen signals, which come from the silica substrate. This film profile across the small features J1, J2, and J3 (with a high aspect ratio and a 100-nm depth) was consistent with conformal growth with some variations in film thickness.

Example 1K: ALD Under Super-Conformal Growth Conditions X: Super-Conformal ALD Growth of Molybdenum Films within Small Features ALD was performed over the course of 300 cycles at 280° C. under growth conditions as provided herein (referred to herein as "growth conditions X"). In this example, smaller features with a depth of approx. 600 nm and a width of approx. 100 nm were used to demonstrate that super-conformality could be achieved in shallower features. Each cycle consisted of:
1. a 1-second exposure of $MoCl_5$ (delivered by vapor-draw, while held at 110° C. (corrected temperature), which resulted in a pressure spike of 0.002-0.003 Torr),
2. followed by a 2-second purge with 20 sccm of nitrogen,
3. a 3-second exposure of (CHD) (delivered by bubbling nitrogen in a CHD cylinder, which was heated to 50° C.),
4. followed by a 2-second purge with 20 sccm of nitrogen.

Two zones were seen in the deposition reactor: one where no growth was observed on the coupons serving as the substrate (etch/desorption was greater than deposition), and one where growth was observed on the coupons (deposition was greater than etch/desorption). The film had a maximum thickness of 10-11 nm close to the border separating the zone of film growth and the zone of no film growth (growth rate 0.34-0.37 Å/cycle) with a resistivity of 140-146 µΩ·cm. The location of the coupons could be chosen in such a way to get deposition only at the bottom of the features (super-conformal growth). Molybdenum was detected only in a lower portion of the features indicating that super-conformal growth occurred, where molybdenum was detected in approximately 50-75% of the feature, as measured starting from the bottom of the feature (i.e., in lower portion of feature). An SEM image was taken of various features after deposition as shown in FIG. 72.

Figure 72:
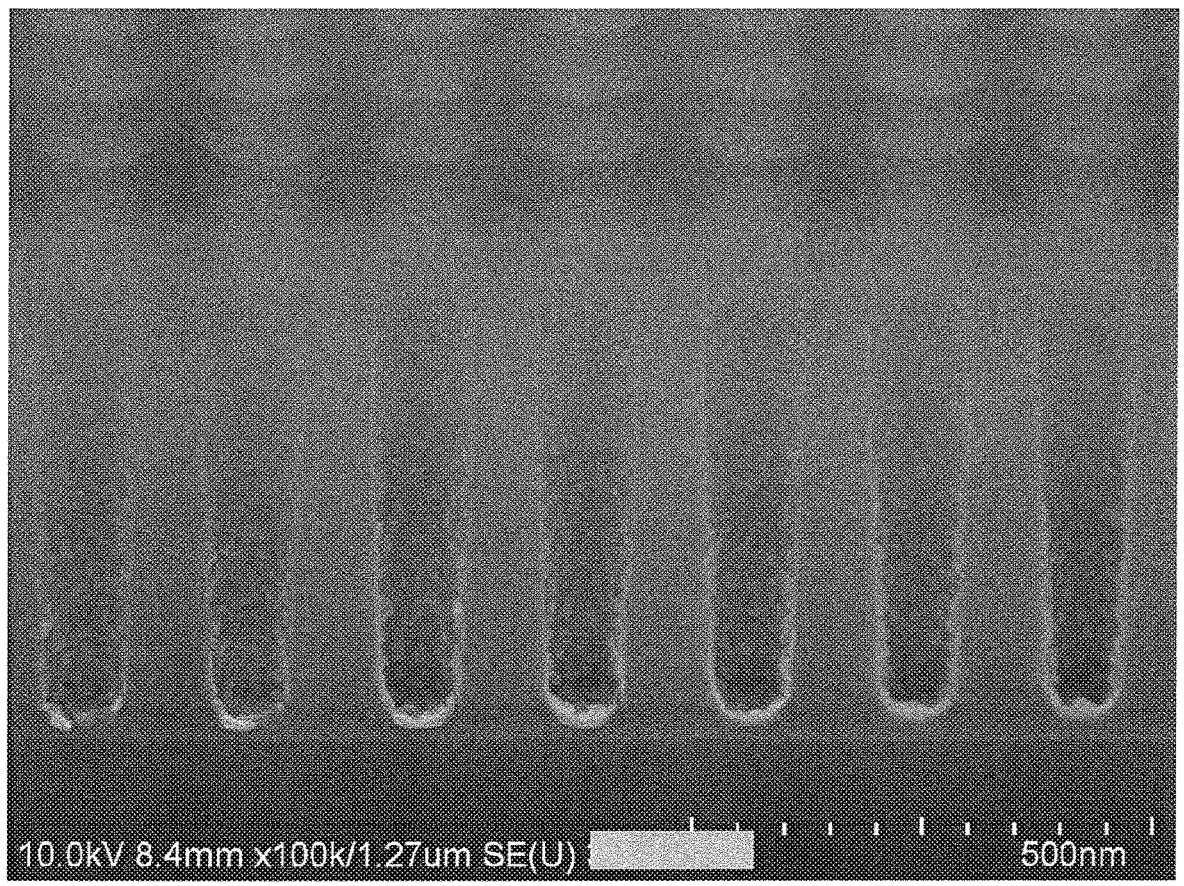
FIG. 72 provides an SEM image of an area with 600-nm deep respective features K1, K2, K3, K4. K5, K6, and K7 (from left to right), at 100 K magnification, tilted view, showing that a molybdenum film was deposited in a lower portion of the features.

FIG. 72 shows that a molybdenum film was deposited in features K1, K2, K3, K4, K5, K6, and K7 (from left to right). FIG. 72 illustrates how the amount of molybdenum within a feature varies from an upper portion to a lower portion of the feature and shows a molybdenum film was deposited in approximately 50-75% of the features, as measured starting from the bottom of the feature (i.e., in lower portion of feature). The oxide liner of this substrate impacted the nucleation of the molybdenum growth and led to a grainy film instead of a smooth film.

Example 2: $MoCl_5$ Etching of Molybdenum Films at 275° C.

An experiment was performed over the course of 100 cycles at 275° C. under growth conditions as provided herein. Each cycle consisted of a 1-second exposure of $MoCl_5$ (delivered by vapor-draw, while held at 119° C. (corrected temperature)) followed by a 7-second purge with 20 sccm of nitrogen. Several coupons with a molybdenum film were placed in the reactor, where 37.2 nm molybdenum had previously been deposited. After the deposition was complete, the thickness of molybdenum films on the coupons had decreased and ranged from 7.6 nm to 37.1 nm over the different coupons. The closer the coupons were to the reactor inlet, the thinner the molybdenum films were, which indicated that a thickness ranging between 0.1 nm and 29.6 nm had been etched away by $MoCl_5$. The closer the coupons were to the reactor inlet (where the $MoCl_5$ concentration was greatest), the stronger the etching was. The etching per cycle ranged from 0.01 Å/cycle to 2.96 Å/cycle.

Example 3: Selective ALD Film Growth Between Two or More Substrates

Example 3A: Selective Mo Film Growth on TiN, Mo and $SiO_2$ Substrates

ALD was performed over the course of 300 cycles at 275° C. under growth conditions as provided herein. Each cycle consisted of:
1. a 1-second exposure of $MoCl_5$ (delivered by vapor-draw, while held at 116° C. (corrected temperature)),
2. followed by a 10-second purge with 20 sccm of nitrogen,
3. a 3-second exposure of CHD (delivered by vapor draw from the CHD cylinder, which was heated to 65° C.),
4. followed by a 10-second purge by 20 sccm of nitrogen.

Two zones were seen in the deposition reactor: one where no growth was observed (etch/desorption was greater than deposition), and one where growth was observed (deposition was greater than etch/desorption). Three coupons with different substrates were placed in the zone where deposition was observed, a $SiO_2$ (silica) coupon, a TiN coupon, and a Mo coupon. The Mo coupon comprised a silica substrate with 22.7 nm molybdenum deposited thereon. After the deposition was completed, thickness of molybdenum was 0 nm on the $SiO_2$ coupon (measured range of −0.1 nm to 0.2 nm), 10.5 nm on the TiN coupon, and 31.3 nm on the Mo coupon, which corresponds to 8.6 nm of Mo freshly deposited on the Mo coupon. The growth/cycle was 0 Å/cycle on the $SiO_2$ coupon, 0.35 Å/cycle on the TiN coupons, and 0.29 Å/cycle on the Mo coupon.

Example 3B: Selective Mo Film Growth on TiN, Mo and $SiO_2$ Substrates

ALD was performed over the course of 300 cycles at 275° C. under growth conditions as provided herein. Each cycle consisted of:
1. a 1-second exposure of $MoCl_5$ (delivered by vapor-draw, while held at 117° C. (corrected temperature)),
2. followed by a 5-second purge with 20 sccm of nitrogen,
3. a 3-second exposure of CHD (delivered by vapor draw from the CHD cylinder, which was heated to 65° C.), 4. followed by a 10-second purge with 20 sccm of nitrogen.

Two zones were seen in the deposition reactor: one where no growth was observed (etch/desorption was greater than deposition), and one where growth was observed (deposition was greater than etch/desorption). Three coupons with different substrates were placed in the zone where deposition was observed, a $SiO_2$ (silica) coupon, a TiN coupon, and a Mo coupon. The Mo coupon comprised a silica substrate with 22.7 nm molybdenum deposited thereon. After the deposition was complete, the thickness of molybdenum was 0 nm on the $SiO_2$ coupon (measured range of −0.8 nm to 1.3 nm, which corresponds to, within experimental error, no molybdenum deposited to very little molybdenum deposited), 10.8 nm on the TiN coupon, and 32.4-33.5 nm on the Mo coupon, which corresponds to 9.7-10.8 nm of Mo freshly deposited on the Mo coupon. The growth/cycle growth/cycle was 0 Å/cycle on the $SiO_2$ coupon, 0.36 Å/cycle on the TiN coupons, and 0.32-0.36 Å/cycle on the Mo coupon.

Example 3C: Selective Mo Film Growth on TiN, Mo and $SiO_2$ Substrates

ALD was performed over the course of 500 cycles at 285° C. under growth conditions as provided herein. Each cycle consisted of:
1. a 1-second exposure of $MoCl_5$ (delivered by vapor-draw, while held at 119° C. (corrected temperature)),
2. followed by a 2-second purge with 20 sccm of nitrogen,
3. a 3-second exposure of CHD (delivered by vapor draw from the CHD cylinder, which was heated to 65° C.),
4. followed by a 2-second purge with 20 sccm of nitrogen.

Two zones were seen in the deposition reactor: one where no growth was observed (etch/desorption was greater than deposition), and one where growth was observed (deposition was greater than etch/desorption). Three coupons with different substrates were placed in the zone where deposition was observed, a $SiO_2$ (silica) coupon, a TiN coupon, and a Mo coupon. The Mo coupon comprised a silica substrate with 9.2 nm molybdenum deposited thereon. After the deposition was complete, the thickness of molybdenum was 0 nm on the $SiO_2$ coupon (measured value of −0.8 nm, which corresponds to, within experimental error, no molybdenum deposited), 2.2 nm on the TiN coupon, and 31.6 nm on the Mo coupon, which corresponds to 22.4 nm of Mo freshly deposited on the Mo coupon. The growth/cycle was 0 Å/cycle on the $SiO_2$ coupon, 0.045 Å/cycle on the TiN coupons, and 0.45 Å/cycle on the Mo coupon.

Example 3D: Selective Mo Film Growth on TiN, Mo and $SiO_2$ Substrates

ALD was performed over the course of 300 cycles at 275° C. under growth conditions as provided herein. Each cycle consisted of:
1. a 1-second exposure of $MoCl_5$ (delivered by vapor-draw, while held at 119° C. (corrected temperature)),
2. followed by a 2-second purge with 20 sccm of nitrogen,
3. a 3-second exposure of CHD (delivered by vapor draw from the CHD cylinder, which was heated to 65° C.),
4. followed by a 2-second purge with 20 sccm of nitrogen.

Two zones were seen in the deposition reactor: one where no growth was observed (etch/desorption was greater than deposition), and one where growth was observed (deposition was greater than etch/desorption). Three coupons with different substrates were placed in the zone where deposition was observed, a $SiO_2$ (silica) coupon, a TiN coupon, and a Mo coupon. The Mo coupon comprised a silica substrate with 18.5 nm molybdenum deposited thereon. After the deposition was complete, the thickness of molybdenum was 0 nm on the $SiO_2$ coupon (measured range of −0.4 nm to 2.4 nm, which corresponds to, within experimental error, no molybdenum deposited to very little molybdenum deposited), 13.2 nm on the TiN coupon, and 29.1 nm on the molybdenum coupon, which corresponds to 10.6 nm Mo freshly deposited on the Mo coupon. The growth/cycle varied from 0.0 Å/cycle to 0.08 Å/cycle on the $SiO_2$ coupon, 0.44 Å/cycle on the TiN coupons, and 0.35 Å/cycle on the Mo coupon.

Example 3E: Selective Mo Film Growth on TiN, Mo and $SiO_2$ Substrates

This series of experiments consisted of depositions which had 300, 500, and 800 cycles at 275° C. Each cycle consisted of:
1. a 1-second exposure of $MoCl_5$ (delivered by vapor-draw, while held at 119° C. (un-corrected temperature)),
2. followed by a 2-second purge by 20 sccm of nitrogen,
3. a 3-second exposure of CHD (delivered by vapor draw from the CHD cylinder, which was heated to 65° C.),
4. followed by a 2-second purge by 20 sccm of nitrogen.

Coupons with a silica ($SiO_2$) surface, a TiN surface, and a molybdenum (Mo) surface (9.1 nm thick) were placed in the reactor.

After the 300-cycle deposition, the median thickness of deposited molybdenum was, respectively, 3.75 nm, 10.7 nm, and 12.5 nm on the silica coupon, the TiN coupon, and the molybdenum coupon. The measured thickness of molybdenum was 21.6 nm on the molybdenum substrate, which corresponded to 12.5 nm freshly deposited molybdenum.

After the 500-cycle deposition, the median thickness of deposited molybdenum was, respectively, 18.5 nm, 44.3 nm, and 42 nm on the silica coupon, the TiN coupon, and the molybdenum coupon. The measured thickness of molybdenum was 51.1 nm on the molybdenum substrate, which corresponded to 42 nm freshly deposited molybdenum.

After the 800-cycle deposition, the median thickness of deposited molybdenum was, respectively, 67.75 nm, 76 nm, and 75.3 nm on the silica coupon, the TiN coupon, and the molybdenum coupon. The measured thickness of molybdenum was 84.4 nm on the molybdenum substrate, which corresponded to 75.3 nm freshly deposited molybdenum.

Figure 73:
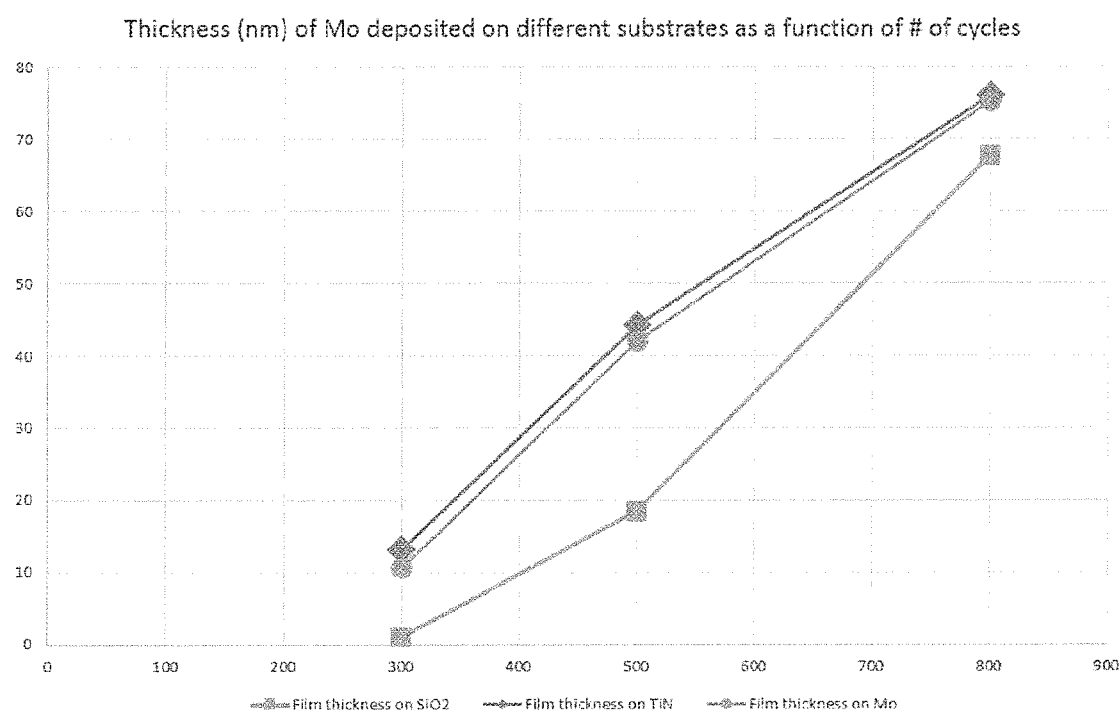
FIG. 73 illustrates thickness (nm) of Mo deposited on $SiO_2$, TiN and Mo substrates as a function of number of cycles.

FIG. 73 illustrates the thickness (nm) of Mo deposited on $SiO_2$, TiN and Mo substrates as a function of number of cycles.

Example 3F: Selective Film Growth as a Function of Number of Cycles for Different Durations of Purge Gas Delivery Two series of experiments were run, one where the purge times were 10 seconds, and one where the purge times were 30 seconds.

The first series of experiments consisted of depositions which had 75, 150, 200, and 300 cycles at 275° C. Each cycle consisted of:
1. a 1-second exposure of $MoCl_5$ (delivered by vapor-draw, while held at 120° C. (corrected temperature)),
2. followed by a 10-second purge by 20 sccm of nitrogen, 3. a 3-second exposure of CHD (delivered by bubbling nitrogen in a CHD cylinder, which was heated to 50° C.),
4. followed by a 10-second purge by 20 sccm of nitrogen.

After the 75-cycle deposition, the median thickness of deposited molybdenum was 3.25 nm. After the 150-cycle deposition, the median thickness of deposited molybdenum was 8.9 nm. After the 200-cycle deposition, the median thickness of deposited molybdenum was 13.5 nm. After the 300-cycle deposition, the median thickness of deposited molybdenum was 25.65 nm.

The second series of experiments consisted of depositions which had 300, 600, and 700 cycles at 275° C. Each cycle consisted of:
1. a 1-second exposure of $MoCl_5$ (delivered by vapor-draw, while held at 120° C. (corrected temperature)),
2. followed by a 30-second purge by 20 sccm of nitrogen,
3. a 3-second exposure of CHD (delivered by bubbling nitrogen in a CHD cylinder, which was heated to 50° C.),
4. followed by a 30-second purge by 20 sccm of nitrogen.

After the 300-cycle deposition, the median thickness of deposited molybdenum was 6.25 nm. After the 600-cycle deposition, the median thickness of deposited molybdenum was 30.5 nm. After the 700-cycle deposition, the median thickness of deposited molybdenum was 41.8 nm.

Figure 74:
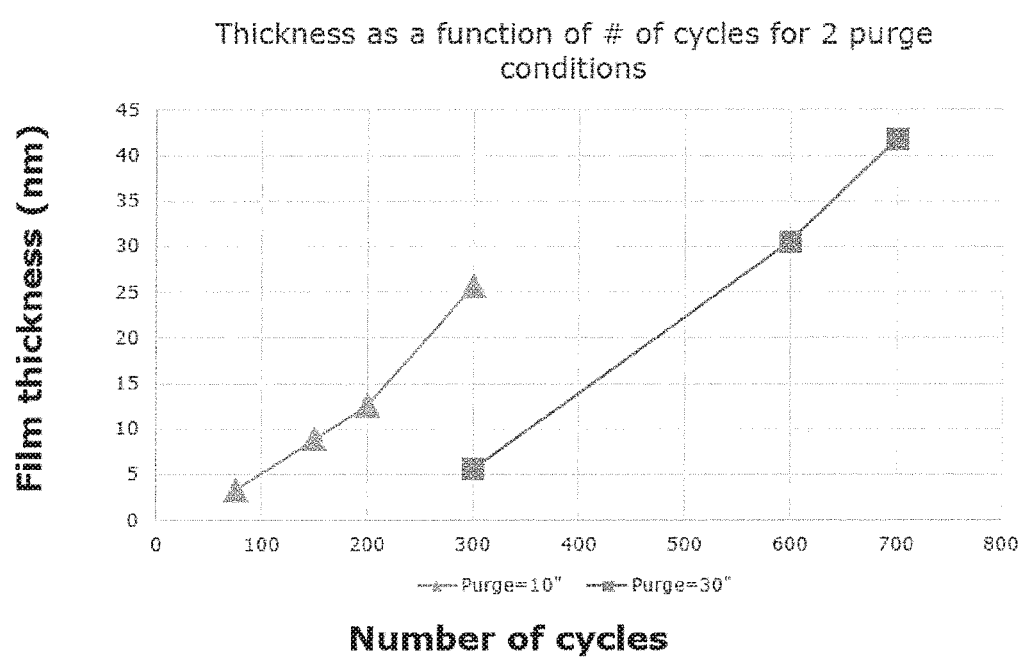
FIG. 74 illustrates thickness (nm) as a function of number of cycles for different durations of purge gas delivery.

FIG. 74 illustrates the thickness (nm) as a function of number of cycles for different durations of purge gas delivery.

Example 4: Tunability of the Roughness of the Molybdenum Film by Varying the Ratio of Conformal and Super-Conformal Growth Cycles The surface roughness of the molybdenum film deposited using only conformal cycles (example 1A, FIG. 9; example 1E, FIG. 42; example 1F, FIG. 50) are very rough when measured by AFM, and had an average roughness of, respectively, 2.818 nm, 1.783 nm, and 5.67 nm. This corresponds to a roughness of, respectively, 11.3%, 6.9%, and 27.6% of the films' thickness.

In contrast, the surface roughness of the molybdenum film deposited using a combination of conformal cycles and super-conformal cycles (example 1G, FIG. 58; example 1H, FIG. 66) are very smooth when measured by AFM; these have an average roughness of, respectively, 0.704 nm, and 0.737 nm. This corresponds to a roughness of, respectively, 2.30%, and 1.89% of the films' thickness.

The results show that surface roughness can be controlled or tuned by varying the number of conformal growth cycles and the number of super-conformal growth cycles.

All publications, patent applications, issued patents and other documents referred to in this specification are herein incorporated by reference as if each individual publication, patent application, issued patent, or other document was specifically and individually indicated to be incorporated by reference in its entirety. Definitions that are contained in text incorporated by reference are excluded to the extent that they contradict definitions in this disclosure.

The words "comprise", "comprises", and "comprising" are to be interpreted inclusively rather than exclusively.

The invention claimed is:
1. A method of forming a metal-containing film by atomic layer deposition, wherein the method comprises delivering a metal-containing complex, a purge gas, and a co-reactant to a first substrate under conditions sufficient for the metal-containing complex to:
   (i) deposit metal and etch the metal-containing film;
   (ii) deposit metal, etch the metal-containing film and allow for desorption from the metal-containing film; or
   (iii) deposit metal and allow for desorption from the metal-containing film;
   such that the metal-containing film selectively grows on at least a portion of the first substrate; and
   wherein the conditions comprise a super-conformal growth cycle sufficient for the metal-containing film to selectively grow on a lower portion of a feature in the first substrate.

2. The method of claim 1, wherein the co-reactant:
   (i) deposits metal and etches the metal-containing film;
   (ii) deposits metal, etches the metal-containing film and allows for desorption from the metal-containing film; or
   (iii) deposits metal and allows for desorption from the metal-containing film.

3. The method of claim 1, wherein (i) a deposition rate of the metal-containing complex is higher in a lower portion of the feature than in an upper portion of the feature and/or (ii) an etching rate and/or a desorption rate of the metal-containing complex is higher in an upper portion of the feature than in a lower portion of the feature.

4. The method of claim 1, wherein the feature has one or more of:
   (i) a depth ≥about 5 nm;
   (ii) a non-uniform width;
   (iii) a width ≤about 1000 nm;
   (iv) about 5.0% to about 100% of the feature is filled; and
   (v) substantially no voids within the feature.

5. The method of claim 1, wherein the feature has one or more of:
   (i) a depth of about 5 nm to about 3000 nm;
   (ii) is wider at a lower portion compared to an upper portion of the feature; and
   (iii) a width of about 1 nm to about 1000 nm.

6. The method of claim 1, wherein the conditions further comprise one or more of:
   a conformal growth cycle comprising delivering the metal-containing complex, the purge gas and the co-reactant to the substrate under conformal conditions, wherein the conformal growth cycle comprises a first series of one or more conformal growth cycles;
   a sub-conformal growth cycle comprising delivering the metal-containing complex, the purge gas and the co-reactant to the substrate under sub-conformal conditions, wherein the sub-conformal growth cycle comprises a third series of one or more sub-conformal growth cycles; and
   an etch cycle comprising delivering the metal-containing complex and the purge gas to the substrate under etching conditions, wherein the etch cycle comprises a fourth series of one or more etch cycles; and
   wherein the super conformal growth cycle comprises a second series of one or more super-conformal growth cycles.

7. The method of claim 6, wherein:
   the first series of conformal growth cycles comprises 1 to 10 cycles;
   the third series of sub-conformal growth cycles comprises 1 to 10 cycles;
   the fourth series of etch cycles comprises 1 to 10 cycles; and
   the second series of super conformal growth cycles comprises 1 to 10 cycles.

8. The method of claim 1, wherein the film selectively grows on at least a portion of the first substrate over a second substrate.

9. The method of claim 8, wherein the first substrate has a different deposition to etch/desorption ratio than the second substrate.

10. The method of claim 8, wherein the duration of delivery of the purge gas is varied between delivering the metal-containing complex and the co-reactant such that growth is promoted on the first substrate while growth is inhibited on the second substrate.

11. The method of claim 8, wherein the first substrate and the second substrate are each independently selected from the group consisting of silica, titanium nitride and molybdenum.

12. The method of claim 1, wherein the metal-containing film has a root mean square roughness of less than 1.5 nm, or less than 5% of the film's thickness; or wherein the metal-containing film has a root mean square roughness of less than 0.8 nm, or less than 2% of the film's thickness.

13. The method of claim 1, wherein the metal-containing complex comprises:
a metal selected from the group consisting of a transition metal, a lanthanide metal, an actinide metal, aluminum, gallium, indium, silicon, germanium, tin, lead, arsenic, antimony, bismuth, selenium, and tellurium; and
one or more ligands selected from the group consisting of a halogen, an alkoxy, an amidinate, a dialkyl-amide, an alkyl-sulfide, a dialkyl phosphide, an N,N'-dialkylamidinate, a cyclopentadienyl optionally substituted with at least one alkyl and/or at least one silyl, a carboxylate, an imide, an acetylacetonate, a hydride, a diketiminate, a mono-iminoketiminate, a trialkylsilyl, trihydrosilyl, a dialkylhydrosilyl, alkyldihydrosilyl, trialkylgermanyl, trihydrogermanyl, dialkylhydrogermanyl, alkyldihydrogermanyl, trialkylstannyl, trihydrostannyl, alkyldihydrostannyl, an amide optionally substituted with at least one silyl, a siloxy, a formamidinate optionally substituted with one or more hydride, alkyl and/or silyl, a acetamidinate optionally substituted with one or more hydride, alkyl and/or silyl, and a combination thereof.

14. The method of claim 13, wherein the transition metal is selected from the group consisting of Mo, W, V, Nb, Fe, Ti, Ta, Co, and Ni; and/or wherein the metal-containing complex comprises one or more halogen ligands.

15. The method of claim 1, wherein the metal-containing complex is $MoCl_5$.

16. The method of claim 1, wherein the purge gas comprises an inert gas and/or hydrogen.

17. The method of claim 1, wherein the co-reactant is selected from the group consisting of:

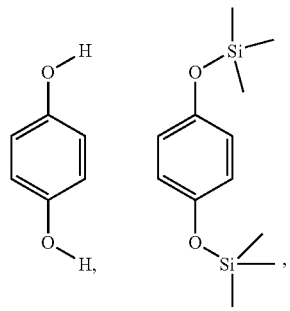

1,4-bis-trimethylsilyl-2-methyl-cyclohexa-2,5-diene, 1-trimethylsilylcyclohexa-2,5-diene, and 1,4-bis-trimethylsilyl-1,4-dihydropyrazine.

18. A method of forming a metal-containing film by atomic layer deposition, wherein the method comprises delivering a metal-containing complex, a purge gas, and a co-reactant to a first substrate under conditions sufficient for the metal-containing complex to:
(i) deposit metal and etch the metal-containing film;
(ii) deposit metal, etch the metal-containing film and allow for desorption from the metal-containing film; or
(iii) deposit metal and allow for desorption from the metal-containing film;
such that the metal-containing film selectively grows on at least a portion of the first substrate;
wherein the conditions comprise one or more of:
(i) a conformal growth cycle comprising delivering the metal-containing complex, the purge gas and the co-reactant to the substrate under conformal conditions;
(ii) a super-conformal growth cycle comprising delivering the metal-containing complex, the purge gas and the co-reactant to the substrate under super-conformal conditions; and
(iii) a sub-conformal growth cycle comprising delivering the metal-containing complex, the purge gas and the co-reactant to the substrate under sub-conformal conditions.

19. The method of claim 18, wherein the metal-containing film has a root mean square roughness of less than 1.5 nm, or less than 5% of the film's thickness; or wherein the metal-containing film has a root mean square roughness of less than 0.8 nm, or less than 2% of the film's thickness.

20. The method of claim 18, wherein the conditions further comprise:
an etch cycle comprising delivering the metal-containing complex and the purge gas to the substrate under etching conditions.

* * * * *

UNITED STATES PATENT AND TRADEMARK OFFICE
CERTIFICATE OF CORRECTION

| | | |
|---|---|---|
| PATENT NO. | : 11,230,764 B2 | Page 1 of 1 |
| APPLICATION NO. | : 16/625488 | |
| DATED | : January 25, 2022 | |
| INVENTOR(S) | : Lehn et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 207 days.

Signed and Sealed this
Eighteenth Day of February, 2025

Coke Morgan Stewart
*Acting Director of the United States Patent and Trademark Office*